United States Patent
Eom et al.

(10) Patent No.: US 11,054,950 B2
(45) Date of Patent: Jul. 6, 2021

(54) DISPLAY DEVICE AND TOUCH SENSOR

(71) Applicant: Samsung Display Co., Ltd., Yongin-si (KR)

(72) Inventors: Tae Yong Eom, Suwon-si (KR); Ki Cheol Kim, Yongin-si (KR); Jae Yoon Chang, Hwaseong-si (KR); Won Kyu Kwak, Seongnam-si (KR); Young Bae Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/732,327

(22) Filed: Jan. 1, 2020

(65) Prior Publication Data

US 2020/0264715 A1    Aug. 20, 2020

(30) Foreign Application Priority Data

Feb. 20, 2019    (KR) .................. 10-2019-0019907

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 27/323* (2013.01);
(Continued)

(58) Field of Classification Search
CPC ..... G06F 3/044; G06F 3/0412; H01L 27/323; H01L 27/3244; H01L 51/0096; H01L 51/5246; H01L 51/5284
(Continued)

(56) References Cited

U.S. PATENT DOCUMENTS

| | | |
|---|---|---|
| 8,350,792 B2 | 1/2013 | Igeta et al. |
| 9,887,256 B2 | 2/2018 | Kim et al. |

(Continued)

FOREIGN PATENT DOCUMENTS

| | | |
|---|---|---|
| CN | 108241456 | 7/2018 |
| EP | 3226101 | 10/2017 |

(Continued)

OTHER PUBLICATIONS

Partial European Search Report dated Jun. 22, 2020 issued in EP Patent Application No. 20158377.0.

(Continued)

*Primary Examiner* — Prabodh M Dharia
(74) *Attorney, Agent, or Firm* — H.C. Park & Associates, PLC

(57) ABSTRACT

A display device and a touch sensor, the display device including a first substrate in which a display area and a peripheral area around the display area are defined; an element layer which is located on the first substrate and comprises a first light emitting element located in the display area and a second light emitting element at least partially located in the peripheral area; and a touch sensor which is located on the element layer. The touch sensor includes: a touch electrode portion which is located in the display area and overlaps the first light emitting element; a touch signal line which is located in the peripheral area and is connected to the touch electrode portion; and a light transmission control pattern portion which is located in the peripheral area, overlaps the second light emitting element, and extends along a boundary between the display area and the peripheral area.

25 Claims, 50 Drawing Sheets

(51) Int. Cl.
*H01L 27/32* (2006.01)
*H01L 51/00* (2006.01)
*H01L 51/52* (2006.01)

(52) U.S. Cl.
CPC ...... *H01L 27/3244* (2013.01); *H01L 51/0096* (2013.01); *H01L 51/5246* (2013.01); *H01L 51/5284* (2013.01)

(58) Field of Classification Search
USPC ...... 345/173, 174, 690; 349/124; 257/40, 72
See application file for complete search history.

(56) References Cited

U.S. PATENT DOCUMENTS

| | | | |
|---|---|---|---|
| 10,121,832 | B1 | 11/2018 | Wu et al. |
| 10,613,694 | B2 | 4/2020 | Tsai et al. |
| 2010/0073319 | A1 | 3/2010 | Lyon et al. |
| 2011/0057892 | A1* | 3/2011 | Kwak ................ G06F 3/0412 345/173 |
| 2015/0041774 | A1* | 2/2015 | Han ................ H01L 51/5284 257/40 |
| 2015/0085179 | A1* | 3/2015 | Van Heugten ........... G02B 7/38 348/349 |
| 2015/0091953 | A1* | 4/2015 | Wu ..................... G09G 3/2007 345/690 |
| 2016/0093596 | A1* | 3/2016 | Hong ................. H01L 27/124 257/72 |
| 2016/0170248 | A1* | 6/2016 | Kim ..................... G02F 1/1339 349/124 |
| 2016/0239131 | A1* | 8/2016 | Kang ................... G06F 3/044 |
| 2017/0212615 | A1 | 7/2017 | Watanabe |
| 2017/0250228 | A1* | 8/2017 | Liao ................... H01L 27/3276 |
| 2017/0287992 | A1 | 10/2017 | Kwak et al. |
| 2017/0293380 | A1 | 10/2017 | Chauveau et al. |
| 2018/0097039 | A1 | 4/2018 | Jeong et al. |
| 2019/0103583 | A1* | 4/2019 | Kim ................... H01L 27/3246 |
| 2019/0140026 | A1 | 5/2019 | Nakanishi |
| 2019/0227395 | A1 | 7/2019 | Nakanishi |
| 2019/0235658 | A1 | 8/2019 | Tsai et al. |
| 2019/0305057 | A1* | 10/2019 | Cheng ................ H01L 51/0011 |
| 2019/0325827 | A1* | 10/2019 | Lee ..................... G09G 3/3225 |
| 2020/0167028 | A1 | 5/2020 | Morrison et al. |
| 2020/0236259 | A1 | 7/2020 | Nakamura et al. |

FOREIGN PATENT DOCUMENTS

| | | |
|---|---|---|
| JP | 2010-032760 | 2/2010 |
| JP | 2018-120397 | 8/2018 |
| KR | 10-1461925 | 11/2014 |
| KR | 10-2017-0111827 | 10/2017 |
| KR | 10-2017-0114028 | 10/2017 |
| KR | 10-2017-0137230 | 12/2017 |
| KR | 10-2018-0036431 | 4/2018 |
| WO | 2018008570 | 1/2018 |
| WO | 2018206947 A2 | 11/2018 |
| WO | 2018216545 | 11/2018 |
| WO | 2018206947 A3 | 1/2019 |

OTHER PUBLICATIONS

Extended European Search Report dated on Oct. 6, 2020, issued in EP Patent Application No. 20158377.0.

* cited by examiner

DISPLAY DEVICE AND TOUCH SENSOR

CROSS REFERENCE TO RELATED APPLICATION

This application claims priority from and the benefit of Korean Patent Application No. 10-2019-0019907, filed on Feb. 20, 2019, which is hereby incorporated by reference for all purposes as if fully set forth herein.

BACKGROUND

Field

Exemplary embodiments of the invention relate generally to a display device and a touch sensor.

Discussion of the Background

Recently, display devices have been diversifying in use. In addition, as display devices become thinner and lighter, their scope of use is becoming wider.

Touch sensors for recognizing a touch input have recently been widely applied to display devices. Due to the convenience of touch input methods, touch sensors are replacing conventional physical input devices such as keypads.

With the utilization of display devices in various electronic devices, there is a growing demand for a technology that increases the proportion of a display area where an image is provided and reduces the proportion of a peripheral area where relatively no image is provided in designing the shape of a display device. In addition, the design of display devices is diversifying to meet the demands of consumers.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device having an increased proportion of a display area and improved display quality.

Devices constructed according to exemplary embodiments of the invention are also capable of providing a touch sensor capable of increasing the proportion of a display area and improving the display quality of a display device.

Additional features of the inventive concepts will be set forth in the description which follows, and in part will be apparent from the description, or may be learned by practice of the inventive concepts.

An exemplary embodiment of a display device includes a first substrate in which a display area and a peripheral area around the display area are defined; an element layer which is located on the first substrate and comprises a first light emitting element located in the display area and a second light emitting element at least partially located in the peripheral area; and a touch sensor which is located on the element layer, wherein the touch sensor comprises: a touch electrode portion which is located in the display area and overlaps the first light emitting element; a touch signal line which is located in the peripheral area and is connected to the touch electrode portion; and a light transmission control pattern portion which is located in the peripheral area, overlaps the second light emitting element, and extends along a boundary between the display area and the peripheral area.

The boundary between the display area and the peripheral area may include a rounded portion, and the second light emitting element may overlap the rounded portion of the boundary between the display area and the peripheral area.

The light transmission control pattern portion and the touch signal line may be located on the same layer and made of the same material.

The light transmission control pattern portion may include a portion located between the touch signal line and the touch electrode portion.

The light transmission control pattern portion may include an opaque conductive material, and at least one opening may be formed in the light transmission control pattern portion, wherein the opening overlaps the second light emitting element.

The opening may be formed in a stripe shape extending in a direction.

The opening may be formed in plural numbers in an island shape, and the openings may be spaced apart from each other.

The touch electrode portion may include first touch electrodes which are arranged along a first direction and electrically connected to each other along the first direction and second touch electrodes which are arranged along a second direction intersecting the first direction and electrically connected to each other along the second direction, wherein the first touch electrodes and the second touch electrodes are located on the same layer, and the light transmission control pattern portion is located on a different layer from the first touch electrodes and the second touch electrodes.

The display device may further include an insulating layer which is located on the light transmission control pattern portion, wherein the first touch electrodes and the second touch electrodes are located on the insulating layer.

The display device may also include a first connection portion which connects two first touch electrodes neighboring each other along the first direction and a second connection portion which connects two second touch electrodes neighboring each other along the second direction, wherein any one of the first connection portion and the second connection portion is located on the same layer as the first touch electrodes and the second touch electrodes, and the other one of the first connection portion and the second connection portion is located on the same layer as the light transmission control pattern portion.

A second substrate may be located on the element layer, and a sealant may be located between the first substrate and the second substrate, disposed in the peripheral area, and bond the first substrate and the second substrate together, wherein the touch sensor is located on the second substrate.

A thin-film encapsulation layer may be located on the element layer, wherein the touch sensor is located on the thin-film encapsulation layer.

The first substrate may include a notched edge which defines a notch portion, and the element layer may also include a third light emitting element which is located in the peripheral area and between the notch portion and the display area, wherein the third light emitting element overlaps the light transmission control pattern portion.

The notched edge of the first substrate may include a rounded portion.

The notched edge of the first substrate comprises a portion having at least any one of an omega (Ω) shape, a U shape, a V shape, a semicircular shape, and a semielliptical shape.

An exemplary embodiment of a display device includes a first substrate which comprises a through hole and in which a hole peripheral area around the through hole, a display area surrounding the hole peripheral area and a peripheral area around the display area are defined; an element layer which is located on the first substrate and comprises a light emitting element located in the hole peripheral area; and a touch sensor which is located on the element layer, wherein the touch sensor comprises a touch electrode portion and a hole light transmission control pattern portion which is spaced apart from the touch electrode portion, is located in the hole peripheral area and overlaps the light emitting element.

The touch electrode portion may include two first touch electrodes which are spaced apart from each other along a first direction with the through hole interposed between the two first touch electrodes, two second touch electrodes which are spaced apart from each other along a second direction intersecting the first direction with the through hole interposed between the two second touch electrodes, a first connection portion which connects the two first touch electrodes, and a second connection portion which connects the two second touch electrodes, wherein the first touch electrodes and the second touch electrodes are located on the same layer, and the hole light transmission control pattern portion is located on a different layer from the first touch electrodes and the second touch electrodes.

The first connection portion and the second connection portion may be located in the hole peripheral area.

The first connection portion and the hole light transmission control pattern portion may be located on the same layer, and the second connection portion may be located on the same layer as the first touch electrodes and the second touch electrodes.

The hole light transmission control pattern portion includes an opaque conductive material, and at least one opening is formed in the hole light transmission control pattern portion, wherein the opening overlaps the light emitting element.

The display device may further include a second substrate which is located on the element layer; a sealant which is located between the first substrate and the second substrate, is located in the peripheral area, and bonds the first substrate and the second substrate together; and a hole sealant which is located between the first substrate and the second substrate, is located in the hole peripheral area, and bonds the first substrate and the second substrate together, wherein the touch sensor is located on the second substrate.

An exemplary embodiment of a touch sensor in which a sensing area and a non-sensing area are defined, includes a touch electrode portion which is located in the sensing area; a touch signal line which is located in the non-sensing area and connected to the touch electrode portion; and a light transmission control pattern portion which is located in the non-sensing area, extends along a rounded boundary between the sensing area and the non-sensing area, and is spaced apart from the touch signal line, wherein an opening is formed in the light transmission control pattern portion.

The touch electrode portion may include a plurality of touch electrodes, the light transmission control pattern portion may be located on the same layer as the touch signal line, and the light transmission control pattern portion may be located on a different layer from the touch electrodes.

A hole non-sensing area surrounding a through hole passing through the touch sensor may be further defined in the touch sensor, the sensing area completely surrounding the hole non-sensing area, and further include a hole light transmission control pattern portion which is located in the hole non-sensing area and extends along a rounded boundary between the sensing area and the hole non-sensing area.

The touch electrode portion may include two first touch electrodes which are spaced apart from each other along a first direction with the through hole interposed between the two first touch electrodes, two second touch electrodes which are spaced apart from each other along a second direction intersecting the first direction with the through hole interposed between the two second touch electrodes, a first connection portion which connects the two first touch electrodes, and a second connection portion which connects the two second touch electrodes, wherein the first connection portion and the second connection portion are located in the hole non-sensing area and located relatively closer to the through hole than the hole light transmission control pattern portion.

The light transmission control pattern portion and the hole light transmission control pattern portion may be located on a different layer from the first touch electrodes and the second touch electrodes, any one of the first connection portion and the second connection portion may be located on the same layer as the first touch electrodes and the second touch electrodes, and the other one of the first connection portion and the second connection portion may be located on the same layer as the light transmission control pattern portion and the hole light transmission control pattern portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
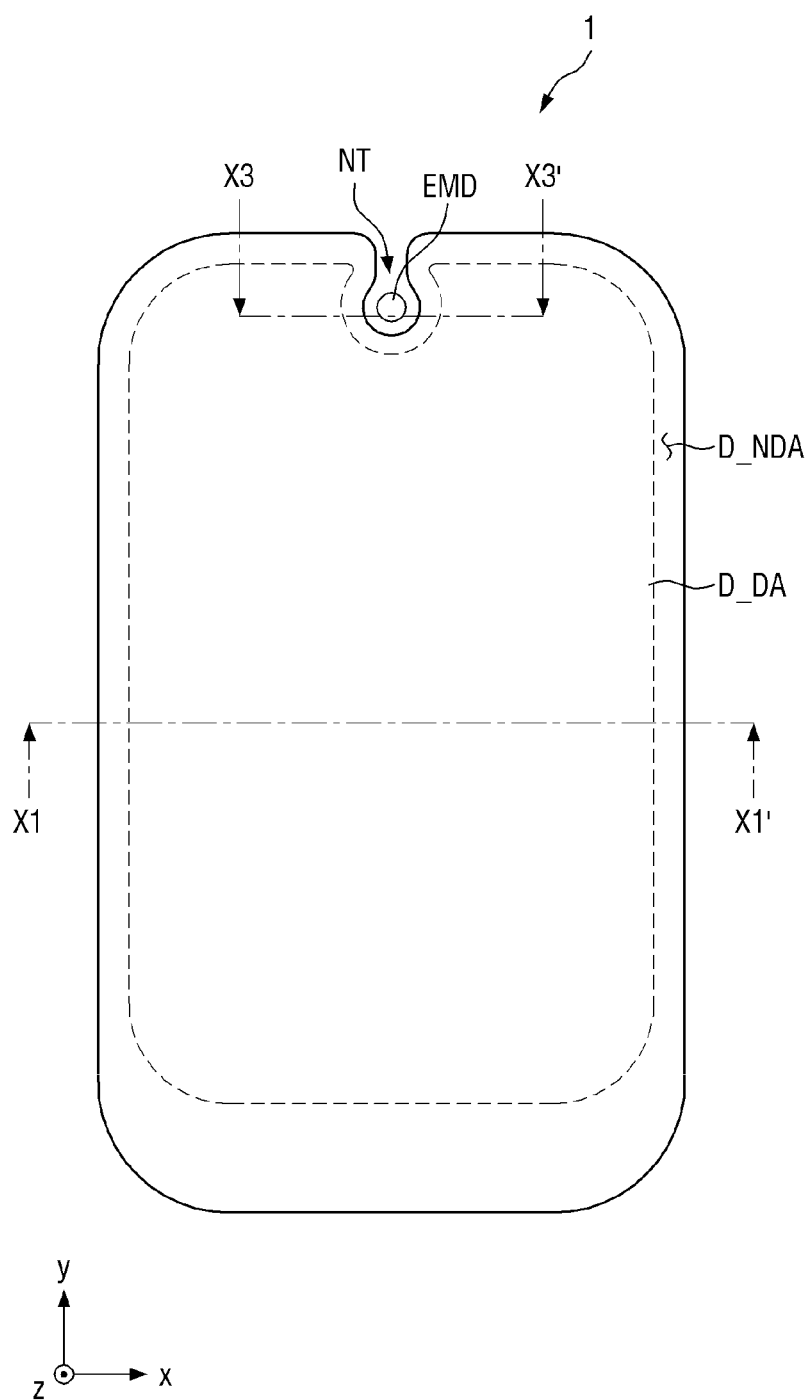
FIG. 1 is a schematic plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present disclosure will be described with reference to the drawings.

Figure 2:
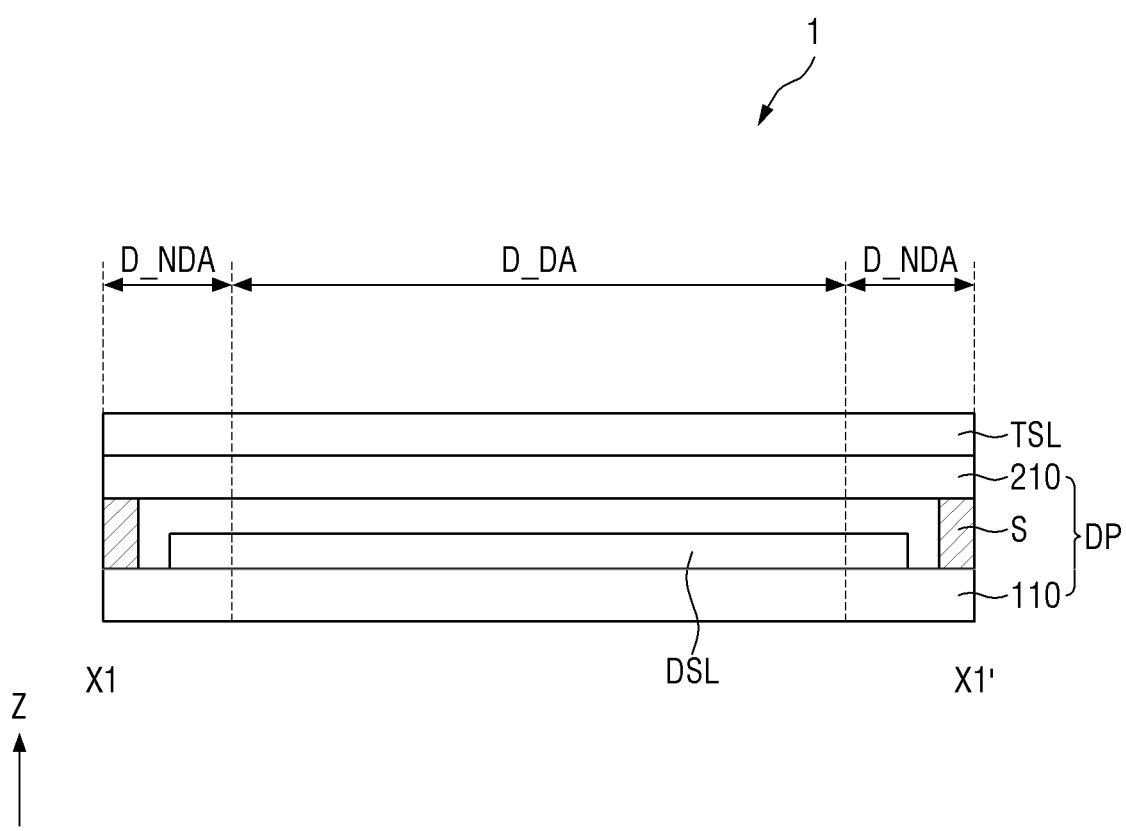
FIG. 2 is a schematic cross-sectional view of the display device according to the exemplary embodiment, taken along line X1-X1' of FIG. 1.
Figure 3:
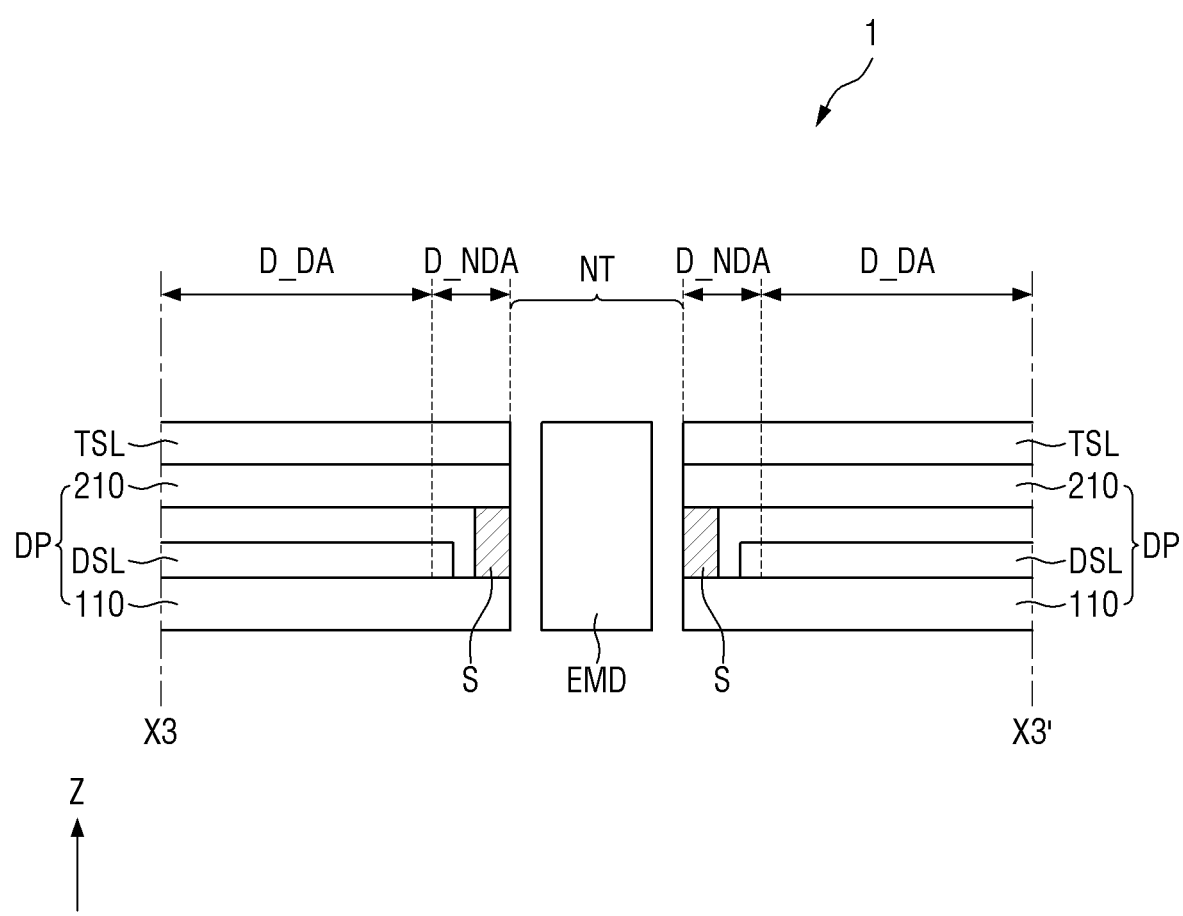
FIG. 3 is a schematic cross-sectional view of the display device according to the exemplary embodiment, taken along line X3-X3' of FIG. 1.
Figure 4:
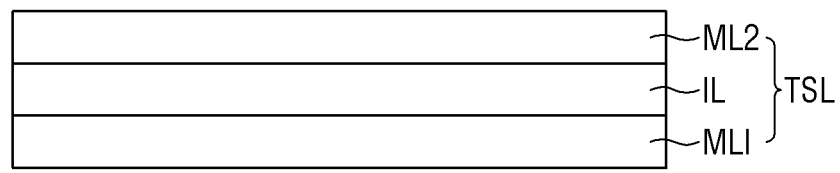
FIG. 4 is an enlarged cross-sectional view of a touch sensor shown in FIGS. 2 and 3.

FIG. 1 is a schematic plan view of a display device 1 according to an exemplary embodiment. FIG. 2 is a schematic cross-sectional view of the display device 1 according to the exemplary embodiment, taken along line X1-X1' of FIG. 1. FIG. 3 is a schematic cross-sectional view of the display device 1 according to the exemplary embodiment, taken along line X3-X3' of FIG. 1. FIG. 4 is an enlarged cross-sectional view of a touch sensor TSL shown in FIGS. 2 and 3.

Referring to FIGS. 1 through 4, the display device 1 according to the current exemplary embodiment may include two short sides extending in a first direction x and two long sides extending in a second direction y intersecting the first direction x. Each corner, where a long side and a short side of the display device 1 meet, may be curved. The planar shape of the display device 1 is not limited to this shape and may also be a circular shape or other shapes.

In FIG. 1, a portable terminal is shown as an example to which the display device 1 according to the exemplary embodiment may be applied. Examples of the portable terminal may include a tablet PC, a smartphone, a personal digital assistant (PDA), a portable multimedia player (PMP), a game machine, and a wristwatch-type electronic device. However, the inventive concepts are not limited to the specific type of the display device 1. In other exemplary embodiments, the display device 1 may be used in large-sized electronic devices such as televisions or external billboards and small and medium-sized electronic devices such as PCs, notebook computers, car navigation devices, smart watches and cameras.

As for the planar structure of the display device 1, the display device 1 includes a display area D-DA in which an image is displayed and a peripheral area D-NDA adjacent to the display area D-DA. The display area D-DA may be an area in which an image is displayed, and the peripheral area D-NDA may be an area in most of which no image is displayed. In some embodiments, an image may be displayed in a part of the peripheral area D-NDA which is adjacent to the display area D-DA.

In some exemplary embodiments, the display area D-DA may be substantially quadrilateral. In some exemplary embodiments, each corner of the display area D-DA may be curved or rounded in plan view as shown in FIG. 1.

The peripheral area D-NDA may surround the display area D-DA. However, the inventive concepts are not limited to this case, and the shape of the display area D-DA and the shape of the peripheral area D-NDA can be designed relatively.

The display device 1 may include a notch portion NT having one open side. In some exemplary embodiments, the notch portion NT may be located on a short side of the display device 1. The notch portion NT may be formed by recessing one short side of the display device 1 in a direction toward a center of the display area D-DA.

In some exemplary embodiments, an electronic element EMD may be disposed in the notch portion NT of the display device 1. In some exemplary embodiments, the electronic element EMD may be a camera element, a speaker element, a photo-sensing element, a heat sensing element, a microphone element, or the like.

In some exemplary embodiments, the notch portion NT may be surrounded by the peripheral area D-NDA, and the display area D-DA may be surrounded by the peripheral area D-NDA. That is, the peripheral area D-NDA may be located between the notch portion NT and the display area D-DA.

An edge of the display device 1 which defines the notch portion NT may include rounded portions in plan view. In some exemplary embodiments, the notch portion NT may have an omega ($\Omega$) shape as shown in FIG. 1. The shape of the notch portion NT can be changed to various shapes such as a substantially U shape, a substantially V shape, a substantially semicircular shape and a substantially semielliptical shape as long as the edge includes the rounded portions.

As for the stacked structure of the display device 1, the display device 1 may include a display panel DP and the touch sensor TSL located on the display panel DP.

In some exemplary embodiments, the display panel DP may be a display panel including a self-light emitting element. In an exemplary embodiment, the self-light emitting element may include at least one of an organic light emitting diode, a quantum dot light emitting diode, an inorganic-based micro light emitting diode (e.g., a micro light emitting diode), and an inorganic-based nano light emitting diode (e.g., a nano light emitting diode). For ease of description, the self-light emitting element will be described below as an organic light emitting diode.

In its stacked structure, the display panel DP includes a first substrate 110, a second substrate 210 located on the first substrate 110, and an element layer DSL located between the first substrate 110 and the second substrate 210. In addition, the display panel DP may further include a sealant S which is located between the first substrate 110 and the second substrate 210, is located on edges of the first substrate 110 and the second substrate 210, and bonds the first substrate 110 and the second substrate 210 together.

The first substrate 110 is a substrate which supports the element layer DSL. In some exemplary embodiments, the first substrate 110 may be an insulating substrate made of glass, quartz, ceramic, or plastic.

The element layer DSL is located on the first substrate 110. In some exemplary embodiments, the element layer DSL may include a plurality of pixels and a plurality of display signal lines located on the first substrate 110. Each of the pixels may include a thin-film transistor (TFT), a capacitor, and a light emitting element which will be described later. The signal lines may include scan lines which transmit scan signals to the pixels and data lines which transmit data signals to the pixels, respectively.

In some exemplary embodiments, the pixels included in the element layer DSL may be located in the display area D-DA, and some of the pixels may be further located in the peripheral area D-NDA.

The element layer DSL may further include elements and wirings located on the first substrate 110 and in the peripheral area D-NDA. The elements and the wirings may generate various signals transmitted to the pixels or may transmit the signals to the pixels.

The second substrate 210 may be an encapsulation substrate which prevents or reduces moisture and oxygen from penetrating into the element layer DSL from the outside. The second substrate 210 may be made of a polymer film such as glass or plastic.

The sealant S may be located between the first substrate 110 and the second substrate 210. The sealant may be located in the peripheral area D-NDA and completely surround the display area D-DA in plan view. The sealant S may bond the first substrate 110 and the second substrate 210 together and prevent or reduce impurities such as moisture and oxygen from penetrating between the first substrate 110 and the second substrate 210 from the outside. In some exemplary embodiments, the sealant S may be formed by placing a sealing material such as glass frit between the first substrate 110 and the second substrate 210 and melting the sealing material by irradiating a laser beam.

Since the sealant S is located between the first substrate 110 and the second substrate 210, even if the notch portion NT is formed in the display device 1, impurities such as moisture and oxygen can be prevented from penetrating between the first substrate 110 and the second substrate 210 around the notch portion NT.

The touch sensor TSL may be located on the display panel DP. In some exemplary embodiments, the touch sensor TSL may obtain coordinates of a touch input point using a capacitance method. In the capacitance method, coordinate information of a touched point may be obtained using a self-capacitance method or a mutual capacitance method. For ease of description, a case where the touch sensor TSL is formed in a mutual capacitance structure will be described below, but the inventive concepts are not limited to this case.

In some exemplary embodiments, the touch sensor TSL may be located on the second substrate 210 of the display panel DP.

In some exemplary embodiments, a portion of the touch sensor TSL which is located in the display area D-DA may include a touch electrode (not shown), and a portion of the touch sensor TSL which is located in the peripheral area D-NDA may include a touch signal line (not shown) which transmits and/or receives a signal to/from the touch electrode, a touch pad unit (not shown) which is connected to the touch signal line, and a light transmission control pattern portion (not shown).

In some exemplary embodiments, a bonding layer (e.g., an adhesive layer) may not be located between the touch sensor TSL and the second substrate 210. For example, at least any one of the touch electrode, the touch signal line, the touch pad unit and the light transmission control pattern portion of the touch sensor TSL may be located directly on the second substrate 210. Alternatively, when an insulating film is located between the touch sensor TSL and the second substrate 210, at least any one of the touch electrode, the touch signal line, the touch pad unit and the light transmission control pattern portion of the touch sensor TSL may be located directly on the insulating film.

As for the stacked structure of the touch sensor TSL, in some exemplary embodiments, the touch sensor TSL may include a first conductive layer ML1, an insulating layer IL, and a second conductive layer ML2 as shown in FIG. 4.

The first conductive layer ML1 may include an opaque conductive material. In some exemplary embodiments, the first conductive layer ML1 may include a metal such as gold (Au), silver, (Ag), aluminum (Al), molybdenum (Mo), chromium (Cr), titanium (Ti), nickel (Ni), neodymium (Nd), copper (Cu), platinum (Pt), or an alloy of the same. In some exemplary embodiments, the first conductive layer ML1 may have a single-layer structure or a multilayer structure. For example, the first conductive layer ML1 may have a three-layer structure of titanium/aluminum/titanium.

Since the first conductive layer ML1 includes an opaque conductive material, it may function as a light shielding layer which blocks transmission of light.

The insulating layer IL may be located on the first conductive layer ML1. The insulating layer IL may be disposed between the first conductive layer ML1 and the second conductive layer ML2. In some exemplary embodiments, the insulating layer IL may include an insulating material. In some exemplary embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least any one of acrylic resin, methacrylic resin, polyisoprene, vinyl resin, epoxy resin, urethane resin, cellulose resin, siloxane resin, polyimide resin, polyamide resin, and perylene resin.

The second conductive layer ML2 may be located on the insulting layer IL. In some exemplary embodiments, the second conductive layer ML2 may include a conductive material having light transmitting properties. Examples of the conductive material having light transmitting properties may include silver nanowires (AgNWs), indium tin oxide (ITO), indium zinc oxide (IZO), antimony zinc oxide (AZO), indium tin zinc oxide (ITZO), zinc oxide (ZnO), tin oxide ($SnO_2$), carbon nanotubes, graphene, and conductive polymers PEDOT). Alternatively, the second conductive layer ML2 may include a conductive material such as a metal or an alloy of metals as long as light can be transmitted through the second conductive layer ML2. Examples of the metal may include gold (Au), silver, (Ag), aluminum (Al), molybdenum (Mo), chromium (Cr), titanium (Ti), nickel (Ni), neodymium (Nd), copper (Cu), and platinum (Pt). In some exemplary embodiments, when the second conductive layer ML2 is made of a metal or an alloy of metals, the second conductive layer ML2 may have a mesh structure in order not to be visible to a user.

Figure 5:
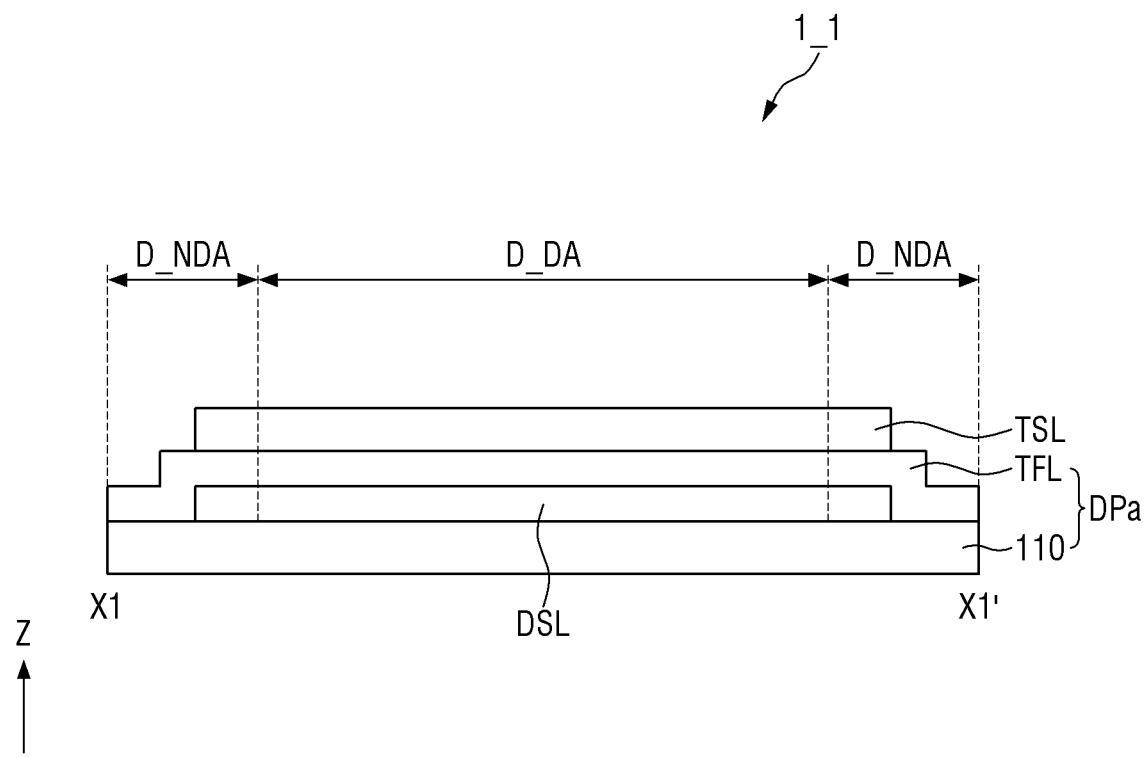
FIG. 5 is a cross-sectional view of a display device according to a modification of the exemplary embodiment, taken along line X1-X1' of FIG. 1.
Figure 6:
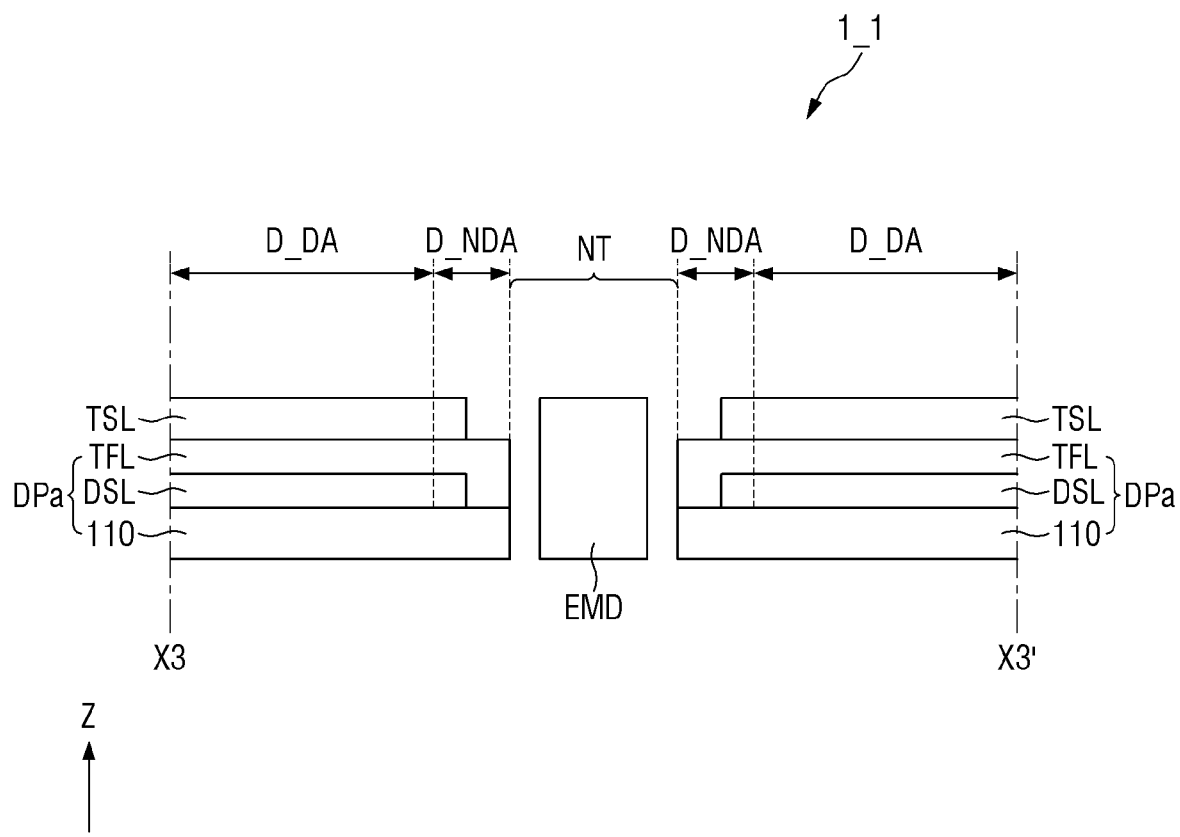
FIG. 6 is a schematic cross-sectional view of the display device according to the modification of the exemplary embodiment, taken along line X3-X3' of FIG. 1.
Figure 7:
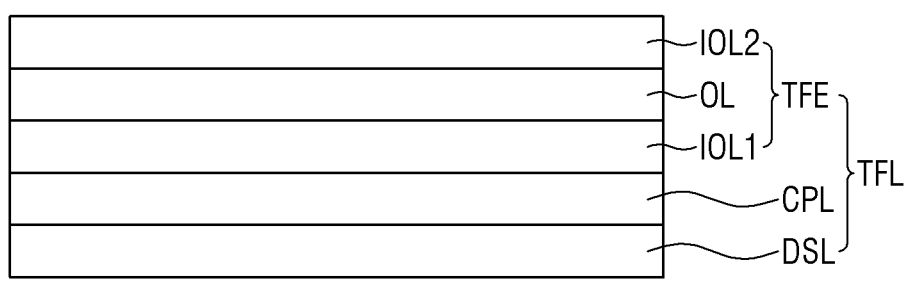
FIG. 7 is an enlarged cross-sectional view of an upper insulating layer shown in FIGS. 5 and 6.

FIG. 5 is a cross-sectional view of a display device 1-1 according to a modified example of the embodiment, taken along line X1-X1' of FIG. 1. FIG. 6 is a schematic cross-sectional view of the display device 1-1 according to the modified example of the embodiment, taken along line X3-X3' of FIG. 1. FIG. 7 is an enlarged cross-sectional view of an upper insulating layer TFL shown in FIGS. 5 and 6.

Referring to FIGS. 5 through 7, the display device 1-1 according to the modified example may include a display panel DPa and a touch sensor TSL. The display panel DPa may include a first substrate 110, an element layer DSL located on the first substrate 110, and the upper insulating layer TFL located on the element layer DSL.

The first substrate 110, the element layer DSL and the touch sensor TSL are substantially the same as or similar to those described above with reference to FIGS. 1 through 4, and thus a description thereof is omitted.

The upper insulating layer TFL may be located on the element layer DSL. The upper insulating layer TFL may protect the element layer DSL.

The upper insulating layer TFL may include a thin-film encapsulation layer TFE and may further include a capping layer CPL.

The upper insulating layer TFL may include a plurality of thin films. As in the current exemplary embodiment, the upper insulating layer TFL may include the capping layer CPL and the thin-film encapsulation layer TFE. The thin-film encapsulation layer TFE may include a first inorganic layer IOL1, an organic layer OL, and a second inorganic layer IOL2.

The capping layer CPL may be located on the element layer DSL and, in some exemplary embodiments, may be disposed on a cathode of the element layer DSL. In some exemplary embodiments, the capping layer CPL may contact the cathode. The capping layer CPL may include an organic material.

The thin-film encapsulation layer TFE may include the first inorganic layer IOL1, the organic layer OL, and the second inorganic layer IOL2.

The first inorganic layer IOL1 is disposed on the capping layer CPL and contacts the capping layer CPL. The organic layer OL is disposed on the first inorganic layer IOL1 and contacts the first inorganic layer IOL1. The second inorganic layer IOL2 is disposed on the organic layer OL and contacts the organic layer OL.

The capping layer CPL protects the cathode from a subsequent process such as a sputtering process and improves light output efficiency of light emitting elements. The capping layer CPL may have a refractive index greater than that of the first inorganic layer IOL1.

The first inorganic layer IOL1 and the second inorganic layer IOL2 protect the element layer DSL from moisture/oxygen, and the organic layer OL protects the element layer DSL from foreign matter such as dust particles. Each of the first inorganic layer IOL1 and the second inorganic layer IOL2 may be any one of a silicon nitride layer, a silicon oxynitride layer, and a silicon oxide layer. In an exemplary embodiment, each of the first inorganic layer IOL1 and the second inorganic layer IOL2 may include a titanium oxide layer or an aluminum oxide layer. The organic layer OL may include, but is not limited to, an acrylic-based organic layer.

In an exemplary embodiment, an inorganic layer such as a lithium fluoride (LiF) layer may be further disposed between the capping layer CPL and the first inorganic layer IOL1. The LiF layer may improve the light output efficiency of the light emitting elements.

The touch sensor TSL may be located on the upper insulating layer TFL. In some exemplary embodiments, the touch sensor TSL may be located on the thin-film encapsulation layer TFE, and a bonding layer (e.g., an adhesive layer) may not be located between the thin-film encapsulation layer TFE and the touch sensor TSL. For example, at least any one of a touch electrode, a touch signal line, a touch pad unit and a light transmission control pattern portion of the touch sensor TSL may be located directly on the thin-film encapsulation layer TFE. Alternatively, when an insulating film is located between the touch sensor TSL and the thin-film encapsulation layer TFE, at least any one of the touch electrode, the touch signal line, the touch pad unit and the light transmission control pattern portion of the touch sensor TSL may be located directly on the insulating film.

In some exemplary embodiments, side surfaces of the element layer DSL around a notch portion NT may be covered by the upper insulating layer TFL. Accordingly, impurities such as moisture and oxygen can be prevented from penetrating into the element layer DSL around the notch portion NT.

A case where a display device has the structure of FIGS. 1 through 4, for example, a case where the display device 1 includes the second substrate 210 will now be described as an example.

Figure 8:
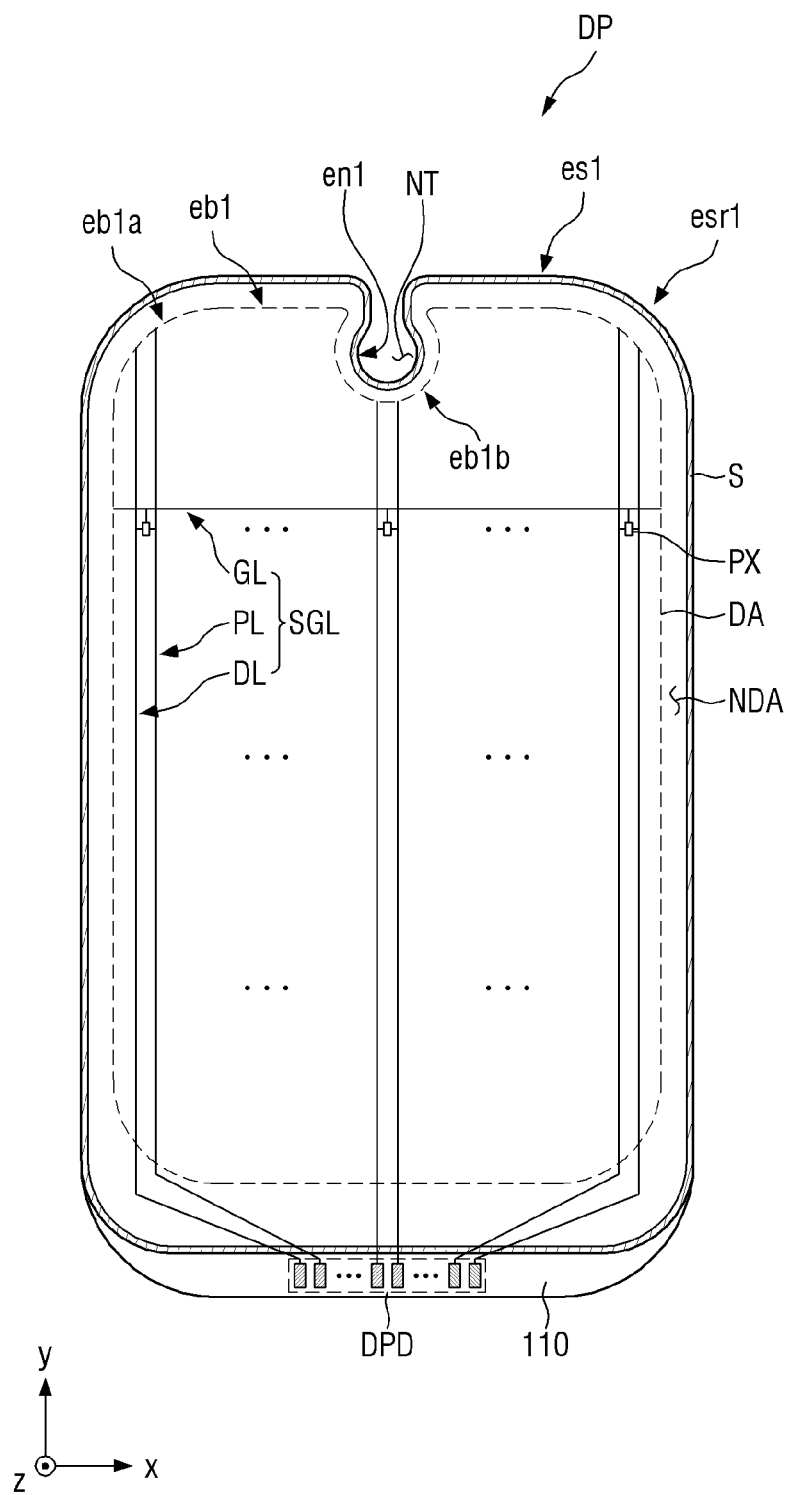
FIG. 8 is a schematic plan view of a display panel included in the display device according to the exemplary embodiment.
Figure 9:
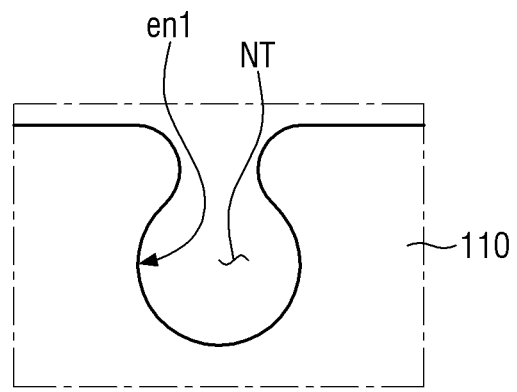
FIG. 9 is a plan view showing the shape of an edge of a first substrate around a notch portion shown in FIG. 8.
Figure 12:
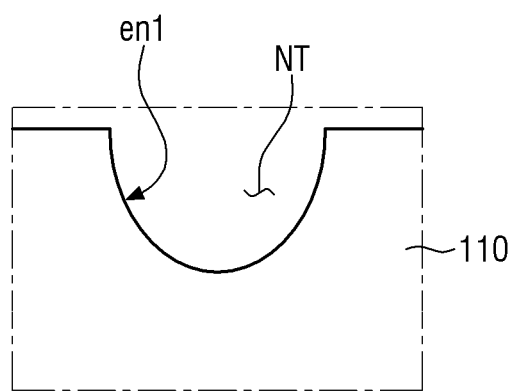
Figure 12:
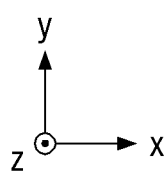
Figure 13:
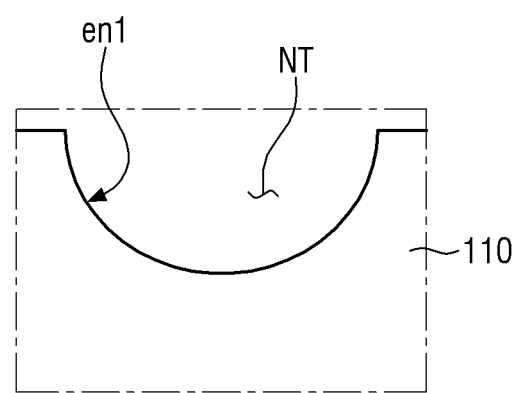
Figure 14:
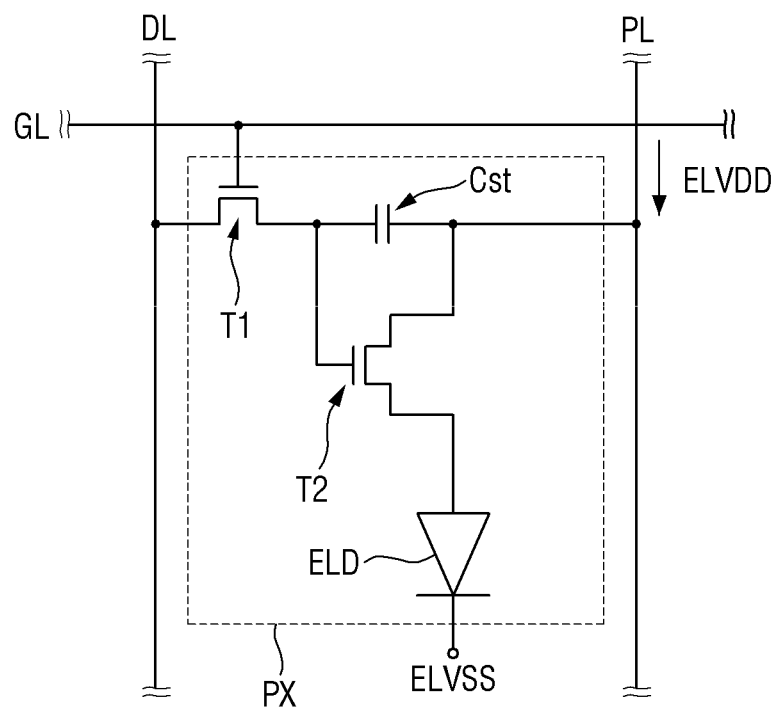
FIG. 14 is an equivalent circuit diagram of a pixel shown in FIG. 8.
Figure 15:
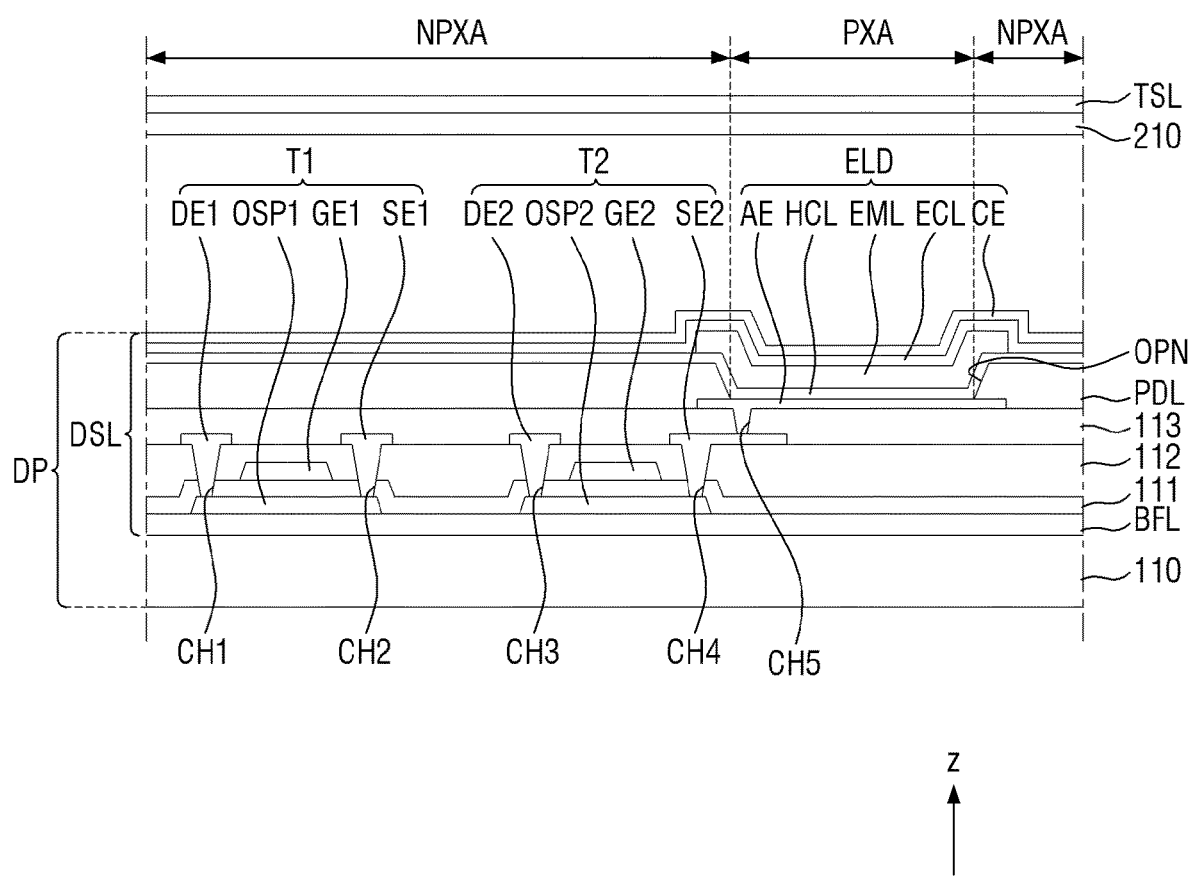
FIG. 15 is a schematic cross-sectional view of the pixel shown in FIG. 14.

FIG. 8 is a schematic plan view of the display panel DP included in the display device 1 according to the exemplary embodiment. FIG. 9 is a plan view showing the shape of an edge es1 of the first substrate 110 around the notch portion NT shown in FIG. 8. FIGS. 10 through 13 are plan views of modified examples of FIG. 9. FIG. 14 is an equivalent circuit diagram of a pixel PX shown in FIG. 8. FIG. 15 is a schematic cross-sectional view of the pixel PX shown in FIG. 14.

Referring to FIGS. 8 through 15, a display area DA and a peripheral area NDA corresponding to the display area D-DA and the peripheral area D-NDA of the display device 1 shown in FIG. 1 may be defined in the display panel DP or the first substrate 110. In the current exemplary embodiment, when two regions correspond to each other, it means that the two regions overlap each other and have the same area.

The edge es1 of the first substrate 110 may include rounded portions esr1 at corners. In addition, the edge es1 of the first substrate 110 may include a notched edge en1 located around the notch portion NT and defining the notch portion NT. In the edge es1 of the first substrate 110, the notched edge en1 defining the notch portion NT may include a rounded portion or a curved portion in plan view.

Figure 10:
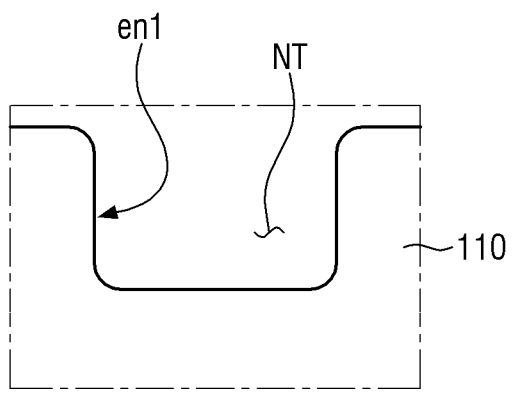
FIGS. 10, 11, 12, and 13 are plan views of modified examples of FIG. 9.
Figure 11:
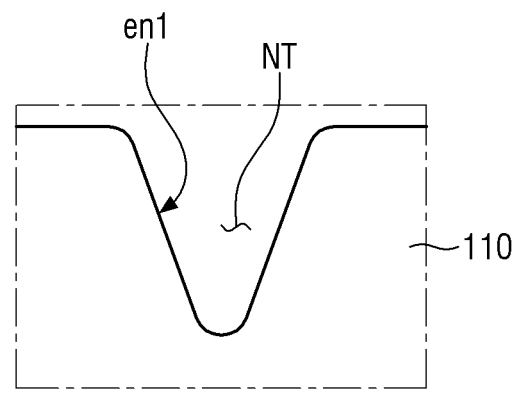
Figure 11:
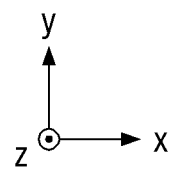

In some exemplary embodiments, the notched edge en1 defining the notch portion NT in the edge es1 of the first substrate 110 may have an omega (S2) shape as shown in FIG. 9. Alternatively, the notched edge en1 defining the notch portion NT in the edge es1 of the first substrate 110 may have a substantially U shape as shown in FIG. 10 or a substantially V shape as shown in FIG. 11. Alternatively, the notched edge en1 defining the notch portion NT in the edge es1 of the first substrate 110 may have a substantially semielliptical shape as shown in FIG. 12 or a substantially semicircular shape as shown in FIG. 13.

A boundary eb1 between the display area DA and the peripheral area NDA of the display panel DP may include rounded portions eb1a. In addition, the boundary eb1 between the display area DA and the peripheral area NDA of the display panel DP may further include a portion eb1b located around the notch portion NT. Of the boundary eb1 between the display area DA and the peripheral area NDA, the portion eb1b located around the notch portion NT may extend along the notched edge en1 defining the notch portion NT in the edge es1 of the first substrate 110.

Referring again to FIG. 8, a plurality of signal lines SGL and a plurality of pixels PX may be located on the first substrate 110 in the display area DA. Signal pads DPD may be located on the first substrate 110 in the peripheral area NDA, and some of the pixels PX may be located in the peripheral area NDA. In addition, the sealant S may be located on the first substrate 110 in the peripheral area NDA to completely surround the display area DA.

The signal lines SGL, the pixels PX and the signal pads DPD may be included in the element layer DSL.

The signal lines SGL may include scan lines GL, data lines DL and a power supply line PL.

The scan lines GL are connected to corresponding ones of the pixels PX and transmit scan signals to the pixels PX, respectively.

The data lines DL are connected to corresponding ones of the pixels PX and transmit data signals to the pixels PX, respectively.

The power supply line PL is connected to the pixels PX and transmits a driving voltage to the pixels PX.

The signal pads DPD are disposed in the peripheral area NDA and may be connected to the signal lines SGL, for example, the data lines DL, respectively. The signal pads DPD may receive data signals from an external source.

In some exemplary embodiments, the scan lines GL may extend along the first direction x, and the data lines DL may extend along the second direction y. In some exemplary embodiments, the power supply line PL may extend along the second direction y in which the data lines DL extend.

In FIG. 14, any one scan line GL, any one data line DL, the power supply line PL, and a pixel PX connected to these lines are shown. The configuration of the pixel PX is not limited to that of FIG. 14 and can be modified.

A light emitting element ELD may be a top emission diode or a bottom emission diode. The pixel PX includes a first transistor T1 (or a switching transistor), a second transistor T2 (or a driving transistor), and a capacitor Cst as a pixel driving circuit for driving the light emitting element ELD. A first power supply voltage ELVDD is provided to the second transistor T2, and a second power supply voltage ELVSS is provided to the light emitting element ELD. The second power supply voltage ELVSS may be lower than the first power supply voltage ELVDD.

The first transistor T1 outputs a data signal transmitted to the data line DL in response to a scan signal transmitted to the scan line GL. The capacitor Cst is charged with a voltage corresponding to the data signal received from the first transistor T1. The second transistor T2 is connected to an organic light emitting diode OLED. The second transistor T2 controls a driving current flowing through the light emitting element ELD according to the amount of charge stored in the capacitor Cst.

The equivalent circuit is merely one exemplary embodiment and is not limited to this embodiment. Alternatively, the pixel PX may further include a plurality of transistors and may include more capacitors. The light emitting element ELD may also be connected between the power supply line PL and the second transistor T2.

In some exemplary embodiments, the light emitting element ELD may be an organic light emitting diode as described above. Alternatively, the light emitting element may be any one of a quantum dot light emitting diode, an inorganic-based micro light emitting diode, and an inorganic-based nano light emitting diode.

FIG. 15 shows a cross section of a portion of the display panel DP which corresponds to the equivalent circuit of FIG. 14, together with the second substrate 210 and the touch sensor TSL.

A buffer layer BFL may be disposed on the first substrate 110.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 may be disposed on the buffer layer BFL. Each of the first semiconductor pattern OSP1 and the second semiconductor pattern OSP2 may be selected from amorphous silicon, polysilicon, and a metal oxide semiconductor. In some exemplary embodiments, any one of the first semiconductor pattern OSP1 and the second semiconductor pattern OSP2 may be made of polysilicon, and the other one of the first semiconductor pattern OSP1 and the second semiconductor pattern OSP2 may be made of a metal oxide semiconductor.

A first intermediate inorganic layer 111 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, a second control electrode) of the second transistor T2 are disposed on the first intermediate inorganic layer 111. When the first control electrode GE1 and the second control electrode GE2 are located on the same layer, they may be manufactured by the same photolithography process as the scan lines GL (see FIG. 4). However, the inventive concepts are not limited to this case, and the first control electrode GE1 and the second control electrode GE2 may also be located on different layers. In this case, any one of the first control electrode GE1 and the second control electrode GE2 may be manufactured by the same photolithography process as the scan lines GL (see FIG. 4).

A second intermediate inorganic layer 112 covering the first control electrode GE1 and the second control electrode GE2 is disposed on the first intermediate inorganic layer 111. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode) and an output electrode SE2 (hereinafter, referred to as a second output electrode) of the second transistor T2 are disposed on the second intermediate inorganic layer 112.

The first input electrode DE1 and the first output electrode SE1 are connected to the first semiconductor pattern OSP1 respectively through a first through hole CH1 and a second through hole CH2 passing through the first intermediate inorganic layer 111 and the second intermediate inorganic layer 112. The second input electrode DE2 and the second output electrode SE2 are connected to the second semiconductor pattern OSP2 respectively through a third through hole CH3 and a fourth through hole CH4 passing through the first intermediate inorganic layer 111 and the second intermediate inorganic layer 112. In an exemplary embodiment, one of the first transistor T1 and the second transistor T2 may be modified to a bottom gate structure.

An intermediate organic layer 113 covering the first input electrode DE1, the second input electrode DE2, the first output electrode SE1 and the second output electrode SE2 is disposed on the second intermediate inorganic layer 112. The intermediate organic layer 113 may provide a flat surface.

A pixel defining layer PDL and the light emitting element ELD may be located on the intermediate organic layer 113. The pixel defining layer PDL may include an organic material. An anode AE is disposed on the intermediate organic layer 113. The anode AE is connected to the second output electrode SE2 through a fifth through hole CH5 passing through the intermediate organic layer 113. An opening OPN is defined in the pixel defining layer PDL. The opening OPN of the pixel defining layer PDL exposes at least a portion of the anode AE. In an exemplary embodiment, the pixel defining layer PDL may be omitted.

The pixel PX may be disposed in the display area DA. The display area DA may include a light emitting area PXA and a non-light emitting area NPXA adjacent to the light emitting area PXA. The non-light emitting area NPXA may surround the light emitting area PXA. In the current exemplary embodiment, the light emitting area PXA is defined to correspond to a portion of the anode AE exposed by the opening OPN.

In an exemplary embodiment, the light emitting area PXA may overlap at least one of the first and second transistors T1 and T2. The opening OPN may become wider, and the anode AE and a light emitting layer EML to be described later may also become wider.

A hole control layer HCL may be disposed commonly to the light emitting area PXA and the non-light emitting area NPXA. Although not specifically shown, a common layer such as the hole control layer HCL may be formed commonly to the pixels PX (see FIG. 8).

The light emitting layer EML is disposed on the hole control layer HCL. The light emitting layer EML may generate light of a predetermined color. The light emitting layer EML may be disposed in an area corresponding to the opening OPN. That is, the light emitting layer EML may be formed separately in each pixel PX.

When the light emitting element ELD is an organic light emitting diode, the light emitting layer EML may include an organic material. That is, in some exemplary embodiments, the light emitting layer EML may be an organic light emitting layer.

When the light emitting element ELD is a quantum dot light emitting diode, the light emitting layer EML may include a quantum dot material. That is, the light emitting layer EML may be a quantum dot light emitting layer.

A core of a quantum dot may be selected from a group II-VI compound, a group III-V compound, a group IV-VI compound, a group IV element, a group IV compound, and combinations of the same. The quantum dot may have a full width of half maximum (FWHM) of an emission wavelength spectrum of about 45 run or less, preferably about 40 nm or less, or more preferably about 30 nm or less. In this range, color purity or color reproducibility can be improved. In addition, since light emitted through the quantum dot is radiated in various directions, a wide viewing angle can be improved.

In addition, the quantum dot may be in a form generally used in the art to which the present disclosure pertains and is not limited to a particular form. More specifically, the quantum dot may be in the form of a spherical, pyramidal, multi-arm or cubic nanoparticle, nanotube, nanowire, nanofiber or plate-like nanoparticle.

The quantum dot may control the color of emitted light according to the particle size. Therefore, the quantum dot can have various emission colors such as blue, red, and green.

In the current exemplary embodiment, the patterned light emitting layer EMI, is shown as an example. However, the light emitting layer EML may also be disposed commonly to the pixels PX, Here, the light emitting layer EMI: may generate white light. In addition, the light emitting layer EMI, may have a multilayer structure called a tandem.

An electron control layer ECL is disposed on the light emitting layer EML. Although not specifically shown, the electron control layer ECL may be formed commonly to the pixels PX.

A cathode CE is disposed on the electron control layer ECL. The cathode CE is disposed commonly to the pixels PX.

The second substrate 210 may be located on the cathode CE, and the cathode CE and the second substrate 210 may be spaced apart from each other. The touch sensor TSL described above may be located on the second substrate 210.

The anode AE, the hole control layer HCL, the light emitting layer EML, the electron control layer ECL and the cathode CE located in the light emitting area PXA may constitute the light emitting element ELD.

That is, the light emitting element ELD may be defined as a portion where the anode AE, the hole control layer HCL, the light emitting layer EML, the electron control layer ECL and the cathode CE are all located in the light emitting area PXA.

Figure 16:
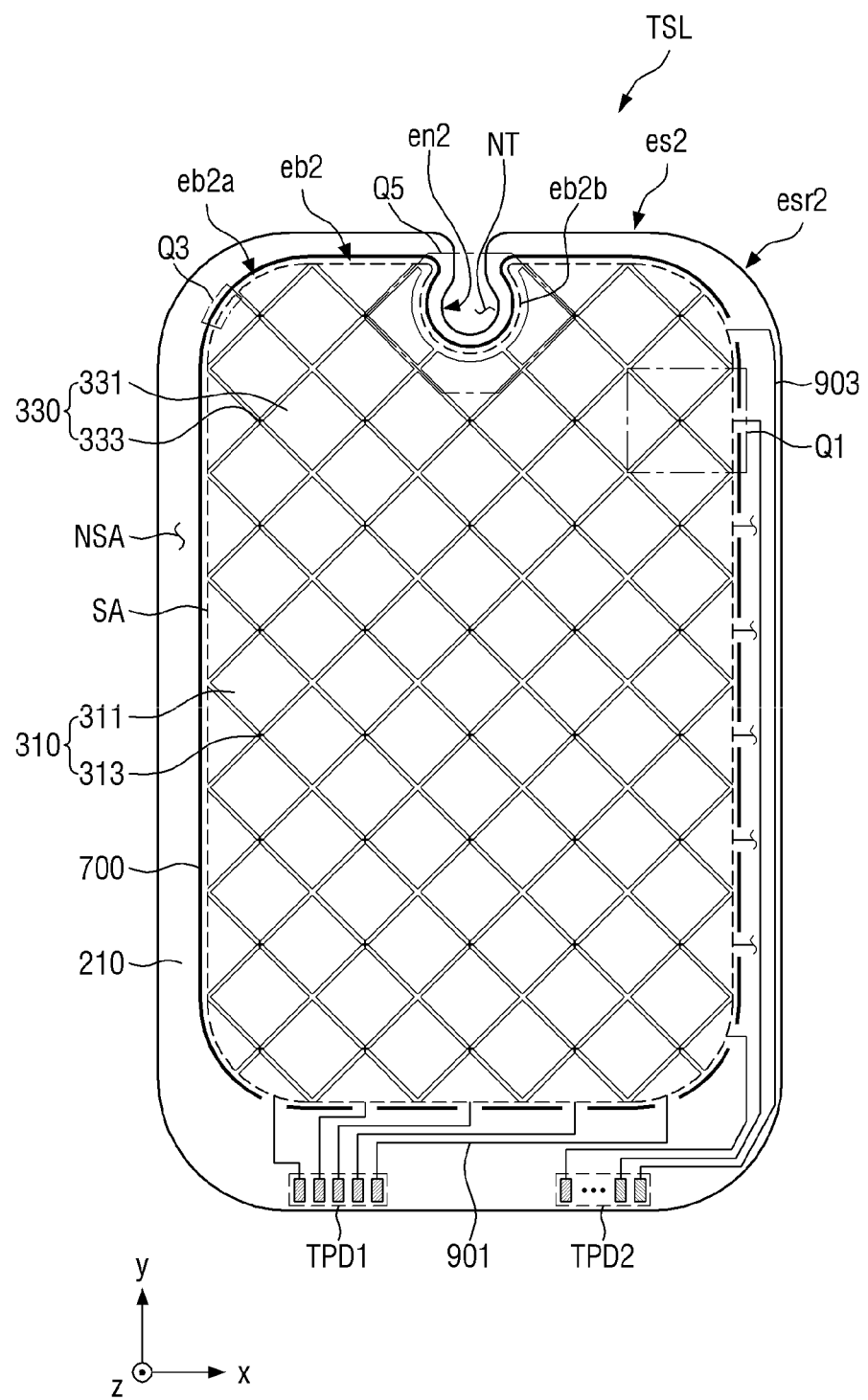
FIG. 16 is a schematic plan view of the touch sensor included in the display device according to the exemplary embodiment.
Figure 17:
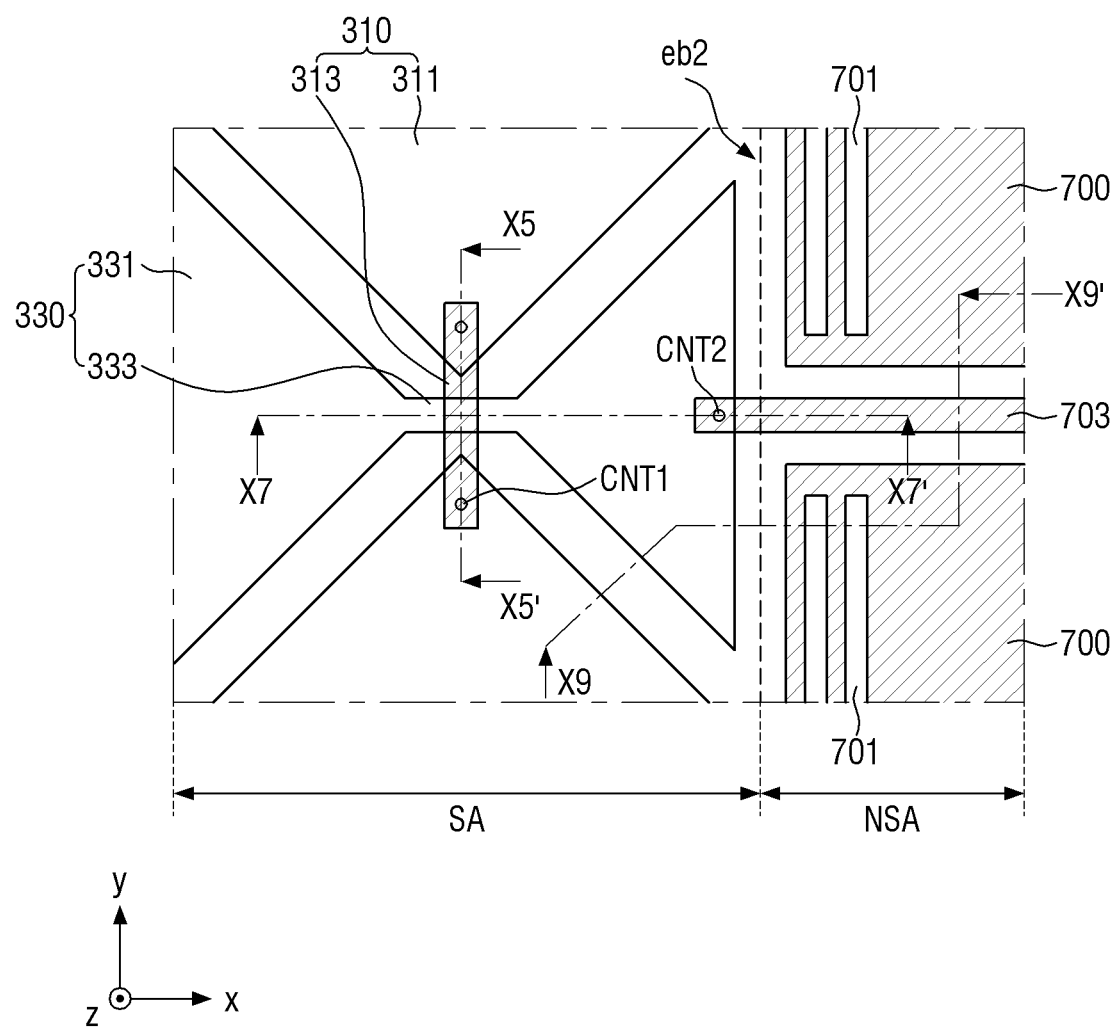
FIG. 17 is an enlarged plan view of a portion Q1 of FIG. 16.
Figure 18:
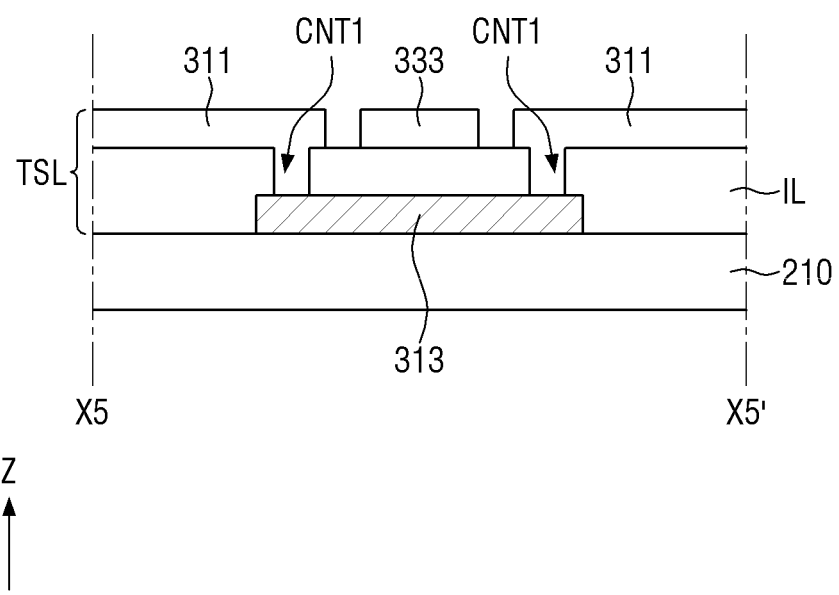
FIG. 18 is a schematic cross-sectional view of the touch sensor taken along line X5-X5' of FIG. 17.
Figure 19:
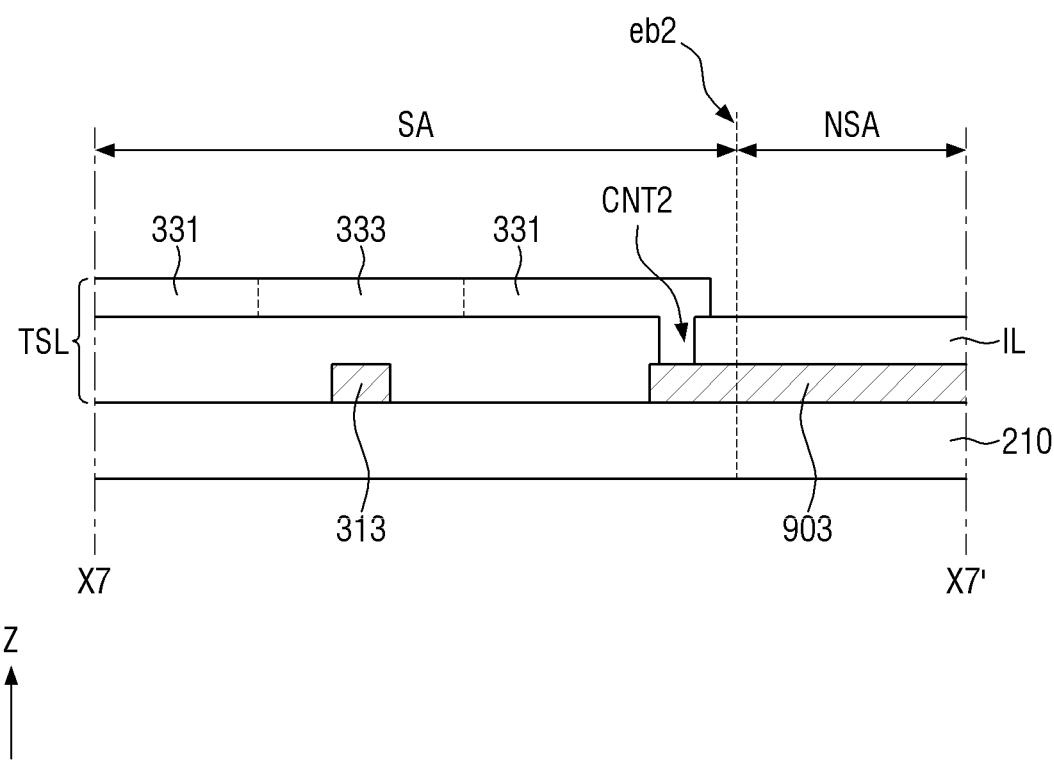
FIG. 19 is a schematic cross-sectional view of the touch sensor taken along line X7-X7' of FIG. 17.
Figure 20:
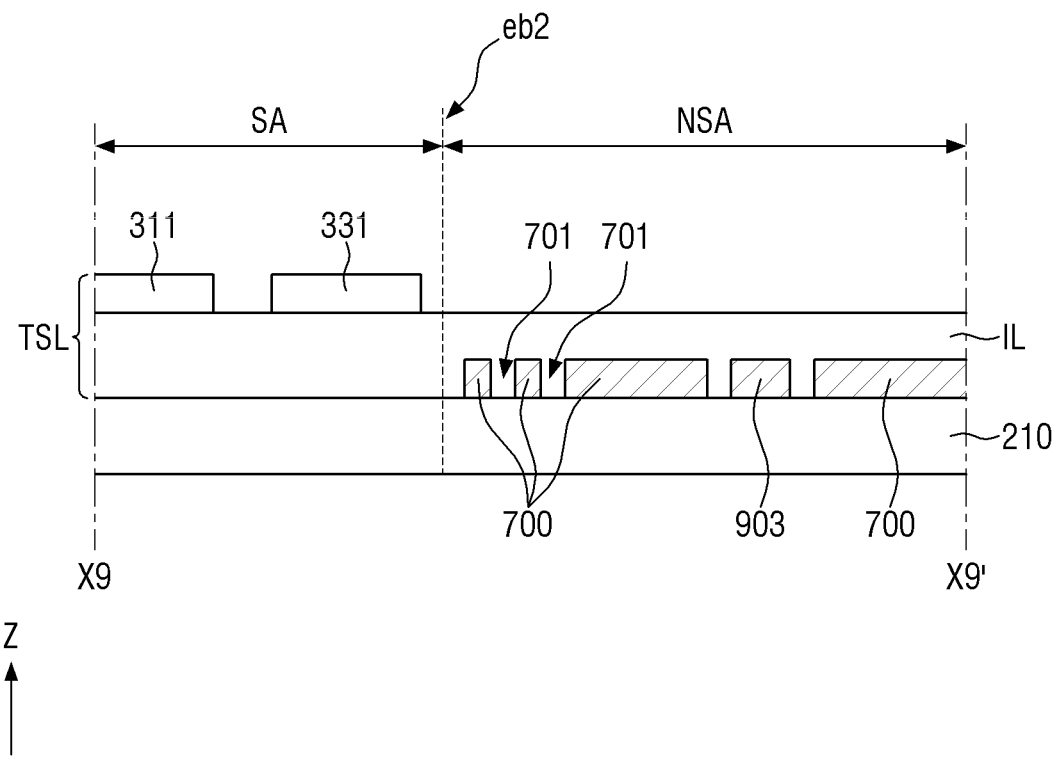
FIG. 20 is a schematic cross-sectional view of the touch sensor taken along line X9-X9' of FIG. 17.

FIG. 16 is a schematic plan view of the touch sensor TSL included in the display device 1 according to the exemplary embodiment. FIG. 17 is an enlarged plan view of a portion Q1 of FIG. 16. FIG. 18 is a schematic cross-sectional view of the touch sensor TSL taken along line X5-X5' of FIG. 17. FIG. 19 is a schematic cross-sectional view of the touch sensor TSL taken along line X7-X7' of FIG. 17. FIG. 20 is a schematic cross-sectional view of the touch sensor TSL taken along line X9-X9' of FIG. 17.

Referring to FIGS. 16 through 20, the touch sensor TSL is located on the second substrate 210 as described above. That is, the second substrate 210 may function as a base layer of the touch sensor TSL.

Like the first substrate 110, an edge es2 of the second substrate 210 may include rounded portions esr2 at corners. In addition, the edge es2 of the second substrate 210 may include a notched edge en2 located around the notch portion NT and defining the notch portion NT. In the edge es2 of the second substrate 210, the notched edge en2 may include a rounded portion or a curved portion in plan view.

In some exemplary embodiments, like the edge es1 of the first substrate 110, the notched edge en2 defining the notch portion NT in the edge es2 of the second substrate 210 may have an omega (Ω) shape as shown in FIG. 16. However, the shape of the notched edge en2 of the edge es2 of the second substrate 210 may be changed according to the shape of the notched edge en1 (defining the notch portion NT) of the edge es1 of the first substrate 110.

In some exemplary embodiments, the notched edge en1 defining the notch portion NT in the edge es1 of the first substrate 110 and the notched edge en2 defining the notch NT in the edge es2 of the second substrate 210 may be substantially aligned along the third direction z.

A sensing area SA and a non-sensing area NSA are defined in the touch sensor TSL. The sensing area SA may be an area that senses a touch input in the touch sensor TSL, and the non-sensing area NSA may be an area that cannot sense a touch input.

The sensing area SA may correspond to the display area D-DA of the display device 1 shown in FIG. 1 or the display area DA of the display panel DP shown in FIG. 8. In addition, the non-sensing area NSA may correspond to the peripheral area D-NDA of the display device 1 shown in FIG. 1 or the peripheral area NDA of the display panel DP shown in FIG. 8. In some exemplary embodiments, the sensing area SA may be substantially the same as the display area DA of the display panel DP, and the non-sensing area NSA may be substantially the same as the peripheral area NDA of the display panel DP.

A boundary eb2 between the sensing area SA and the non-sensing area NSA may include rounded portions eb2a at corners. In addition, the boundary eb2 between the sensing area SA and the non-sensing area NSA may further include a portion eb2b located around the notch portion NT. Of the boundary eb2 between the sensing area SA and the non-sensing area NSA, the portion eb2b located around the notch portion NT may extend along the notched edge en2 defining the notch portion NT in the edge es2 of the second substrate 210.

In some exemplary embodiments, the boundary eb2 between the sensing area SA and the non-sensing area NSA and the boundary eb1 between the display area DA and the peripheral area NDA of the display panel DP may be substantially aligned in the third direction z.

The touch sensor TSL includes a first electrode portion 310, a second electrode portion 330 and a light transmission control pattern portion 700 and may further include touch signal lines 901 and 903 and a touch pad unit TPD1 and TPD2.

The first electrode portion 310 and the second electrode portion 330 may be located in the sensing area SA, and the touch pad unit TPD1 and TPD2, the touch signal lines 901 and 903 and the light transmission control pattern portion 700 may be located in the non-sensing area NSA.

The sensing area SA will now be described in more detail.

The first electrode portion 310 and the second electrode portion 330 insulated from the first electrode portion 310 may be located on the second substrate 210.

The first electrode portion 310 may extend along the second direction y. The first electrode portion 310 may be disposed in plural numbers, and the first electrode portions 310 may be spaced apart from each other along the first direction x.

Each of the first electrode portions 310 may include a plurality of first touch electrodes 311 arranged along the second direction y and a plurality of first connection portions 313, each connecting the first touch electrodes 311 neighboring each other along the second direction y. In the following description of embodiments, the term "connection" may encompass "connection" in physical and/or electrical aspects.

In some exemplary embodiments, the first touch electrodes 311 may have a rhombic planar shape as shown in FIG. 16. However, the planar shape of each of the first touch electrodes 121 can be changed to various shapes such as a triangle, a quadrilateral, a pentagon, a circle, and a bar.

The first touch electrodes 311 may include a transparent conductive material. The first touch electrodes 311 may be made of the second conductive layer ML2 described above with reference to FIG. 4. Specific examples of the transparent conductive material are the same as those described in relation to the second conductive layer ML2, and thus a description thereof is omitted.

Each of the first connection portions 313 may electrically connect the first touch electrodes 311 neighboring each other along the second direction y and may contact the first touch electrodes 311. In some exemplary embodiments, the first connection portions 313 may be configured as bridge-shaped connection patterns.

In some exemplary embodiments, the first connection portions 313 may be located on a layer different from a layer on which the first touch electrodes 311 are located. The first connection portions 313 may be made of the first conductive layer ML1 described above with reference to FIG. 4. The first connection portions 313 may include an opaque conductive material, and specific examples of the opaque conductive material are the same as those described in relation to the first conductive layer ML1.

Although one first connection portion 313 is disposed between the first touch electrodes 311 neighboring each other along the second direction y in the drawings, the number of the first connection portions 313 can be changed variously. For example, two or more first connection portions 313 may be disposed between the first touch electrodes 311 neighboring each other along the second direction y, unlike in the drawings.

The insulating layer IL may be located between the first touch electrodes 311 and the first connection portions 313. The first touch electrodes 311 may be connected to each of the first connection portions 313 through first contact holes CNT1 formed in the insulating layer IL.

The second electrode portion 330 may extend along the first direction x as described above. The second electrode portion 330 may be disposed in plural numbers, and the second electrode portions 330 may be spaced apart from each other along the second direction y.

Each of the second electrode portions 330 may include a plurality of second touch electrodes 331 arranged along the first direction x and a plurality of second connection portions 333, each electrically connecting the second touch electrodes 311 neighboring each other along the first direction x.

In some exemplary embodiments, the second touch electrodes 331 may be located on the same layer as the first touch electrodes 311 and may be made of the second conductive layer ML2 described above with reference to FIG. 4. For example, the second touch electrodes 331 may be located on the insulating layer IL. The second touch electrodes 331 may have a rhombic shape. However, the shape of each of the second touch electrodes 331 is not limited to the rhombic shape and can be changed to various shapes such as a triangle, a quadrilateral, a pentagon, a circle, and a bar.

The second touch electrodes 331 may include a transparent conductive material and, in some exemplary embodiments, may include the same material as the first touch electrodes 311.

Each of the second connection portions 333 may electrically connect the second touch electrodes 331 neighboring each other along the first direction x and may contact the second touch electrodes 331. In some exemplary embodiments, the second connection portions 333 may be located on the same layer as the first touch electrodes 311 and the second touch electrodes 331 and may be made of the second conductive layer ML2 described above with reference to FIG. 4. For example, the second connection portions 333 may be located on the insulating layer IL, like the first touch electrodes 311 and the second touch electrodes 331.

In some exemplary embodiments, the second connection portions 333 may be insulated from the first connection portions 313 or the first touch electrodes 311 by the insulating layer IL. Although the second connection portions 333 overlap the first connection portions 313 in the drawings, this is merely an example. In an exemplary embodiment, the second connection portions 333 may overlap the first touch electrodes 311, not the first connection portions 313.

Since the second connection portions 333 are made of the second conductive layer ML2, they may be made of the same material as the first touch electrodes 311 and the second touch electrodes 331.

In some exemplary embodiments, each of the first electrode portions 310 may be a driving electrode portion which receives a driving signal for detecting a touch position, and each of the second electrode portions 330 may be a sensing electrode portion which outputs a sensing signal in response to the driving signal.

The non-sensing area NSA will now be described.

The touch signal lines 901 and 903, the touch pad unit TPD1 and TP2 and the light transmission control pattern portion 700 may be located on the non-sensing area NSA of the second substrate 210.

In some exemplary embodiments, the touch pad unit TPD1 and TPD2 may include a first pad unit TPD1 and a second pad unit TPD2 spaced apart from each other along the first direction x.

The touch signal lines 901 and 903 may include first touch signal lines 901 electrically connected to the first electrode portions 310, respectively, and second touch signal lines 903 electrically connected to the second electrode portions 330, respectively.

In some exemplary embodiments, as shown in FIG. 16, an end of each of the first touch signal lines 901 may be connected to an end of one of the first electrode portions 310, and the other end of each of the first touch signal lines 901 may be connected to the first pad unit TPD1.

In some exemplary embodiments, an end of each of the first electrode portions 310 may pass through the insulating layer IL and be connected to one of the first touch signal lines 901.

An end of each of the second touch signal lines 903 may be electrically connected to one of the second electrode portions 330, and the other end of each of the second touch signal lines 903 may be electrically connected to the second pad unit TPD2. In some exemplary embodiments, an end of each of the second electrode portions 330 may be connected to one of the second touch signal lines 903 through a second contact hole CNT2 formed in the insulating layer IL.

In some exemplary embodiments, the first touch signal lines 901 and the second touch signal lines 903 may be made of the first conductive layer ML1 described above with reference to FIG. 4.

The light transmission control pattern portion 700 may be located on the second substrate 210 and in the non-sensing area NSA.

In some exemplary embodiments, the light transmission control pattern portion 700 may extend along the boundary eb2 between the sensing area SA and the non-sensing area NSA and may surround at least a part of the sensing area SA.

The light transmission control pattern portion 700 may include an opaque conductive material. In some exemplary embodiments, the light transmission control pattern portion 700 may be made of the first conductive layer ML1 described above with reference to FIG. 4. For example, the light transmission control pattern portion 700 may be located on the same layer as the first touch signal lines 901 and the second touch signal lines 903 and may be made of the same material as the first touch signal lines 901 and the second touch signal lines 903.

Since the light transmission control pattern portion 700, the first touch signal lines 901 and the second touch signal lines 903 are located on the same layer, the light transmission control pattern portion 700 may be spaced apart from the first touch signal lines 901 and the second touch signal lines 903.

In some exemplary embodiments, the light transmission control pattern portion 700 may include a portion located between the first touch signal lines 901 and the sensing area SA and a portion located between the second touch signal lines 903 and the sensing area SA. That is, at least a portion of the light transmission control pattern portion 700 may be located relatively closer to the sensing area SA than the first touch signal lines 901 and the second touch signal lines 903.

In some exemplary embodiments, one or more openings 701 may be formed in the light transmission control pattern portion 700. In the current exemplary embodiment, two or more openings 701 may be formed as slits extending along the boundary eb2 between the sensing area SA and the non-sensing area NSA and may be spaced apart from each other along a direction intersecting the boundary eb2.

The light transmission control pattern portion 700 may cover light emitting elements located in the peripheral area NDA among light emitting elements of the display panel DP or may cover light emitting areas located in the peripheral area NDA among light emitting areas of the display panel DP. Accordingly, the amount of light emitted from edges of the display area DA can be reduced. In addition, it is possible to prevent edges of an image from being viewed in a stepped shape or prevent a sharp color change from being viewed at the edges of the image.

In some exemplary embodiments, the light transmission control pattern portion 700 may have a width of 10 μm to 300 μm in consideration of a width of the non-sensing area NSA, a space in which the first touch signal lines 901 and the second touch signal lines 903 are disposed, and a width of overlap with the light emitting elements of the display panel DP.

Figure 21:
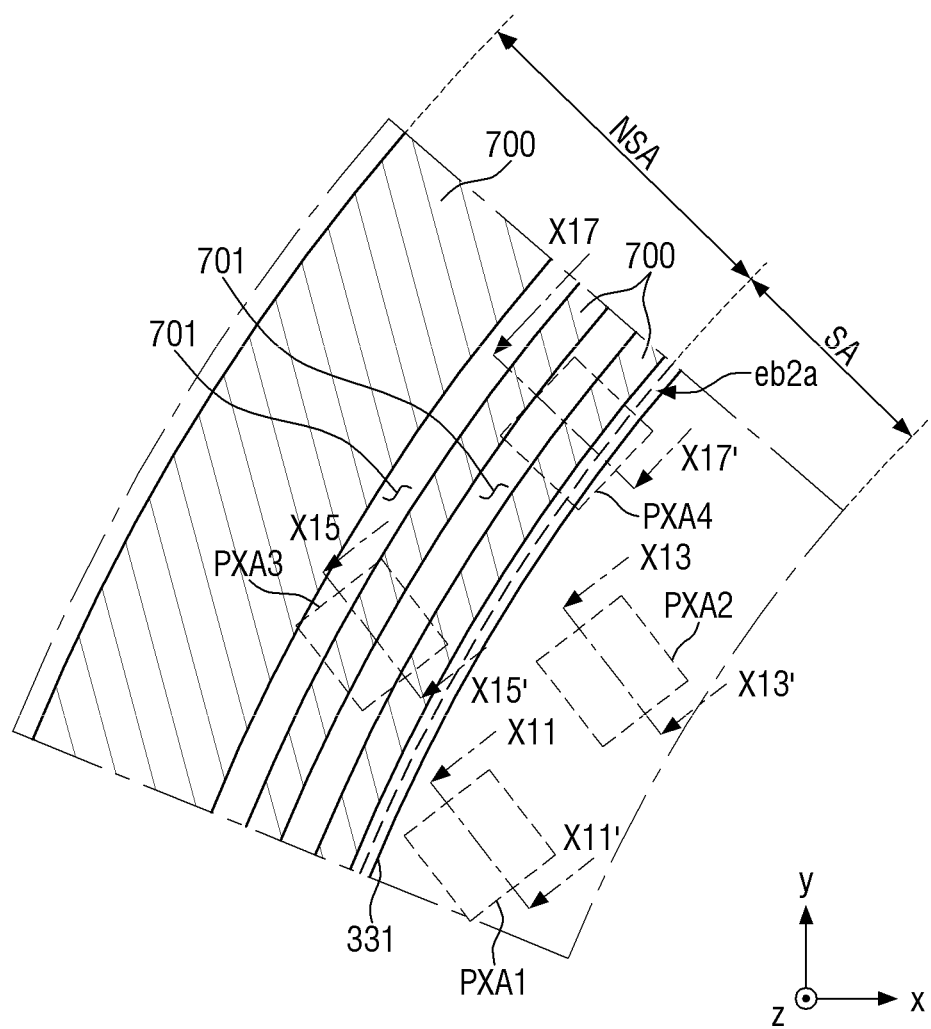
FIG. 21 is an enlarged plan view of a portion Q3 of FIG. 16, also showing light emitting areas of the display panel.
Figure 22:
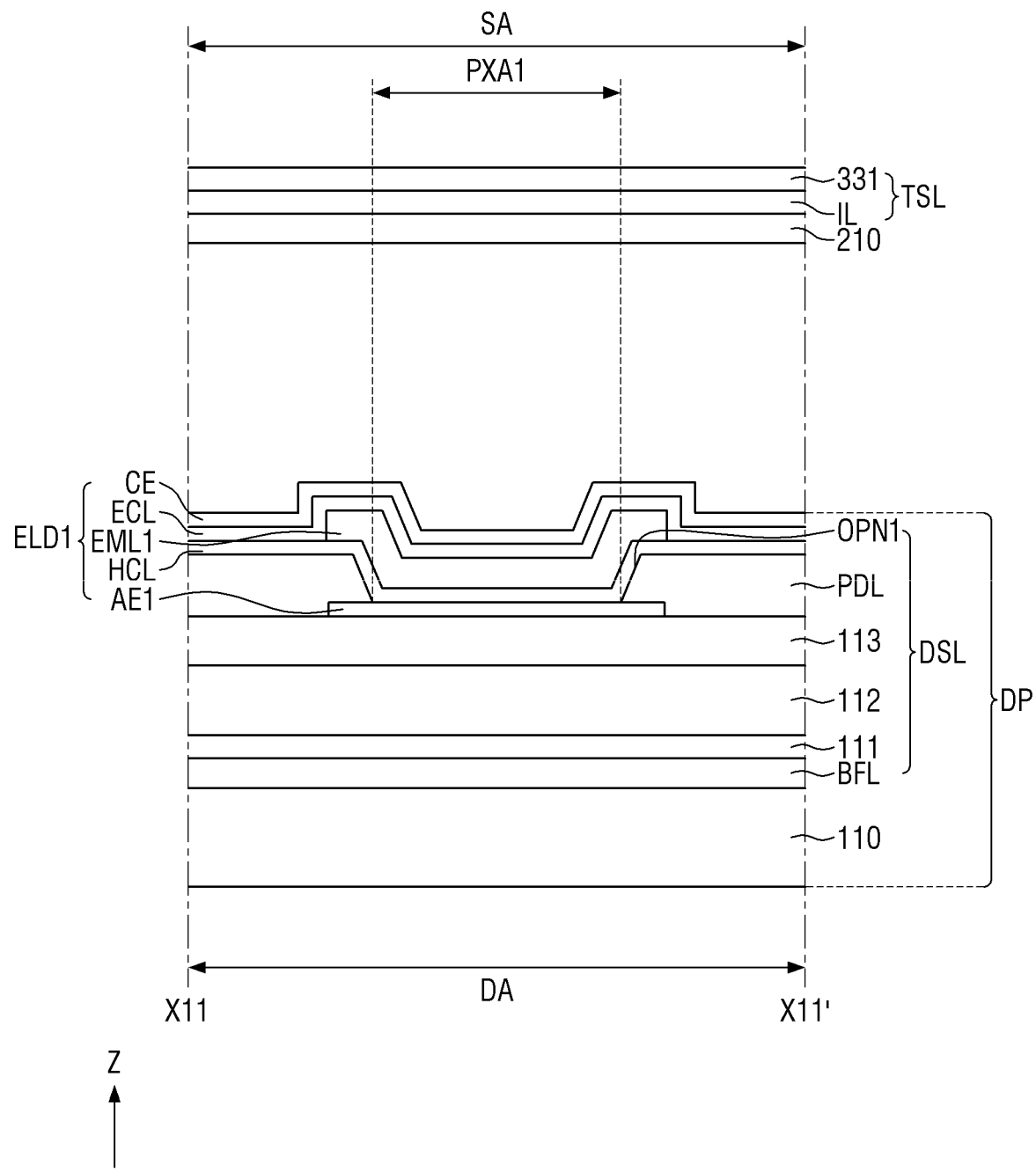
FIG. 22 is a cross-sectional view of the display device according to the exemplary embodiment, taken along line X11-X11' of FIG. 21.
Figure 23:
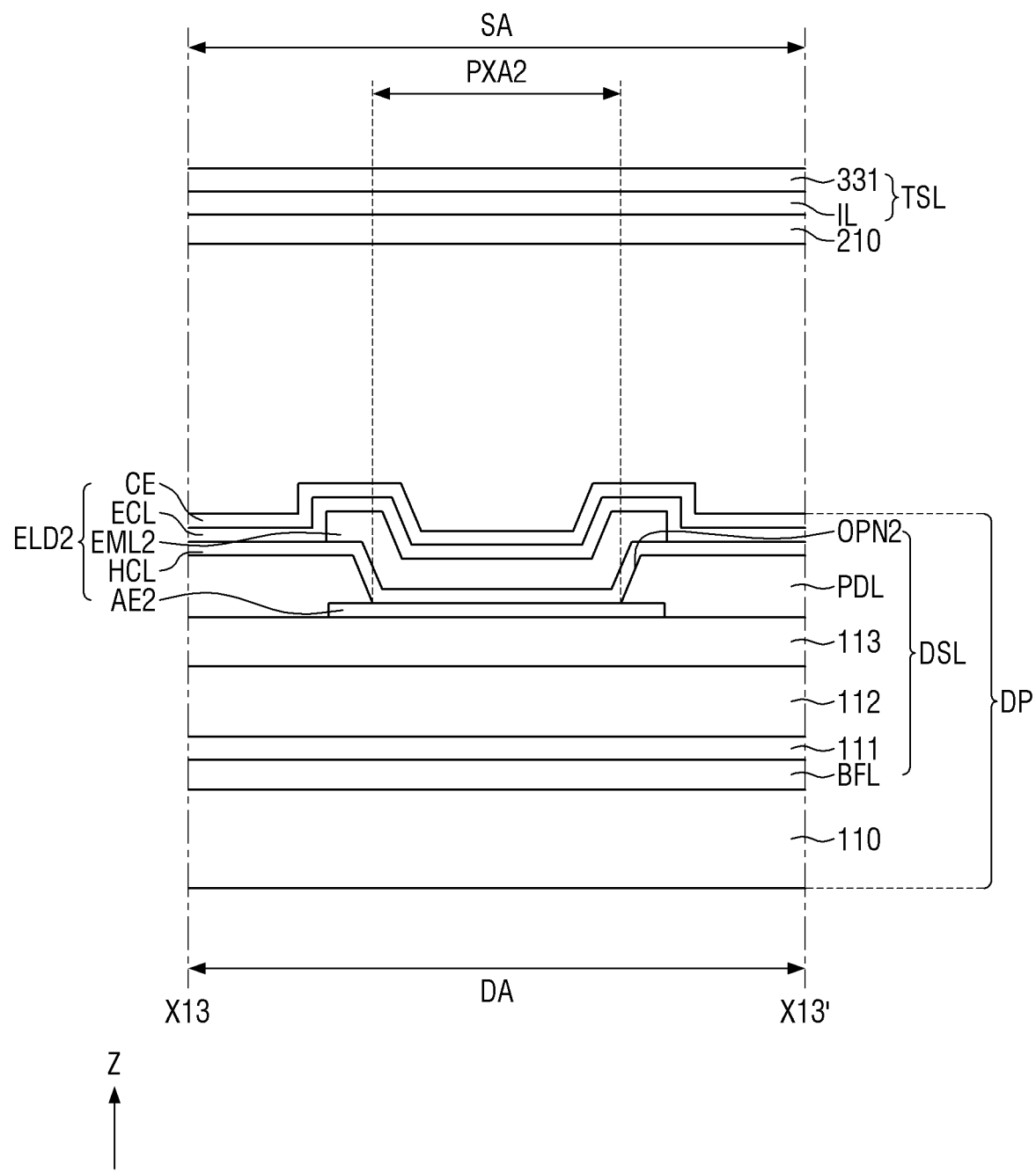
FIG. 23 is a cross-sectional view of the display device according to the exemplary embodiment, taken along line X13-X13' of FIG. 21.
Figure 24:
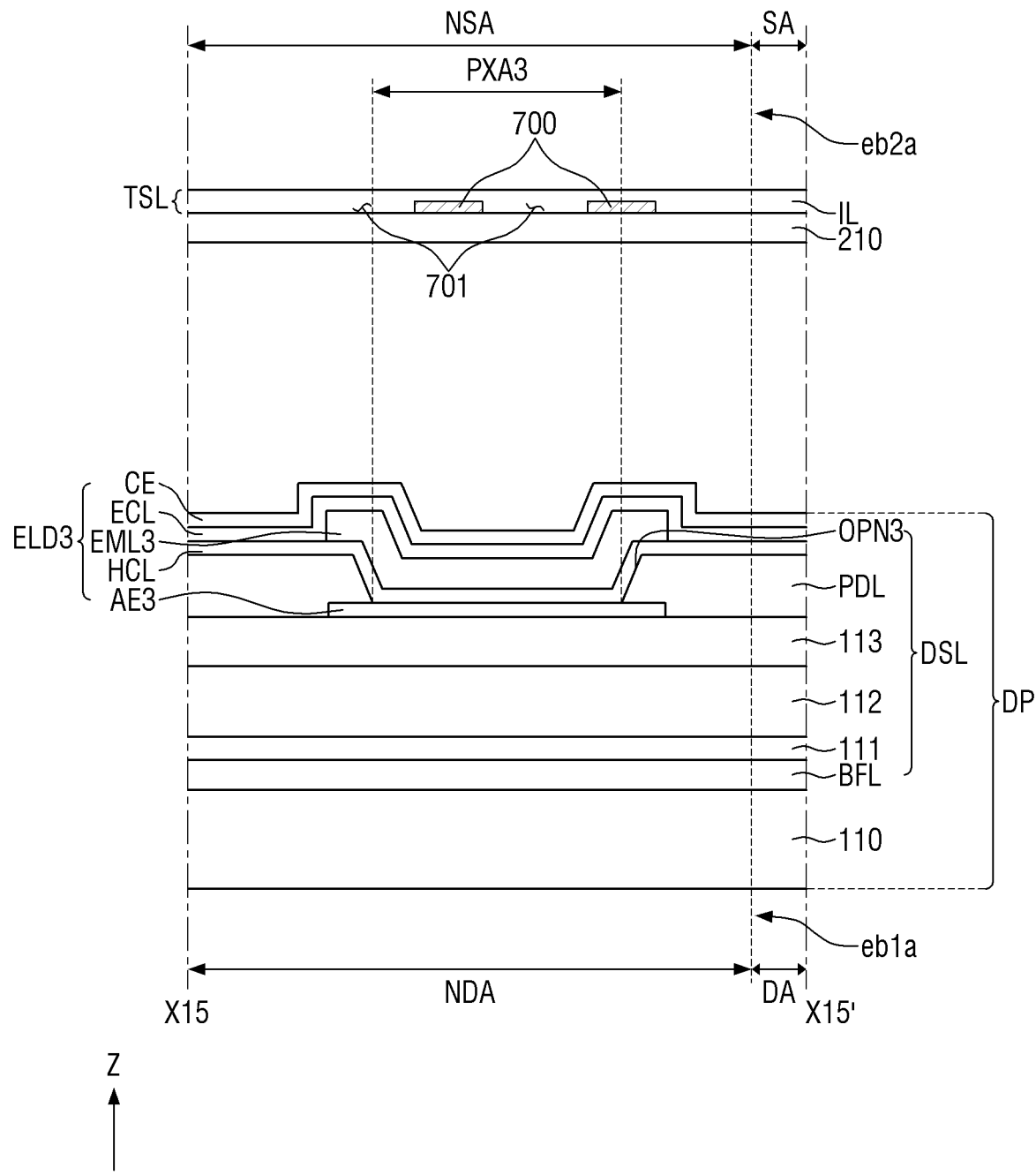
FIG. 24 is a cross-sectional view of the display device according to the exemplary embodiment, taken along line X15-X15' of FIG. 21.
Figure 25:
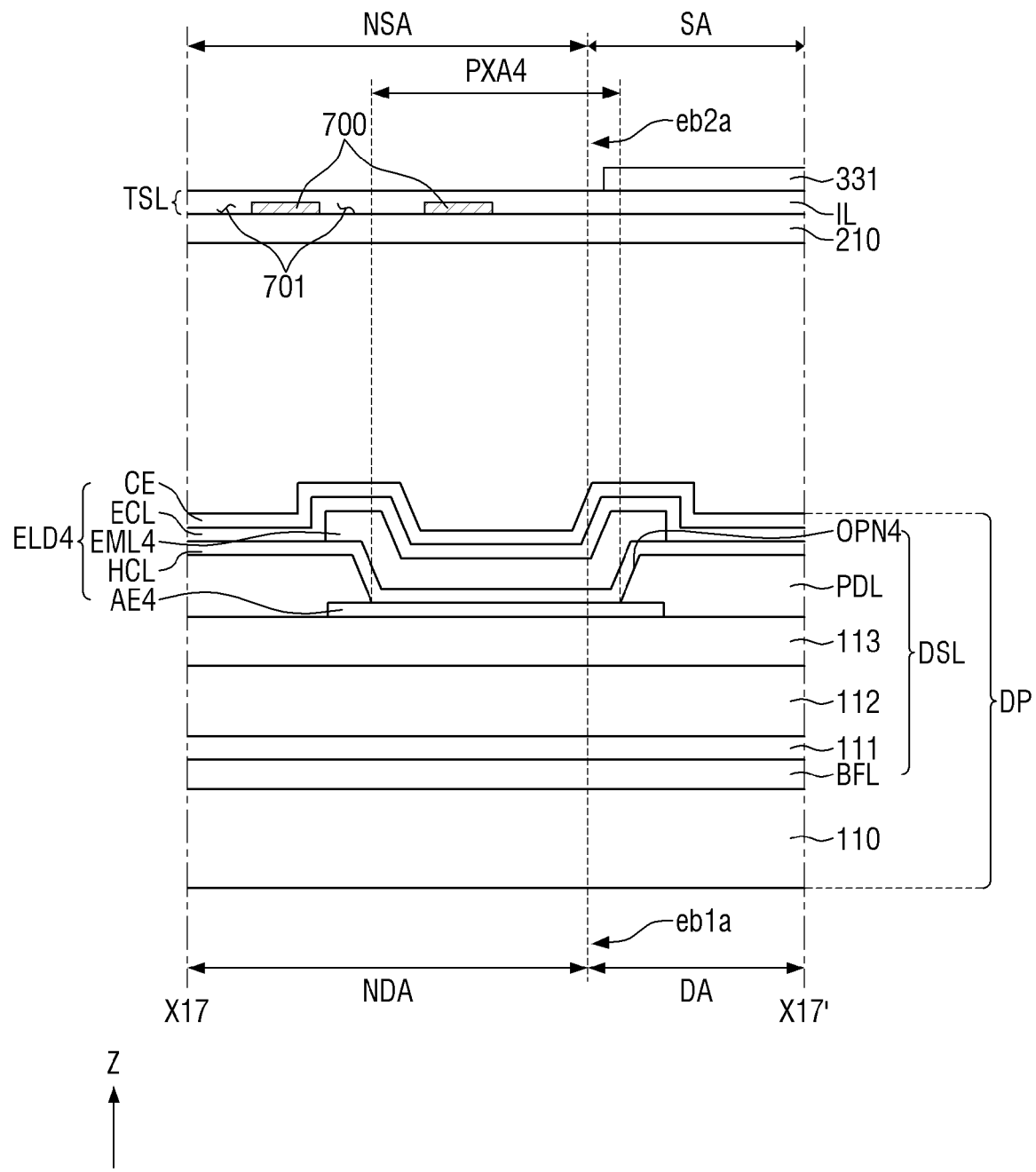
FIG. 25 is a cross-sectional view of the display device according to the exemplary embodiment, taken along line X17-X17' of FIG. 21.

FIG. 21 is an enlarged plan view of a portion Q3 of FIG. 16, also showing light emitting areas of the display panel DP. FIG. 22 is a cross-sectional view of the display device 1 according to the exemplary embodiment, taken along line X11-X11' of FIG. 21. FIG. 23 is a cross-sectional view of the display device 1 according to the exemplary embodiment, taken along line X13-X13' of FIG. 21. FIG. 24 is a cross-sectional view of the display device 1 according to the exemplary embodiment, taken along line X15-X15' of FIG. 21. FIG. 25 is a cross-sectional view of the display device 1 according to the exemplary embodiment, taken along line X17-X17' of FIG. 21.

Referring to FIGS. 21 through 25, most of the light emitting elements of the display panel DP are located in the display area DA, and some of the light emitting elements may be located in the peripheral area NDA. For example, the whole of a light emitting element may be located in the peripheral area NDA, and a portion of another light emitting element may be located in the peripheral area NDA while the other portion of the light emitting element is located in the display area DA.

Two light emitting elements located in the display area DA and adjacent to an edge of the display area DA will be referred to as a first light emitting element ELD1 and a second light emitting element ELD2, and two light emitting elements located partially or entirely in the peripheral area NDA and adjacent to the edge of the display area DA will be referred to as a third light emitting element ELD3 and a fourth light emitting element ELD4.

Each of the first light emitting element ELD1, the second light emitting element ELD2, the third light emitting element ELD3 and the fourth light emitting element ELD4 includes the hole control layer HCL, the electron control layer ECL and the cathode CE. In addition, the first light emitting element ELD1 further includes a first light emitting layer EML1 and a first anode AE1, the second light emitting element ELD2 further includes a second light emitting layer EML2 and a second anode AE2, the third light emitting element ELD3 further includes a third light emitting layer EML3 and a third anode AE3, and the fourth light emitting element ELD4 further includes a fourth light emitting layer EML4 and a fourth anode AE4. In some exemplary embodiments, any one of the first light emitting layer EML1, the second light emitting layer EML2, the third light emitting layer EML3 and the fourth light emitting layer EML4 may be a red light emitting layer, another one may be a green light emitting layer, and another one may be a blue light emitting layer. The remaining one of the first light emitting layer EML1, the second light emitting layer EML2, the third light emitting layer EML3 and the fourth light emitting layer EML4 may be any one of a red light emitting layer, a green light emitting layer, and a blue light emitting layer. In an exemplary embodiment, the first light emitting layer EML1 may be a red light emitting layer, the second light emitting layer EML2 may be a green light emitting layer, the third light emitting layer EML3 may be a blue light emitting layer, and the fourth light emitting layer EML4 may be a green light emitting layer. That is, pixels may have an RGBG arrangement.

In some exemplary embodiments, the pixels may have an RGB arrangement.

Since the first light emitting element ELD1 and the second light emitting element ELD2 are located in the display area DA, they may overlap a touch electrode, e.g., a second touch electrode 331 located in the sensing area SA. Since the first light emitting element ELD1 and the second light emitting element ELD2 overlap the second touch electrode 331, a first light emitting area PXA1 from which light emitted from the first light emitting element ELD1 is output and a second light emitting area PXA2 from which light emitted from the second light emitting element ELD2 is output may also inevitably overlap the touch electrode, e.g., the second touch electrode 331.

The first light emitting area PXA1 may be defined by a first opening OPN1 formed in the pixel defining layer PDL, and the second light emitting area PXA2 may be defined by a second opening OPN2 formed in the pixel defining layer PDL.

The touch electrodes, e.g., the second touch electrodes 331 of the touch sensor TSL may be made of a transparent conductive material as described above. Therefore, light emitted from the first light emitting element ELD1 and the second light emitting element ELD2 may be emitted out of the display device 1 through the second touch electrode 331.

The whole of the third light emitting element ELD3 may be located in the peripheral area NDA and overlap the light transmission control pattern portion 700 located in the non-sensing area NSA. Therefore, the third light emitting area PXA3 from which light emitted from the third light emitting element ELD3 is output may also inevitably overlap the light transmission control pattern portion 700.

The third light emitting area PXA3 may be defined by a third opening OPN4 formed in the pixel defining layer PDL.

Since the light transmission control pattern portion 700 is made of an opaque conductive material, light emitted from the third light emitting element ELD3 may be blocked by the light transmission control pattern portion 700.

The openings 701 may be formed in the light transmission control pattern portion 700 as described above. The openings 701 may overlap the third light emitting element ELD3 or the third light emitting area PXA3. That is, a portion of light emitted from the third light emitting element ELD3 may be emitted out of the display device 1 through the openings 701 without being blocked by the light transmission control pattern portion 700.

A light emitting area from which light emitted from a light emitting element is output may have a polygonal shape such as a quadrilateral or an octagon. Therefore, when an outermost side of the display area DA is rounded, an edge of an image displayed on the display device 1 may be viewed in a stepped shape due to a difference in shape between the light emitting area and the edge of the display area DA.

The light transmission control pattern portion 700 having the openings 701 may block a portion of light emitted from the third light emitting element ELD3 in the peripheral area NDA. Accordingly, luminance around the rounded boundary eb1a between the display area DA and the peripheral area NDA may be reduced, thereby preventing an edge of an image displayed on the display device 1 from being clearly viewed in a stepped shape.

In some exemplary embodiments, the proportion of a portion covered by the light transmission control pattern portion 700 in the third light emitting area PXA3 may be 10% to 90%. In other words, the proportion of light passing through the openings 701 in light emitted from the third light emitting area PXA3 may be 10% to 90%.

A portion of the fourth light emitting element ELD4 may be located in the peripheral area NDA, and the other portion of the fourth light emitting element ELD4 may be located in the display area DA. That is, the fourth light emitting element ELD4 may overlap the rounded boundary eb1a between the display area DA and the peripheral area NDA and may also overlap the rounded boundary eb2a between the sensing area SA and the non-sensing area NSA.

A portion of the fourth light emitting element ELD4 which is located in the display area DA may overlap the second touch electrode 331, and a portion of the fourth light emitting element ELD4 which is located in the peripheral area NDA may overlap the light transmission control pattern portion 700. Therefore, a portion of the fourth light emitting area PXA4 from which light emitted from the fourth light emitting element ELD4 is output may also inevitably overlap the light transmission control pattern portion 700, and the other portion may overlap the second touch electrode 331.

The fourth light emitting area PXA4 may be defined by a fourth opening OPN4 formed in the pixel defining layer PDL.

A portion of the fourth light emitting element ELD4 which is located in the peripheral area NDA may further overlap the openings 701 formed in the light transmission control pattern portion 700. That is, light emitted from the fourth light emitting element ELD4 or light output from the fourth light emitting area PXA4 may be provided to the outside of the display device 1 in the display area DA and may be provided to the outside of the display device 1 through the openings 701 in the peripheral area NDA.

FIGS. 26 through 32 are plan views of modified examples of FIG. 21, more specifically, modified examples of the light transmission control pattern portion 700.

Figure 26:
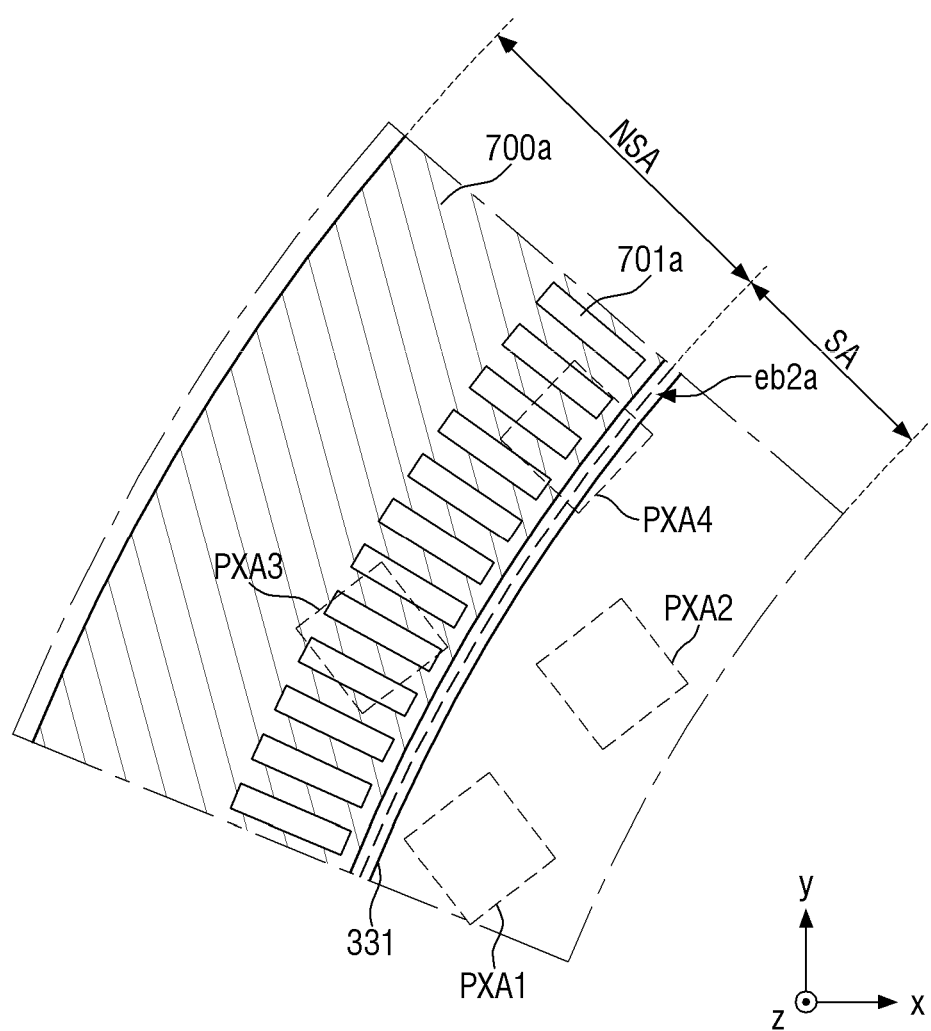
FIGS. 26, 27, 28, 29, 30, 31, and 32 are plan views of modified examples of FIG. 21.

Referring to FIG. 26, the current exemplary embodiment is substantially the same as the exemplary embodiment of FIG. 21 except that openings 701a formed in a light transmission control pattern portion 700a do not extend along a rounded boundary eb2a between a sensing area SA and a non-sensing area NSA and extend in a direction intersecting a direction in which the rounded boundary eb2a extends.

Figure 27:
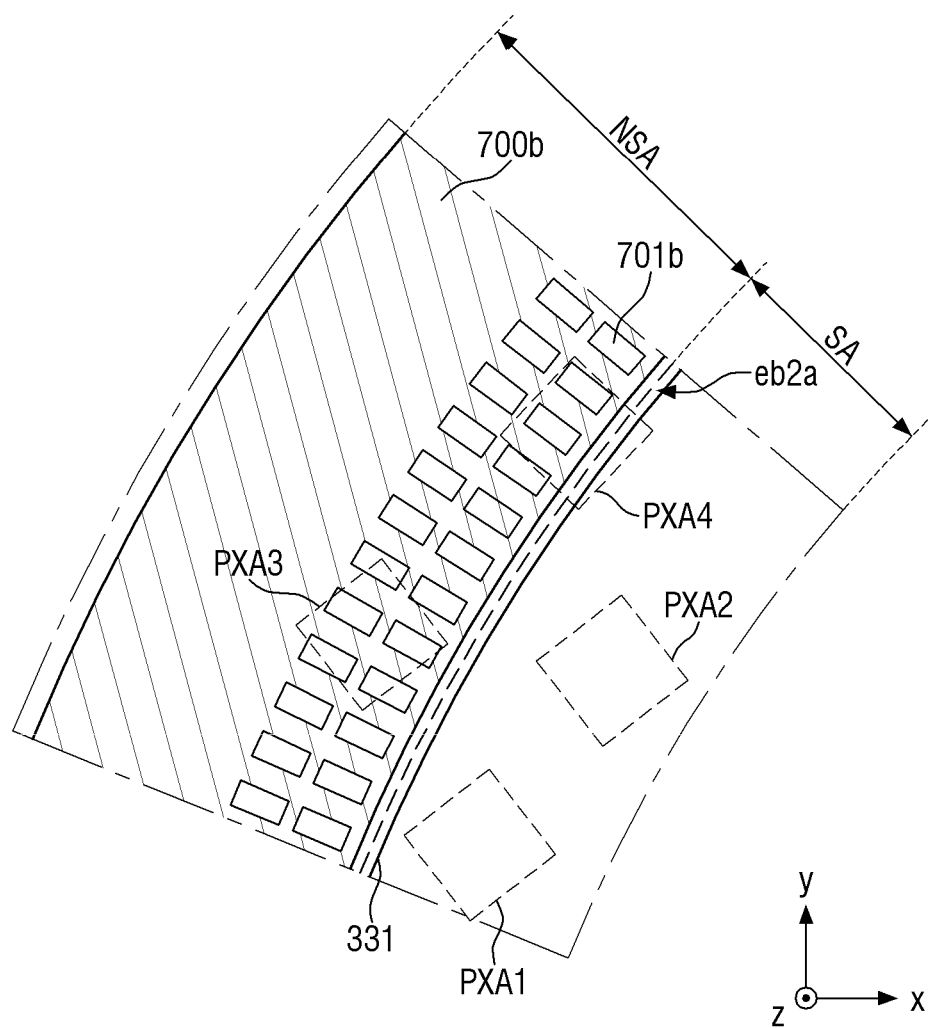

Referring to FIG. 27, the current exemplary embodiment is substantially the same as the exemplary embodiment of FIG. 26 except that openings 701b formed in a light transmission control pattern portion 700b are island-shaped polygonal patterns and are spaced apart from each other along a direction in which a rounded boundary eb2a extends and a direction intersecting the direction in which the rounded boundary eb2a extends. Although the openings 701b are quadrilateral in FIG. 27, this is merely an example. The planar shape of each of the openings 701b can also be changed to other polygonal shapes such as a triangle, a pentagon, a hexagon, and an octagon.

Figure 28:
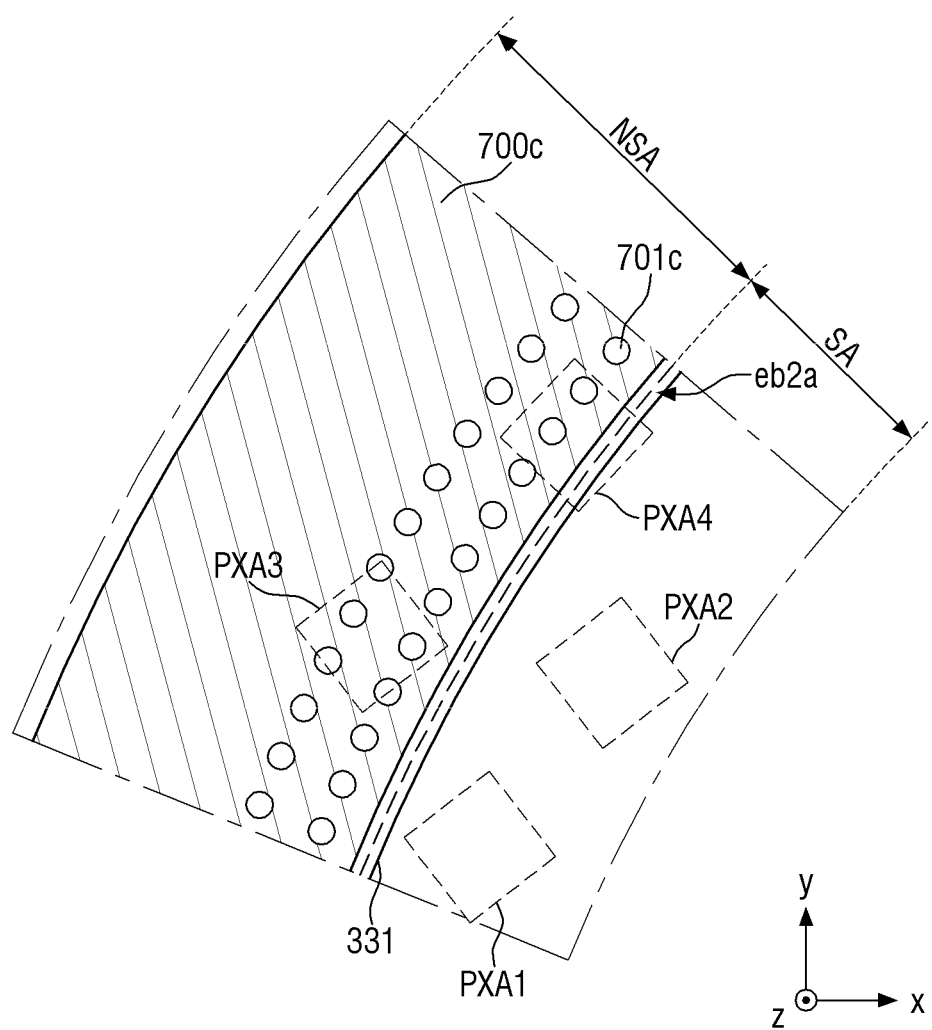

Referring to FIG. 28, the current exemplary embodiment is substantially the same as the exemplary embodiment of FIG. 27 except that openings 701c formed in a light transmission control pattern portion 700c have a circular planar shape. The planar shape of each of the openings 701c can also be changed to an elliptical shape, a semicircular shape, a semielliptical shape, etc. in addition to the structure shown in FIG. 27.

Figure 29:
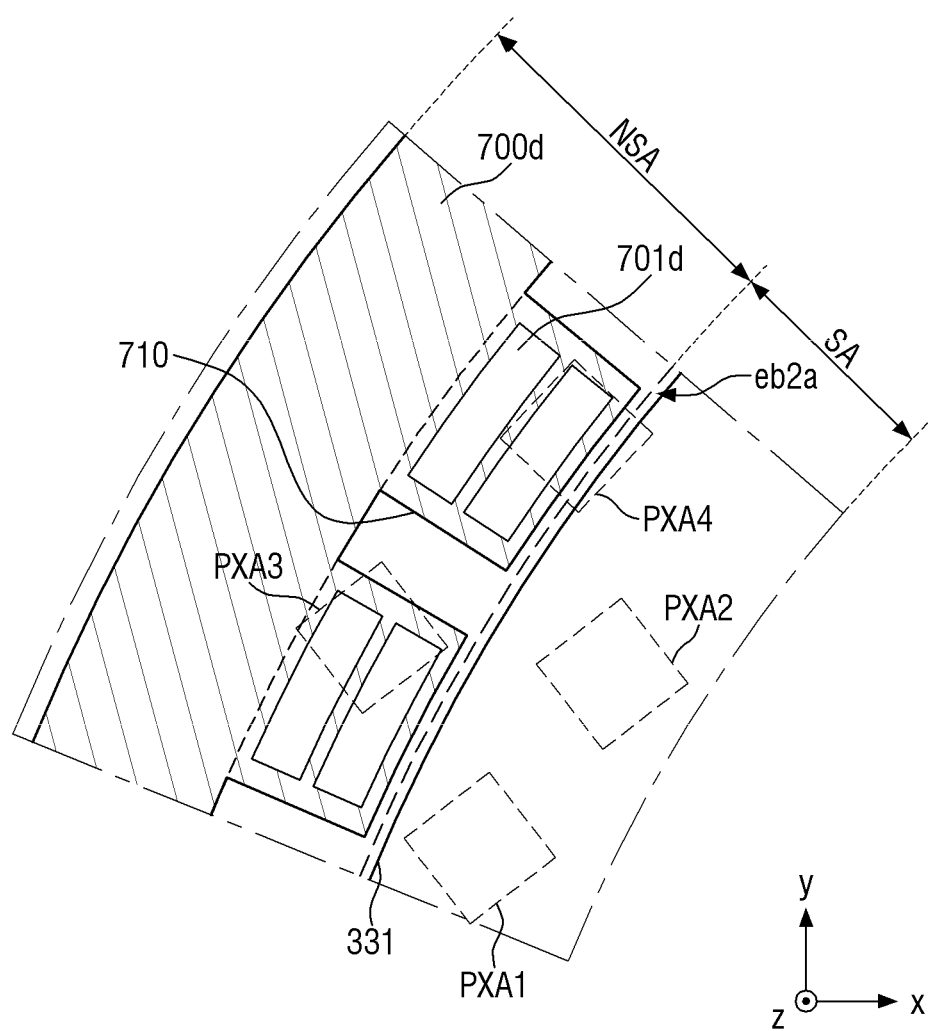

Referring to FIG. 29, the current exemplary embodiment is different from the exemplary embodiment of FIG. 21 in that a light transmission control pattern portion 700d includes protrusions 710 protruding from parts of the light transmission control pattern portion 700d and overlapping light emitting areas and that openings 701d are formed in each of the protrusions 710 and is similar to the exemplary embodiment of FIG. 21 in that the openings 701d extend along a rounded boundary eb2a. Other elements may be substantially the same or similar to those of the exemplary embodiment of FIG. 21.

Figure 30:
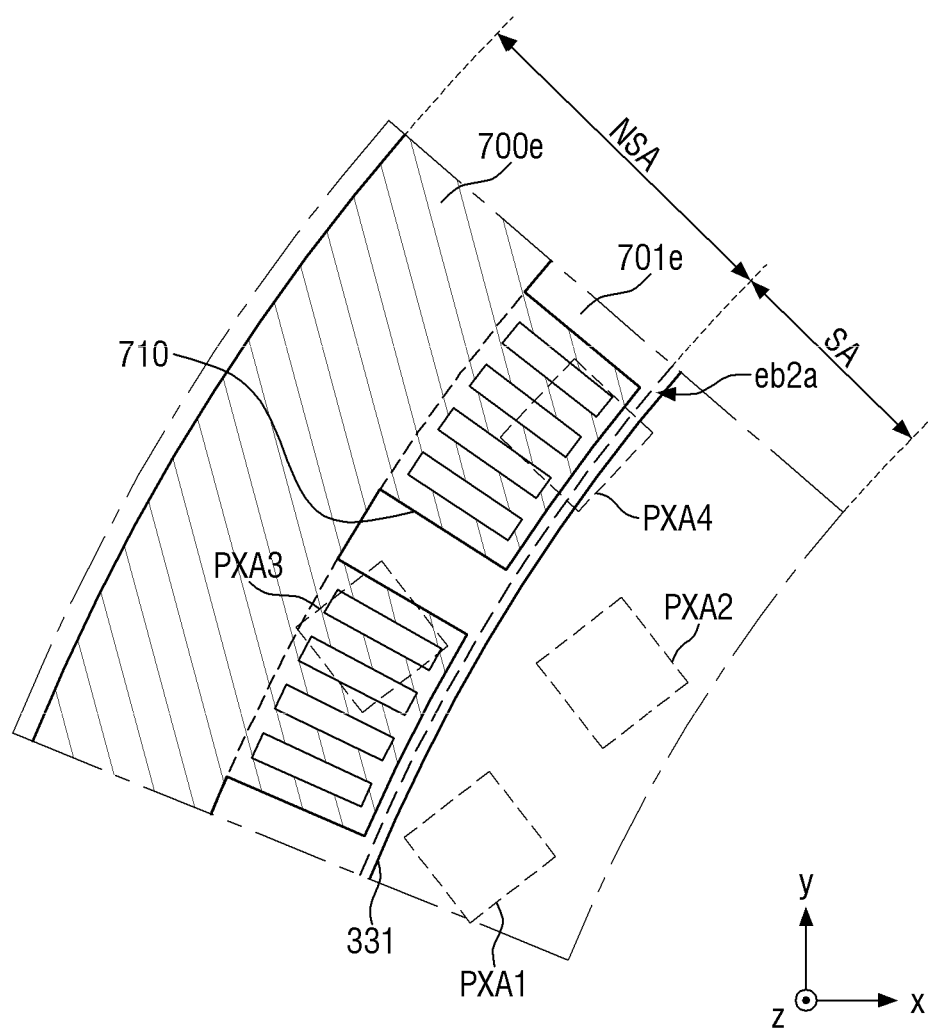

Referring to FIG. 30, the current exemplary embodiment is substantially the same or similar to the exemplary embodiment of FIG. 29 except that openings 701e formed in each protrusion 710 of a light transmission control pattern portion 700e extend in a direction intersecting a direction in which a rounded boundary eb2a extends.

Figure 31:
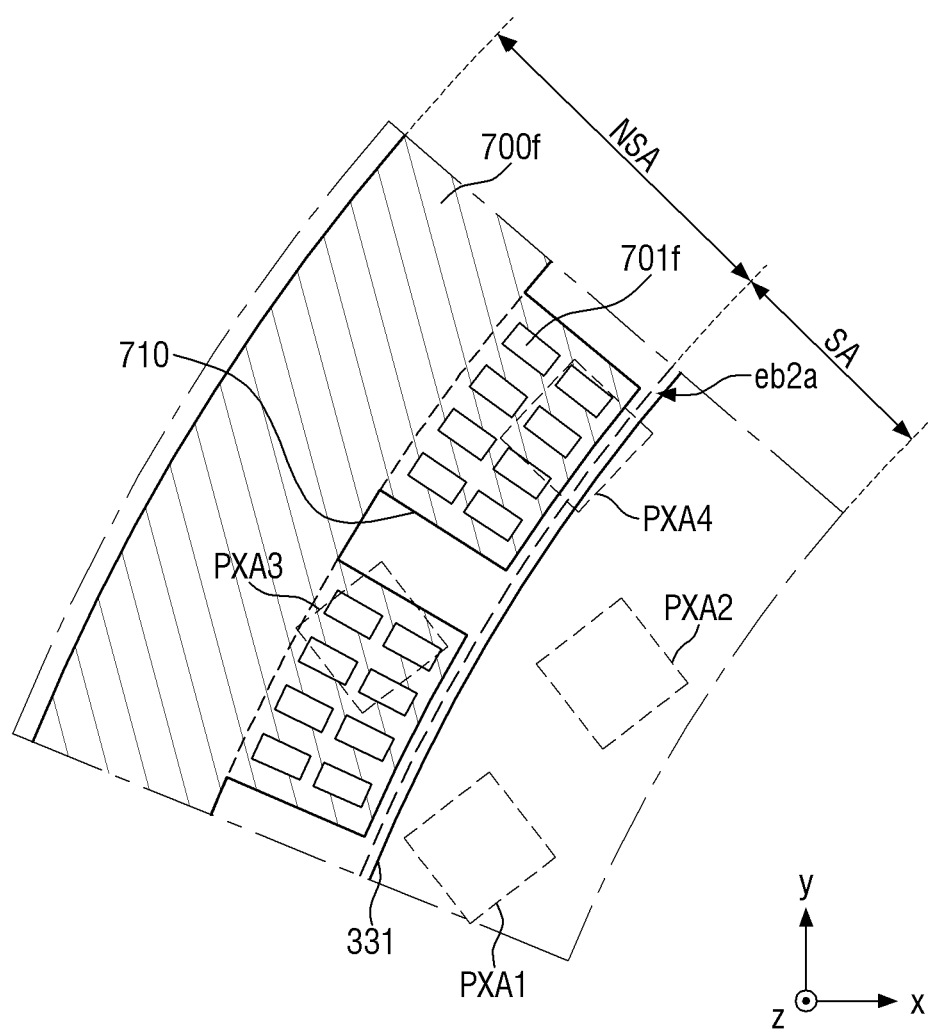

Referring to FIG. 31, the current exemplary embodiment is substantially the same or similar to the exemplary embodiment of FIG. 30 except that openings 701f formed in each protrusion 710 of a light transmission control pattern portion 700f are island-shaped polygonal patterns and are spaced apart from each other along a direction in which a rounded boundary eb2a extends and a direction intersecting the direction in which the rounded boundary eb2a extends. Other details of the openings 701f are substantially the same as the openings 701b (see FIG. 27) of the exemplary embodiment of FIG. 27, and thus a description thereof is omitted.

Figure 32:
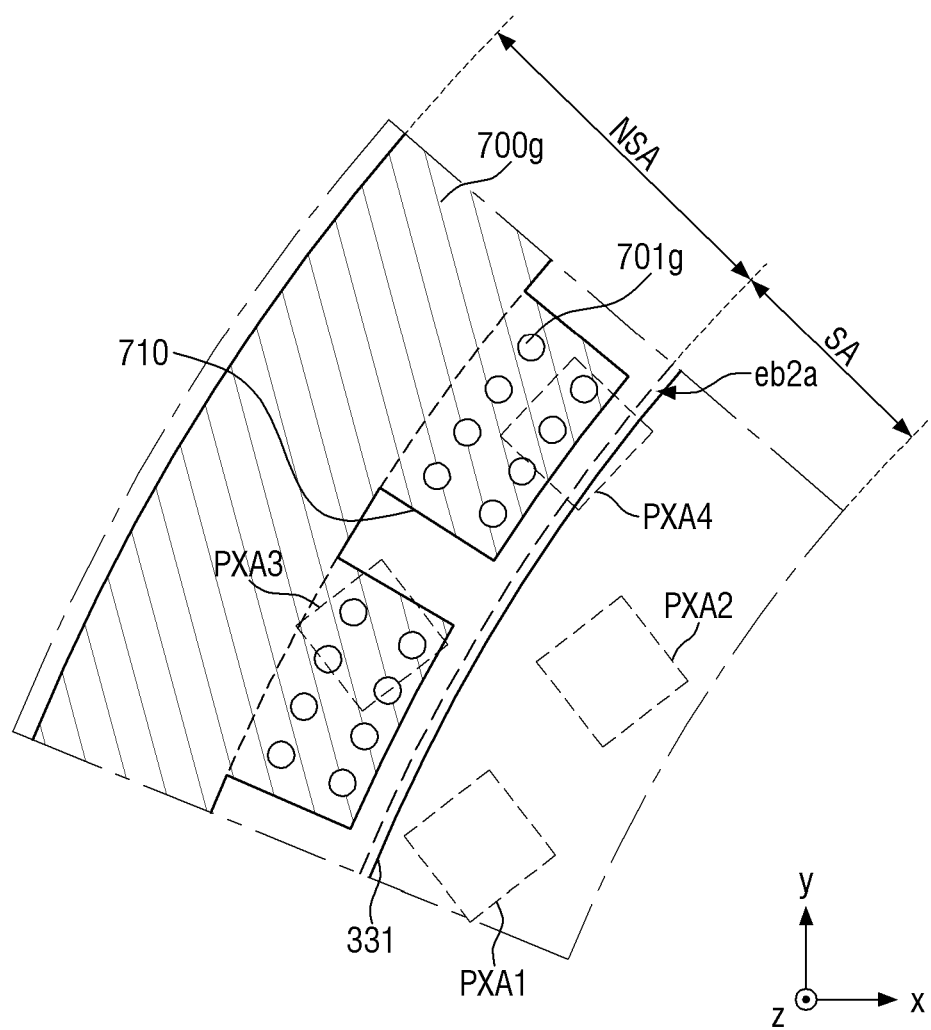

Referring to FIG. 32, the current exemplary embodiment is substantially the same or similar to the exemplary embodiment of FIG. 31 except that openings 701g formed in each protrusion 710 of a light transmission control pattern portion 700g are island-shaped circular patterns. Other details of the openings 701g are substantially the same as those of the openings 701c of the exemplary embodiment of FIG. 28, and thus a description thereof is omitted.

Figure 33:
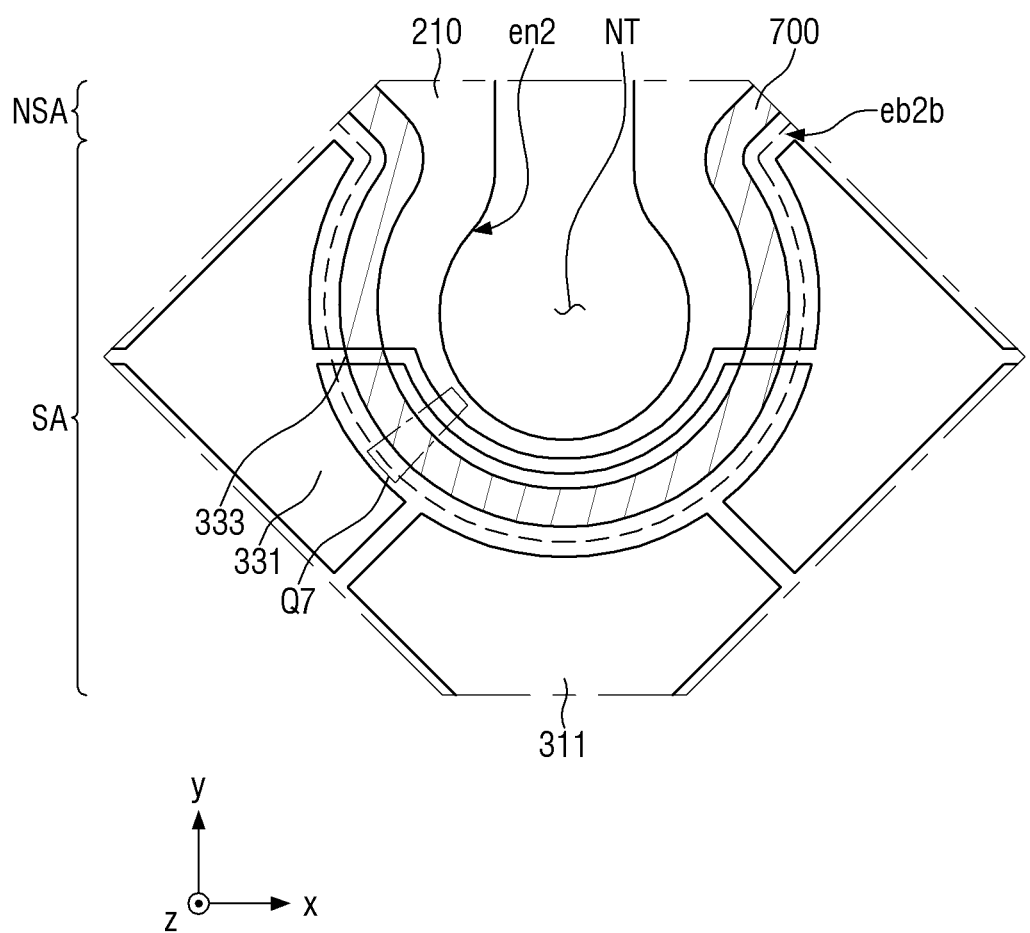
FIG. 33 is an enlarged plan view of a portion Q5 of FIG. 16.
Figure 34:
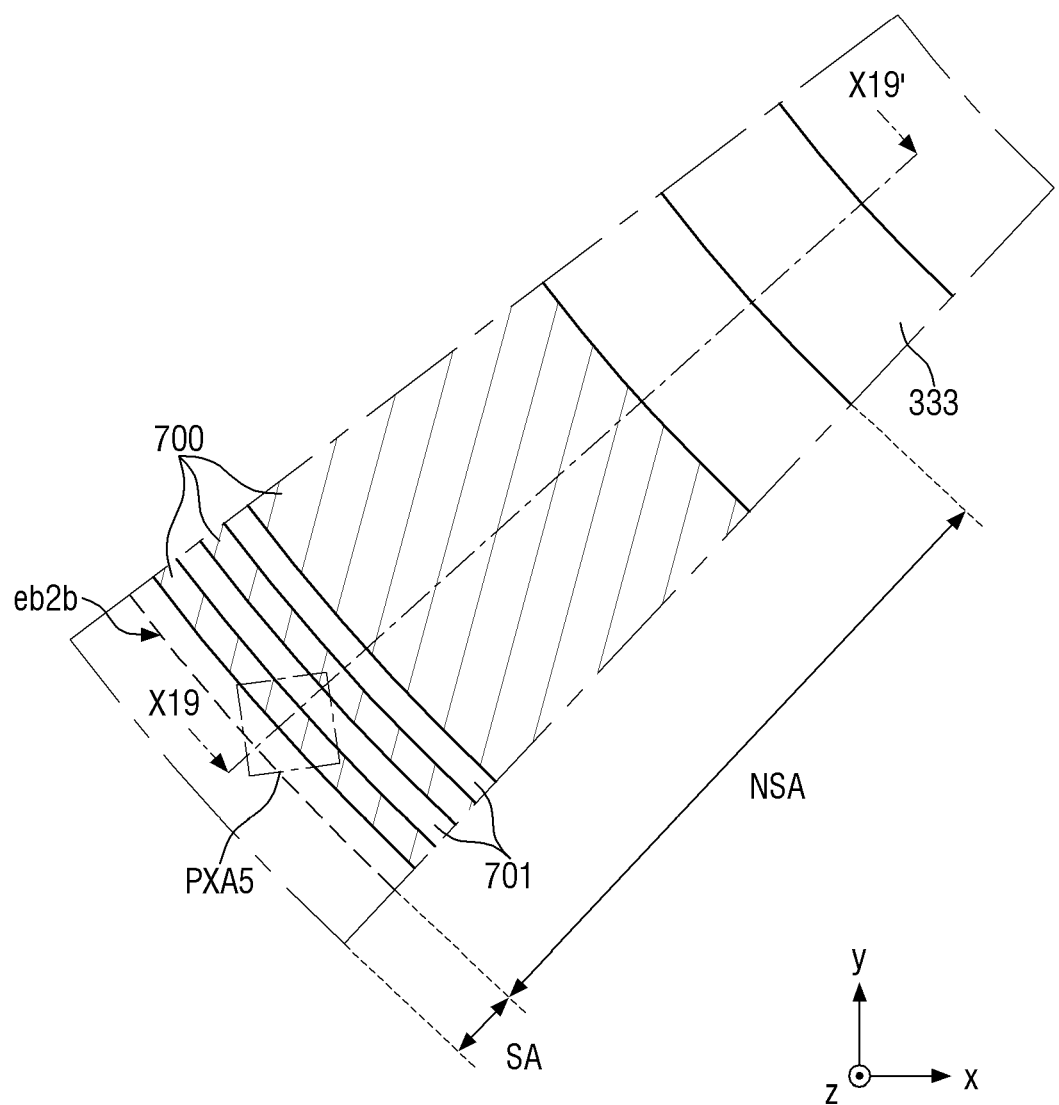
FIG. 34 is an enlarged plan view of a portion Q7 of FIG. 33, also showing a light emitting area of the display panel.
Figure 35:
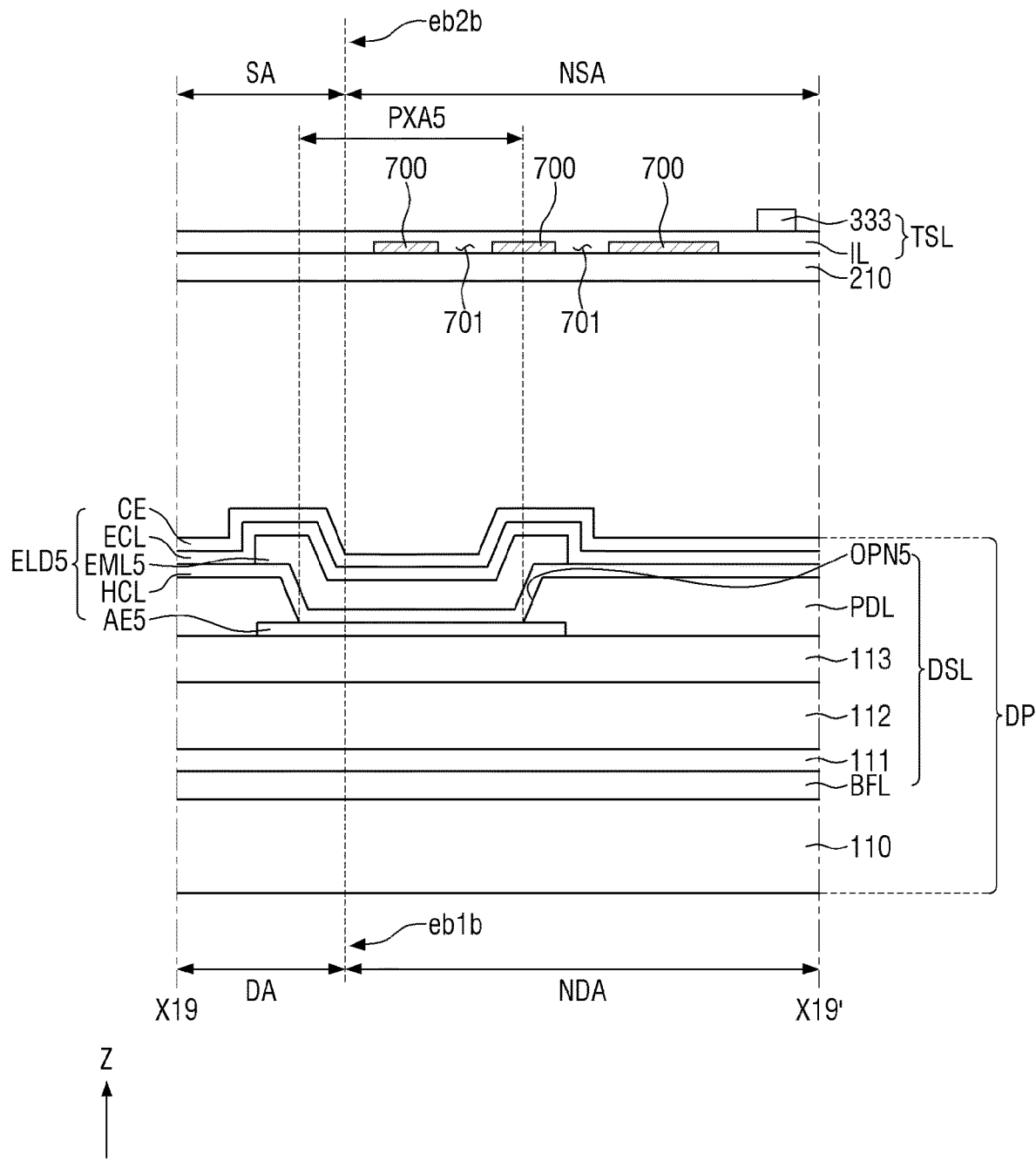
FIG. 35 is a cross-sectional view of the display device according to the exemplary embodiment, taken along line X19-X19' of FIG. 34.

FIG. 33 is an enlarged plan view of a portion Q5 of FIG. 16. FIG. 34 is an enlarged plan view of a portion Q7 of FIG. 33, also showing a light emitting area of the display panel DP. FIG. 35 is a cross-sectional view of the display device 1 according to the exemplary embodiment, taken along line X19-X19' of FIG. 34.

Referring to FIGS. 33 through 35, two second touch electrodes 331 spaced apart from each other along the first direction x with the notch portion NT interposed between them may be connected to each other by a second connection portion 333 bypassing the notch portion NT. In some exemplary embodiments, the second connection portion 333 around the notch portion NT may be located in the non-sensing area NSA.

The light transmission control pattern portion 700 may also be located in the non-sensing area NSA around the notch portion NT. The light transmission control pattern portion 700 around the notch portion NT may extend along the boundary eb2b between the sensing area SA and the non-sensing area NSA located around the notch portion NT, and a part of the light transmission control pattern portion 700 may overlap the second connection portion 333.

Some of the light emitting elements of the display panel DP may be located in the peripheral area NDA around the notch portion NT.

For example, the whole of a light emitting element may be located in the peripheral area NDA, and a portion of another light emitting element may be located in the peripheral area NDA while the other portion of the light emitting element is located in the display area DA.

If a light emitting element located in the peripheral area NDA and between the notch portion NT and the display area DA is referred to as a fifth light emitting element ELD5, the fifth light emitting element ELD5 may overlap the light transmission control pattern portion 700. Therefore, a fifth light emitting area PXA5 from which light emitted from the fifth light emitting element ELD5 is output may also inevitably overlap the light transmission control pattern portion 700.

The fifth light emitting element ELD5 includes a fifth anode AE5, a fifth light emitting layer EML5, the hole control layer HCL, the electron control layer ECL and the cathode CE.

The fifth light emitting area PXA5 may be defined by a fifth opening OPN5 formed in the pixel defining layer PDL.

In some exemplary embodiments, the fifth light emitting element ELD5 or the fifth light emitting area PXA5 may overlap the boundary eb2b between the sensing area SA and the non-sensing area NSA located around the notch portion NT or the boundary eb1b between the display area DA and the peripheral area NDA located around the notch portion NT.

The fifth light emitting element ELD5 or the fifth light emitting area PXA5 may further overlap the openings 701 of the light transmission control pattern portion 700, thereby preventing an edge of an image displayed around the notch portion NT from being viewed in a stepped shape.

Although not shown in the drawings, the shape of the light transmission control pattern portion 700 around the notch portion NT in FIG. 34 can be changed to the structures shown in FIGS. 26 through 32 described above.

Figure 36:
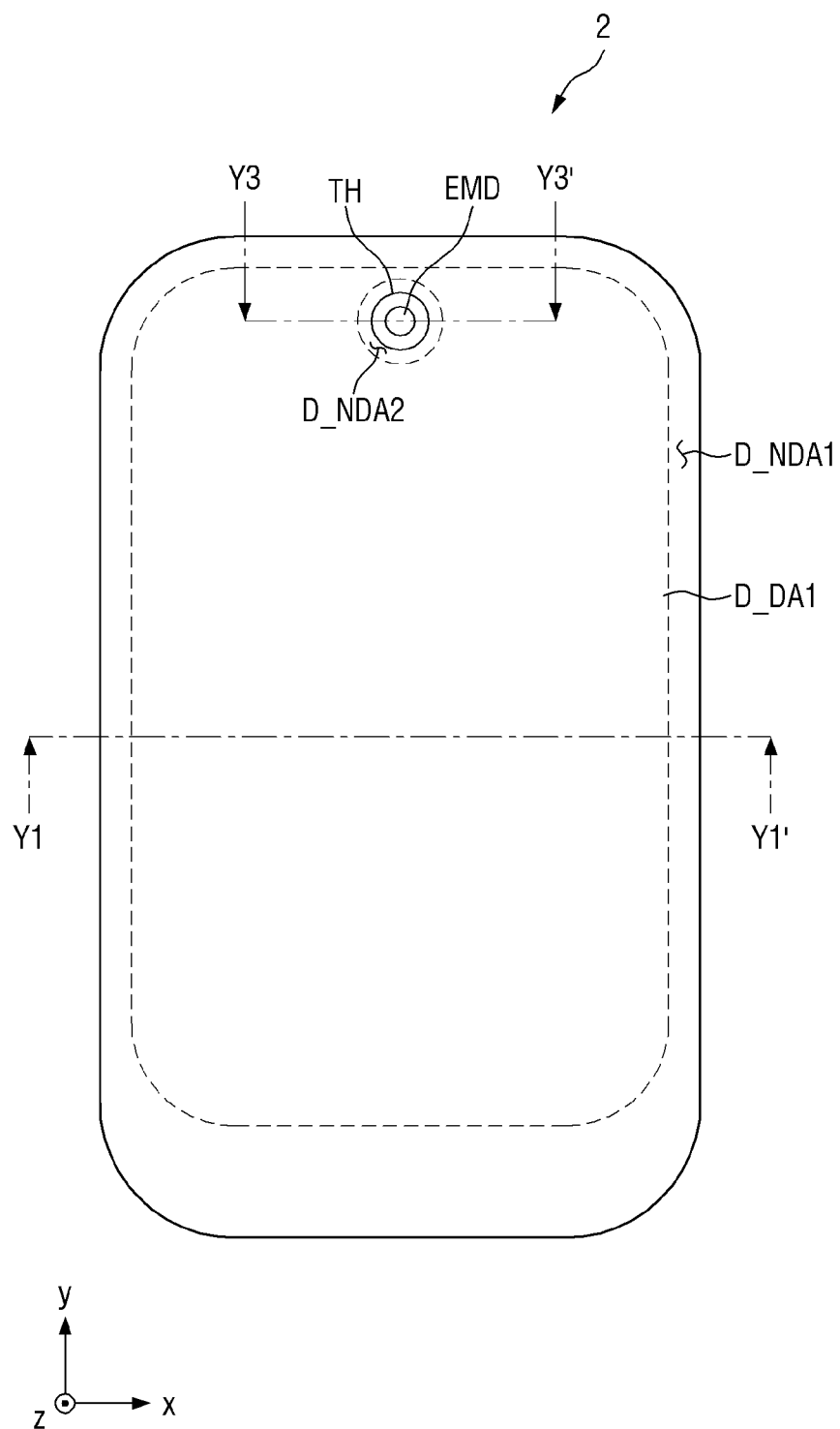
FIG. 36 is a schematic plan view of a display device according to an exemplary embodiment.
Figure 37:
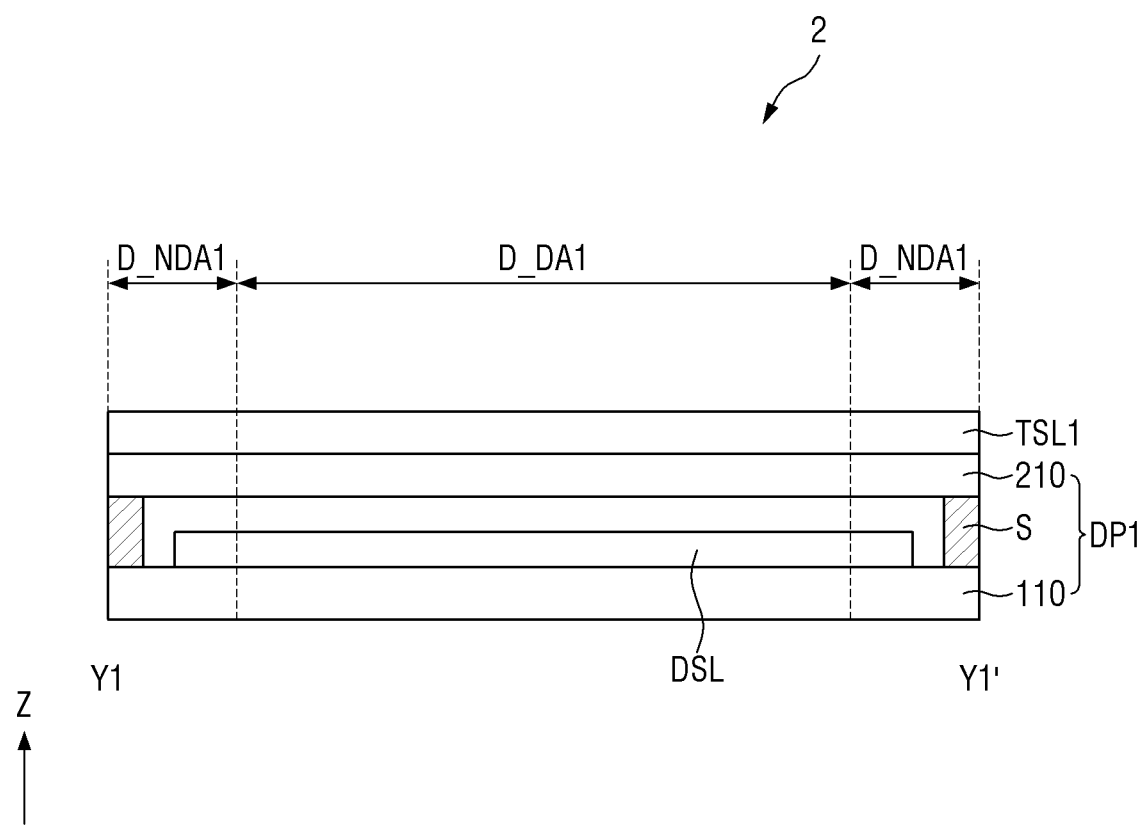
FIG. 37 is a schematic cross-sectional view of the display device according to the exemplary embodiment of FIG. 36, taken along line Y1-Y1' of FIG. 36.
Figure 38:
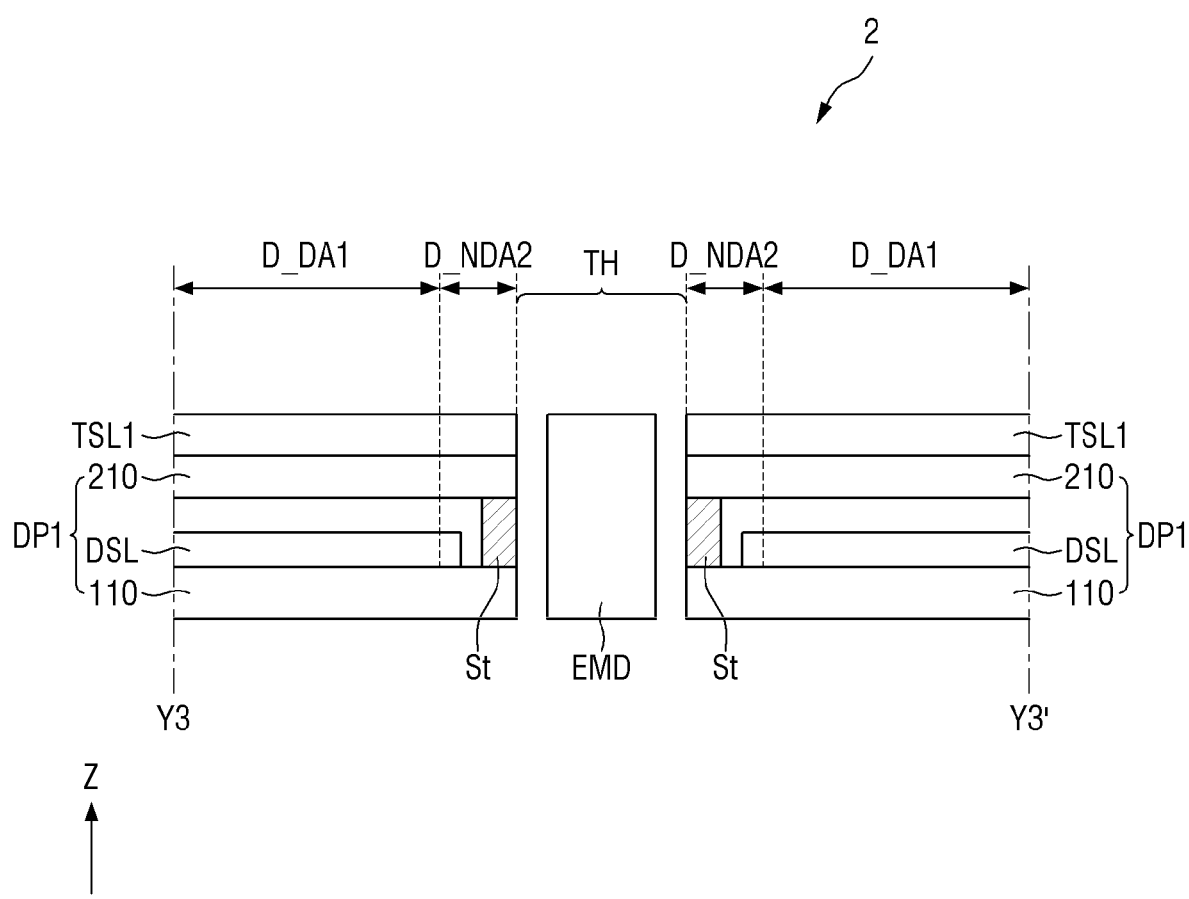
FIG. 38 is a schematic cross-sectional view of the display device according to the exemplary embodiment of FIG. 36, taken along line Y3-Y3' of FIG. 36.

FIG. 36 is a schematic plan view of a display device 2 according to an exemplary embodiment. FIG. 37 is a schematic cross-sectional view of the display device 2 according to the exemplary embodiment, taken along line Y1-Y1' of FIG. 36. FIG. 38 is a schematic cross-sectional view of the display device 2 according to the exemplary embodiment, taken along line Y3-Y3' of FIG. 36.

Referring to FIGS. 36 through 38, the display device 2 according to the current exemplary embodiment is substantially the same or similar to the exemplary embodiment of FIGS. 1 through 4 except that it does not include a notch portion and includes a through hole TH. Therefore, differences will be mainly described below.

The through hole TH may pass through the display device 2 along the third direction z, and an electronic element EMD may be disposed in the through hole TH.

In some exemplary embodiments, the planar shape of the through hole TH may be a circular shape as shown in the drawings. However, the planar shape of the through hole TH can be changed to various shapes such as a polygonal shape, a combination of a straight line and a curve, and an elliptical shape.

As for the planar structure of the display device 2, the display device 2 includes a display area D-DA1 where an image is displayed and a peripheral area D-NDA1 adjacent to an outer side of the display area D-DA1. In addition, the display device 2 further includes a hole peripheral area D-NDA2 surrounding the through hole TH.

The peripheral area D-NDA1 may surround the display area D-DA1, and the display area D-DA1 may surround the hole peripheral area D-NDA2.

As for the stacked structure of the display device 2, the display device 2 may include a display panel DP1 and a touch sensor TSL1 located on the display panel DP1.

In the stacked structure, the display panel DP1 includes a first substrate 110, a second substrate 210 located on the first substrate 110, and an element layer DSL located between the first substrate 110 and the second substrate 210. In addition, the display panel DP1 may further include a sealant S which is located between the first substrate 110 and the second substrate 210 in the peripheral area D-NDA1 and a hole sealant St which is located between the first substrate 110 and the second substrate 210 in the hole peripheral area D-NDA2 and completely surrounds the through hole TH.

The touch sensor TSL1 may be located on the display panel DP1, and the through hole TH may completely penetrate the display panel DP1 and the touch sensor TSL1 in the third direction z.

Figure 39:
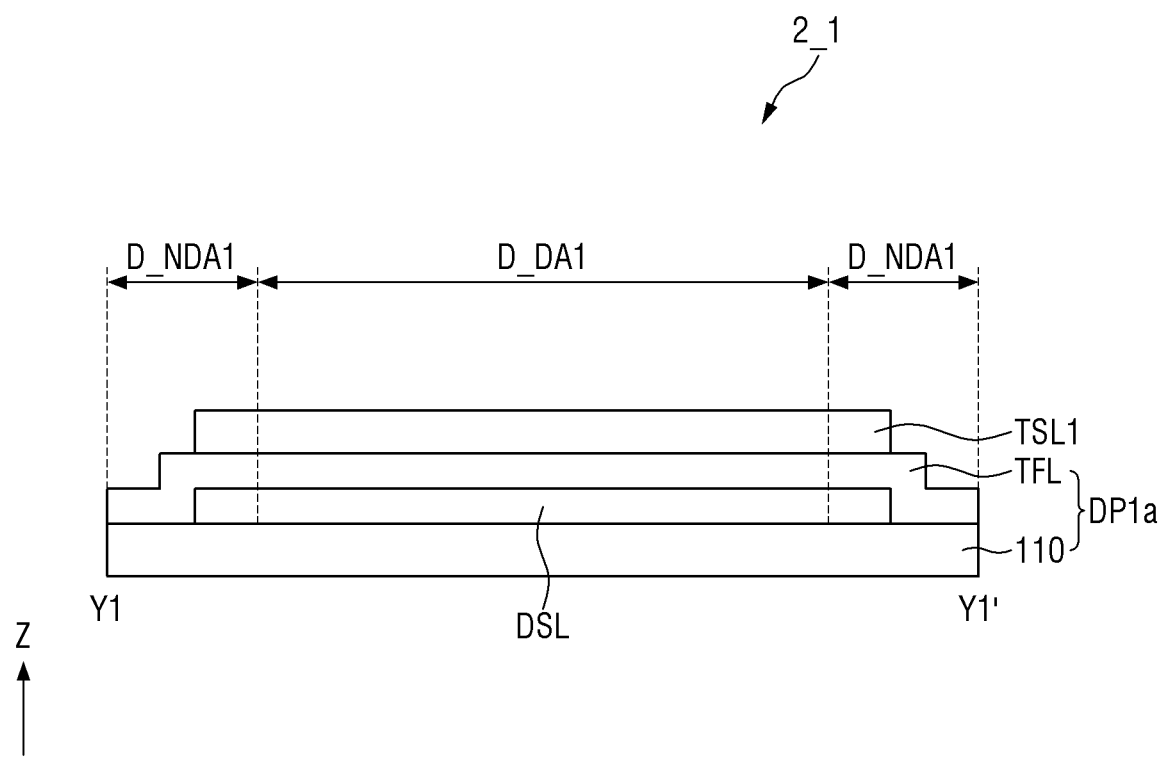
FIG. 39 is a schematic cross-sectional view of a display device according to a modification of the exemplary embodiment of FIG. 36, taken along line Y1-Y1' of FIG. 36.
Figure 40:
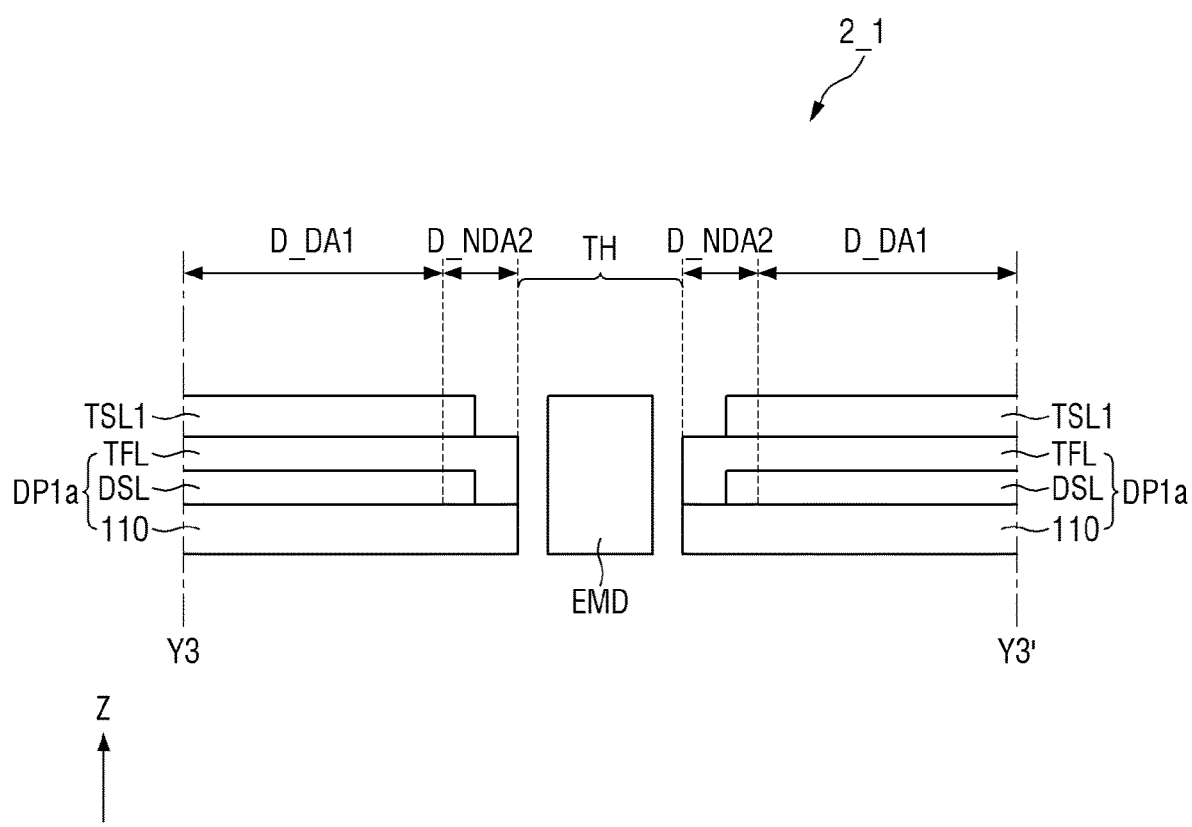
FIG. 40 is a schematic cross-sectional view of the display device according to the modification of the exemplary embodiment of FIG. 36, taken along line Y3-Y3' of FIG. 36.

FIG. 39 is a schematic cross-sectional view of a display device 2-1 according to a modified example of the embodiment of FIG. 36, taken along line Y1-Y1' of FIG. 36. FIG. 40 is a schematic cross-sectional view of the display device 2-1 according to the modified example of the embodiment of FIG. 36, taken along line Y3-Y3' of FIG. 36.

Referring to FIGS. 39 and 40, the display device 2-1 according to the modified example may include a display panel DP1a and a touch sensor TSL1. The display panel DP1a may include a first substrate 110, an element layer DSL located on the first substrate 110, and an upper insulating layer TFL located on the element layer DSL.

In some exemplary embodiments, side surfaces of the element layer DSL around a through hole TH may be covered by the upper insulating layer TFL. Accordingly, impurities such as moisture and oxygen can be prevented from penetrating into the element layer DSL around the through hole TH.

The first substrate 110, the element layer DSL, the upper insulating layer TFL and the touch sensor TSL1 are substantially the same or similar to those of FIGS. 1 through 4, and thus a description thereof is omitted.

A case where a display device has the structure of FIGS. 36 through 38, for example, the display device 2 includes the second substrate 210 will now be described as an example.

Figure 41:
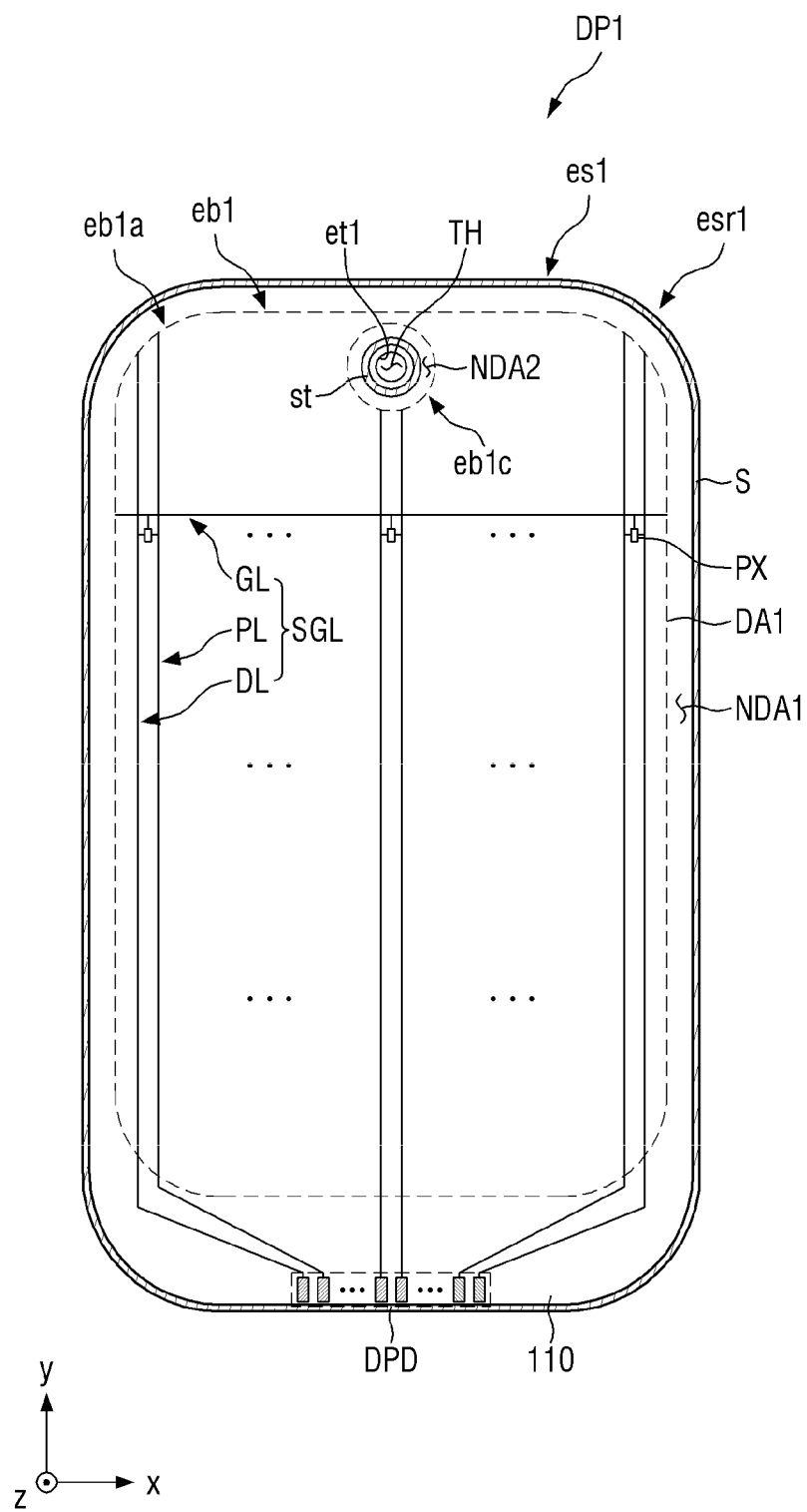
FIG. 41 is a schematic plan view of a display panel included in the display device according to the exemplary embodiment of FIG. 36.

FIG. 41 is a schematic plan view of the display panel DP1 included in the display device 2 according to the exemplary embodiment of FIG. 36.

Referring to FIG. 41, a display area DA1, a peripheral area NDA1 and a hole peripheral area NDA2 corresponding to the display area D-DA1, the peripheral area D-NDA1 and the hole peripheral area D-NDA2 of the display device 2 shown in FIG. 36 may be defined in the display panel DP1 or the first substrate 110.

An edge es1 of the first substrate 110 may include rounded portions esr1 at corners. In addition, the first substrate 110 may further include a hole edge et1 formed around the through hole TH to define the through hole TH.

A boundary eb1 between the display area DA1 and the peripheral area NDA1 of the display panel DP1 may include rounded portions eb1a at corners. In addition, a boundary eb1c between the display area DA1 and the hole peripheral area NDA2 of the display panel DP1 may include rounded portions, and its overall shape may be substantially the same (e.g., a circular shape) as the planar shape of the through hole TH.

A plurality of signal lines SGL and a plurality of pixels PX may be located on the first substrate 110 in the display area DA1. Signal pads DPD may be located on the first substrate 110 in the peripheral area NDA1. Most of the pixels PX may be located in the display area DA1. Some of the pixels PX may be located in the peripheral area NDA1, and some other ones of the pixels PX may be located in the hole peripheral area NDA2. The sealant S completely surrounding the display area DA1 may be located on the first substrate 110 in the peripheral area NDA1, and the hole sealant St completely surrounding the through hole TH may be located on the first substrate 110 in the hole peripheral area NDA2.

The signal lines SGL, the pixels PX, and the signal pads DPD may be included in the element layer DSL.

Other elements are substantially the same or similar to those described above with reference to FIGS. 8 through 15, and thus a description thereof is omitted.

Figure 42:
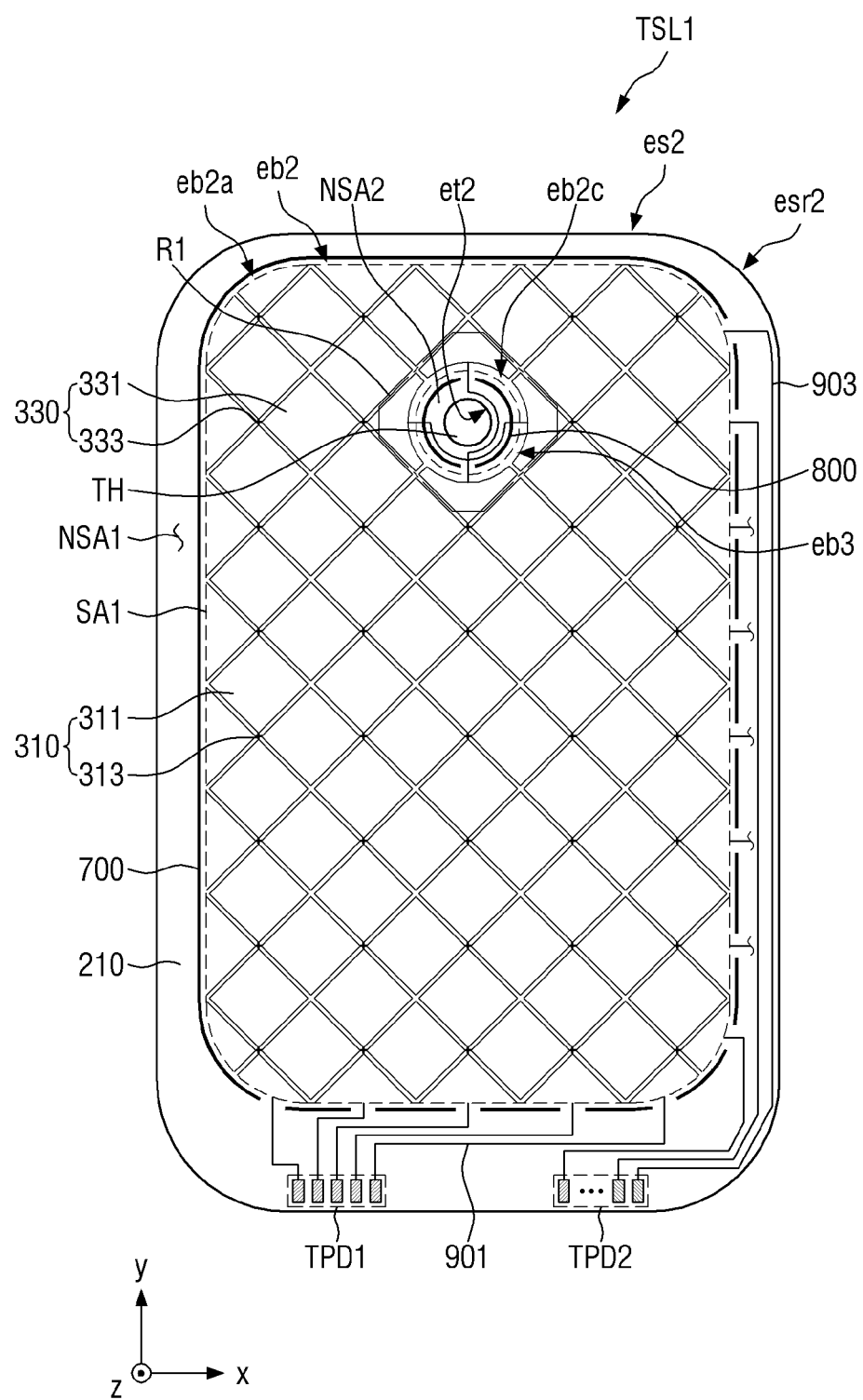
FIG. 42 is a schematic plan view of a touch sensor included in the display device according to the exemplary embodiment of FIG. 36.
Figure 43:
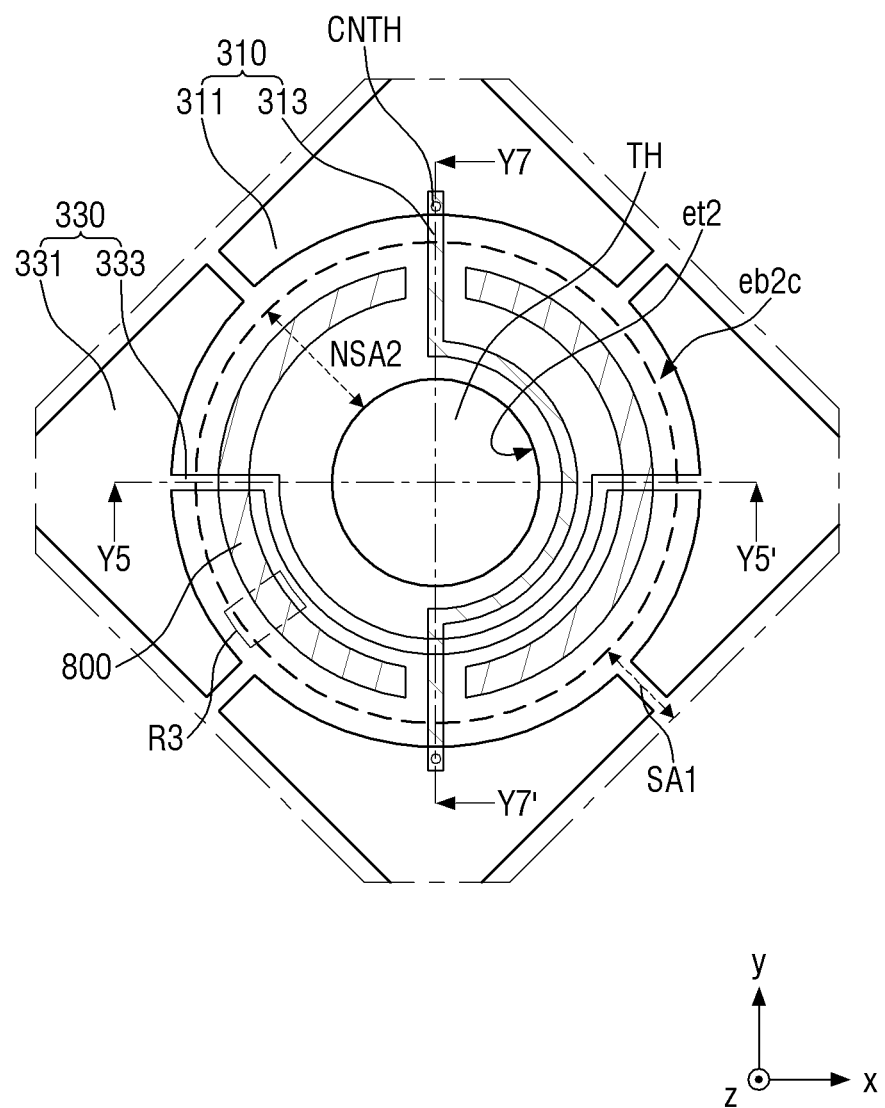
FIG. 43 is an enlarged plan view of a portion R1 of FIG. 42.
Figure 44:
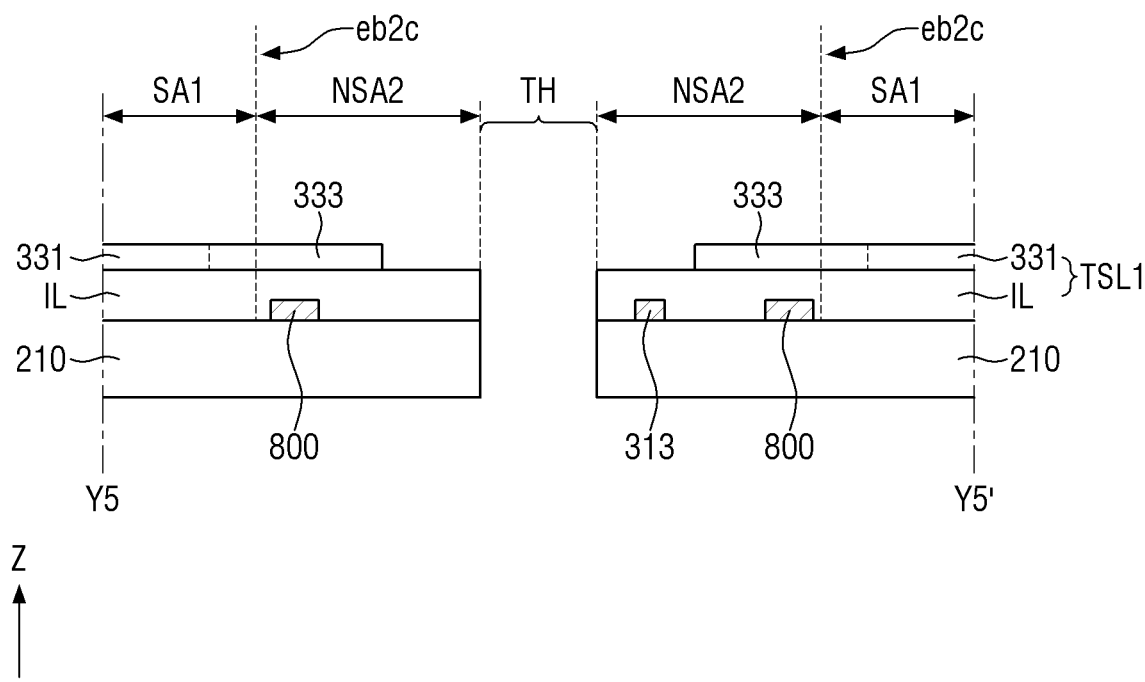
FIG. 44 is a cross-sectional view of the touch sensor taken along line Y5-Y5' of FIG. 43.
Figure 45:
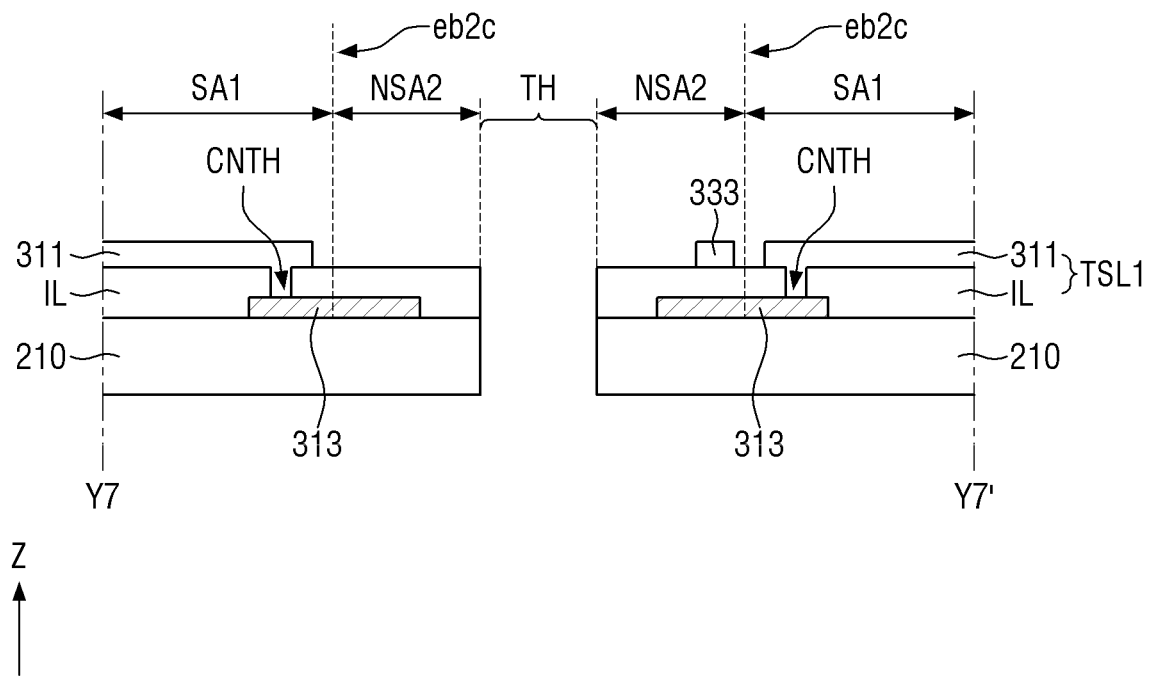
FIG. 45 is a cross-sectional view of the touch sensor taken along line Y7-Y7' of FIG. 43.

FIG. 42 is a schematic plan view of the touch sensor TSL1 included in the display device 2 according to the exemplary embodiment of FIG. 36. FIG. 43 is an enlarged plan view of a portion R1 of FIG. 42. FIG. 44 is a cross-sectional view of the touch sensor TSL1 taken along line Y5-Y5' of FIG. 43. FIG. 45 is a cross-sectional view of the touch sensor TSL1 taken along line Y7-Y7' of FIG. 43.

Referring to FIGS. 42 through 45, the touch sensor TSL1 is located on the second substrate 210. That is, the second substrate 210 may function as a base layer of the touch sensor TSL1.

Like the first substrate 110, an edge es2 of the second substrate 210 may include rounded portions esr2 at corners. In addition, the second substrate 210 may further include a hole edge et2 located around the through hole TH to define the through hole TH.

The edge es2 of the second substrate 210 and the edge es1 of the first substrate 110 may be substantially aligned along the third direction z, and the hole edge et2 of the second substrate 210 and the hole edge et1 of the first substrate 110 may be substantially aligned along the third direction z.

A sensing area SA1, a non-sensing area NSA1 and a hole non-sensing area NSA2 are defined in the touch sensor TSL1. The sensing area SA1 may be an area that senses a touch input in the touch sensor TSL1, and the non-sensing area NSA1 and the hole non-sensing area NSA2 may be areas that cannot sense a touch input.

The sensing area SA1 may correspond to the display area D-DA1 of the display device 2 shown in FIG. 36 or the display area DA1 of the display panel DP1 shown in FIG. 41. The non-sensing area NSA1 may correspond to the peripheral area D-NDA1 of the display device 2 shown in FIG. 36 or the peripheral area NDA1 of the display panel DP1 shown in FIG. 41. In addition, the hole non-sensing area NSA2 may correspond to the hole peripheral area D-NDA2 of the display device 2 shown in FIG. 36 or the hole peripheral area NDA2 of the display panel DP1 shown in FIG. 41.

A boundary eb2 between the sensing area SA1 and the non-sensing area NSA1 may include rounded portions eb2a at corners. In addition, a boundary eb2c between the sensing area SA1 and the hole non-sensing area NSA2 may include rounded portions, and its overall shape may be substantially the same (e.g., a circular shape) as the planar shape of the through hole TH.

In some exemplary embodiments, the boundary eb2 between the sensing area SA1 and the non-sensing area NSA1 and the boundary eb1 between the display area DA1 and the peripheral area NDA1 of the display panel DP1 may be substantially aligned along the third direction z. In addition, the boundary eb2c between the sensing area SA1 and the hole non-sensing area NSA2 may be substantially aligned with the boundary eb1c between the display area DA1 and the hole peripheral area NDA2 of the display panel DP1 along the third direction z.

The touch sensor TSL1 may include first electrode portions 310, second electrode portions 330, a light transmission control pattern portion 700, and a hole light transmission control pattern portion 800 located around the through hole TH. In addition, the touch sensor TSL1 may further include touch signal lines 901 and 903 and a touch pad unit TPD1 and TPD2.

The first electrode portions 310 and the second electrode portions 330 may be located in the sensing area SA1, and the touch pad unit TPD1 and TPD2, the touch signal lines 901 and 903 and the light transmission control pattern portion 700 may be located in the non-sensing area NSA1. In addition, the hole light transmission control pattern portion 800 may be located in the hole non-sensing area NSA2.

The first electrode portions 310 and the second electrode portions 330 in the sensing area SA1 are substantially the same or similar to those described above with reference to FIGS. 16 through 32. In addition, the touch signal lines 901 and 903, the touch pad unit TPD1 and TPD2 and the light transmission control pattern portion 700 in the non-sensing area NSA1 are substantially the same or similar to those described above with reference to FIGS. 16 through 32. Therefore, a redundant description is omitted.

A first connection portion 313 and a second connection portion 333 around the through hole TH may be located in the hole non-sensing area NSA2.

Two second touch electrodes 331 spaced apart from each other along the first direction x with the through hole TH interposed between them in the hole non-sensing area NSA2 may be connected to each other by the second connection portion 333 bypassing the through hole TH. In addition, two first touch electrodes 311 spaced apart from each other along the second direction y with the through hole TH interposed between them in the hole non-sensing area NSA2 may be connected to each other by the first connection portion 313 bypassing the through hole TH.

Since the first connection portion 313 and the first touch electrodes 311 are located on different layers, the first touch electrodes 311 may be connected to the first connection portion 313 through contact holes CNTH formed in an insulating layer IL.

The hole light transmission control pattern portion 800 may be located on the second substrate 210 and in the hole non-sensing area NSA2.

In some exemplary embodiments, the hole light transmission control pattern portion 800 may extend along the boundary eb2c between the sensing area SA1 and the hole non-sensing area NSA2 and surround at least a portion of the through hole TH in plan view.

The hole light transmission control pattern portion 800 may include an opaque conductive material. In some exemplary embodiments, the hole light transmission control pattern portion 800 may be made of the first conductive layer ML1 described above with reference to FIG. 4. For example, the hole light transmission control pattern portion 800 may be located on the same layer as the first connection portions 313 and the light transmission control pattern portion 700 and may be made of the same material as the first connection portion 313 and the light transmission control pattern portion 700.

Since the hole light transmission control pattern portion 800 is located on the same layer as the first connection portion 313, the hole light transmission control pattern portion 800 and the first connection portion 313 may be spaced apart from each other.

When seen in plan view, the hole light transmission control pattern portion 800 may be located relatively further from the through hole TH than the first connection portion 313 and the second connection portion 333. In other words, the first connection portion 313 and the second connection portion 333 may be located relatively closer to the through hole TH than the hole light transmission control pattern portion 800.

Figure 46:
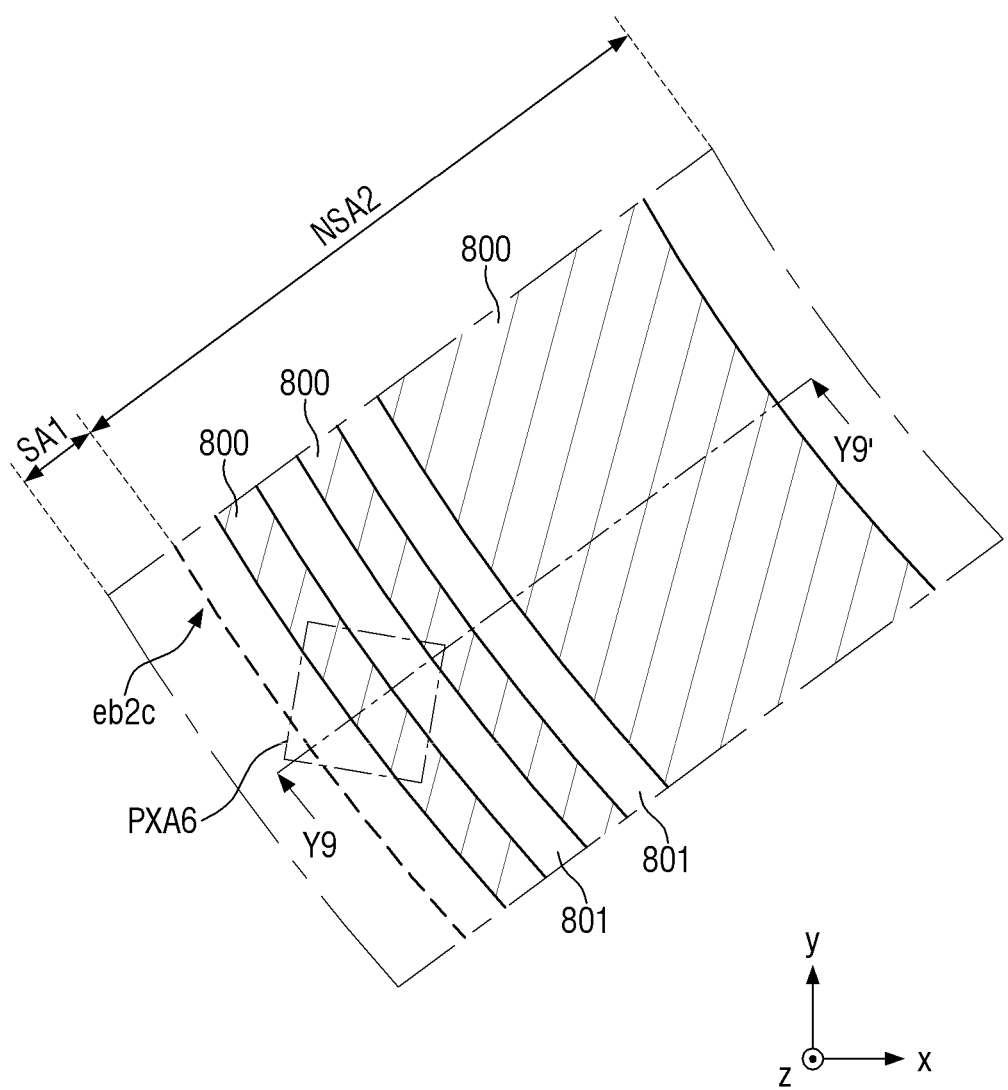
FIG. 46 is an enlarged plan view of a portion R3 of FIG. 43, also showing a light emitting area of the display panel.
Figure 47:
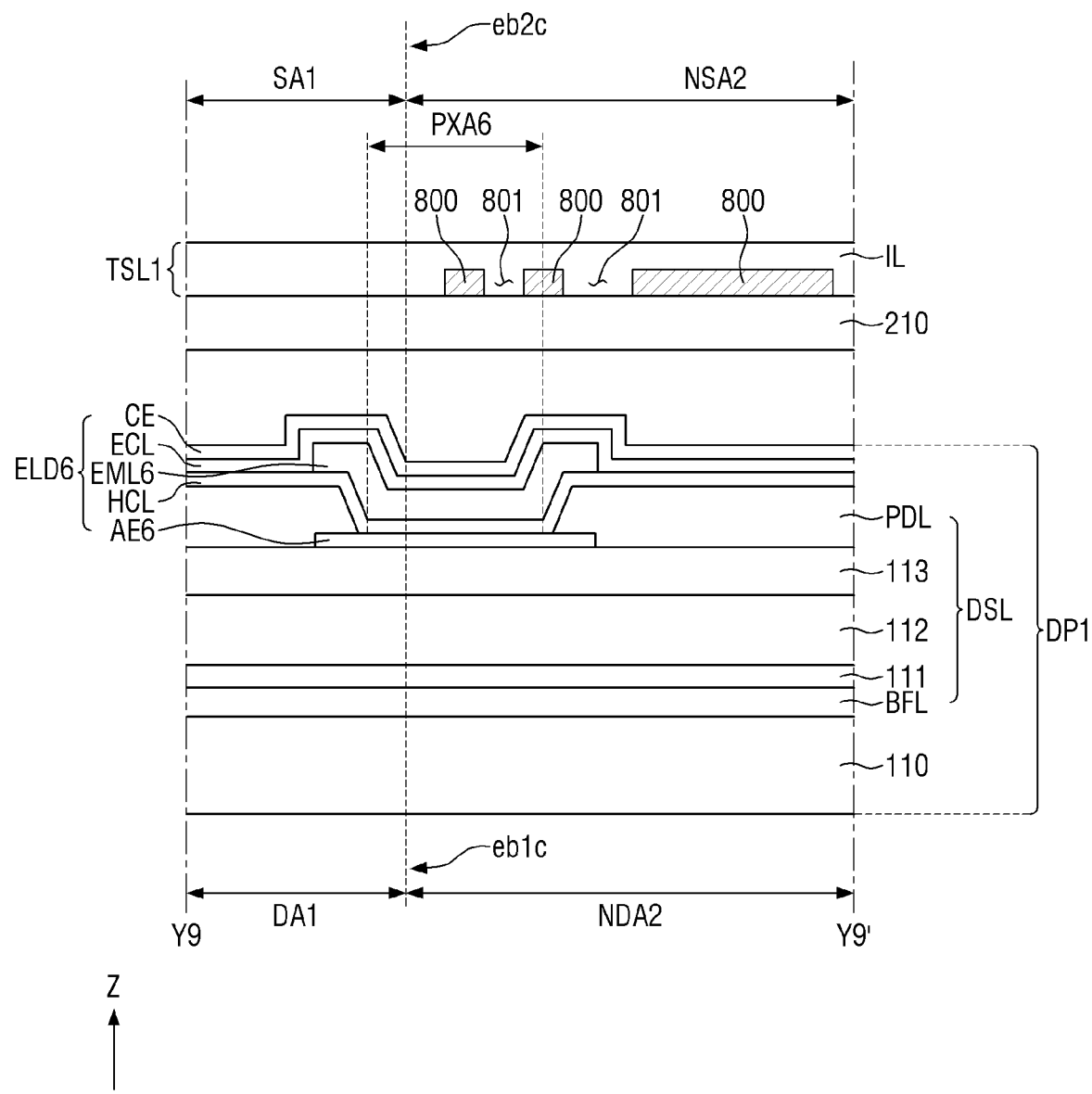
FIG. 47 is a cross-sectional view of the display device according to the exemplary embodiment of FIG. 36, taken along line Y9-Y9' of FIG. 46.

FIG. 46 is an enlarged plan view of a portion R3 of FIG. 43, also showing a light emitting area of the display panel DP1. FIG. 47 is a cross-sectional view of the display device 2 according to the exemplary embodiment of FIG. 36, taken along line Y9-Y9' of FIG. 46.

Referring to FIGS. 46 and 47, openings 801 may be formed in the hole light transmission control pattern portion 800, like the light transmission control pattern portion 700 described above. The openings 801 may be formed as slits extending along the boundary eb2c between the sensing area SA1 and the hole non-sensing area NSA2.

If a light emitting element at least partially located in the hole non-sensing area NSA2 among light emitting elements of the display panel DP1 is referred to as a sixth light emitting element ELD6, the hole light transmission control pattern portion 800 may overlap the sixth light emitting element ELD6. That is, the hole light transmission control pattern portion 800 may overlap a sixth light emitting area PXA6 from which light emitted from the sixth light emitting element ELD6 is output.

The sixth light emitting element ELD6 includes a sixth anode AE6, a sixth light emitting layer EML6, a hole control layer HCL, an electron control layer ECL, and a cathode CE.

The sixth light emitting area PXA6 may be defined by a sixth opening OPN6 formed in a pixel defining layer PDL.

The openings 801 may be formed in the hole light transmission control pattern portion 800 as described above and may overlap the sixth light emitting element ELD6 or the sixth light emitting area PXA6. That is, a portion of light emitting from the sixth light emitting element ELD6 may be blocked by the hole light transmission control pattern portion 800, and the other portion of the light emitted from the sixth light emitting element ELD6 may be emitted output of the display device 2 through the openings 801. Accordingly, it is possible to prevent a portion around the through hole TH in an image displayed on the display device 2 from being clearly viewed in a stepped shape.

FIGS. 48 through 54 are plan views of modified examples of FIG. 46, more specifically, modified examples of the hole light transmission control pattern portion 800.

Figure 48:
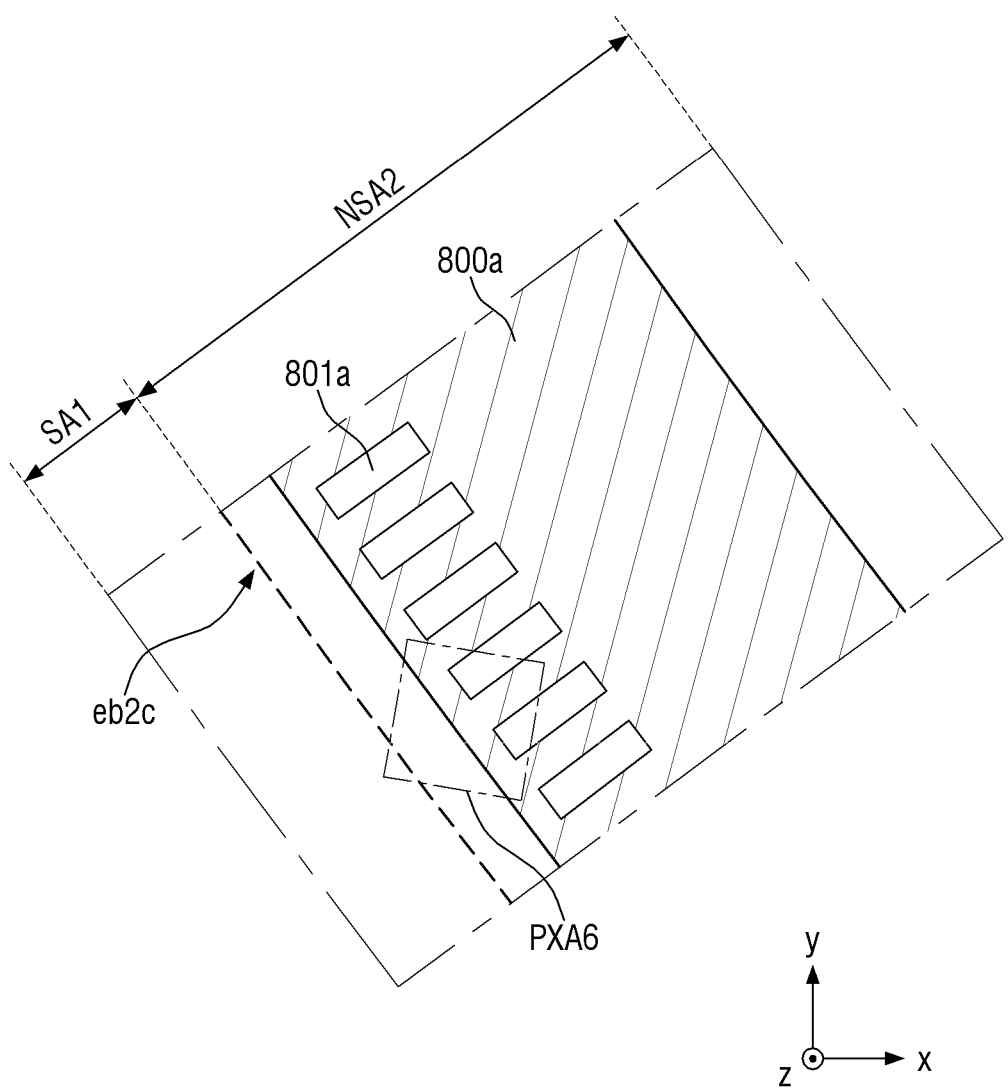
FIGS. 48, 49, 50, 51, 52, 53, and 54 are plan views of modified examples of FIG. 46.

Referring to FIG. 48, the current exemplary embodiment is substantially the same as the exemplary embodiment of FIG. 46 except that openings 801a formed in a hole light transmission control pattern portion 800a do not extend along a boundary eb2c between a sensing area SA1 and a hole non-sensing area NSA2 and extend in a direction intersecting a direction in which the boundary eb2c extends.

Figure 49:
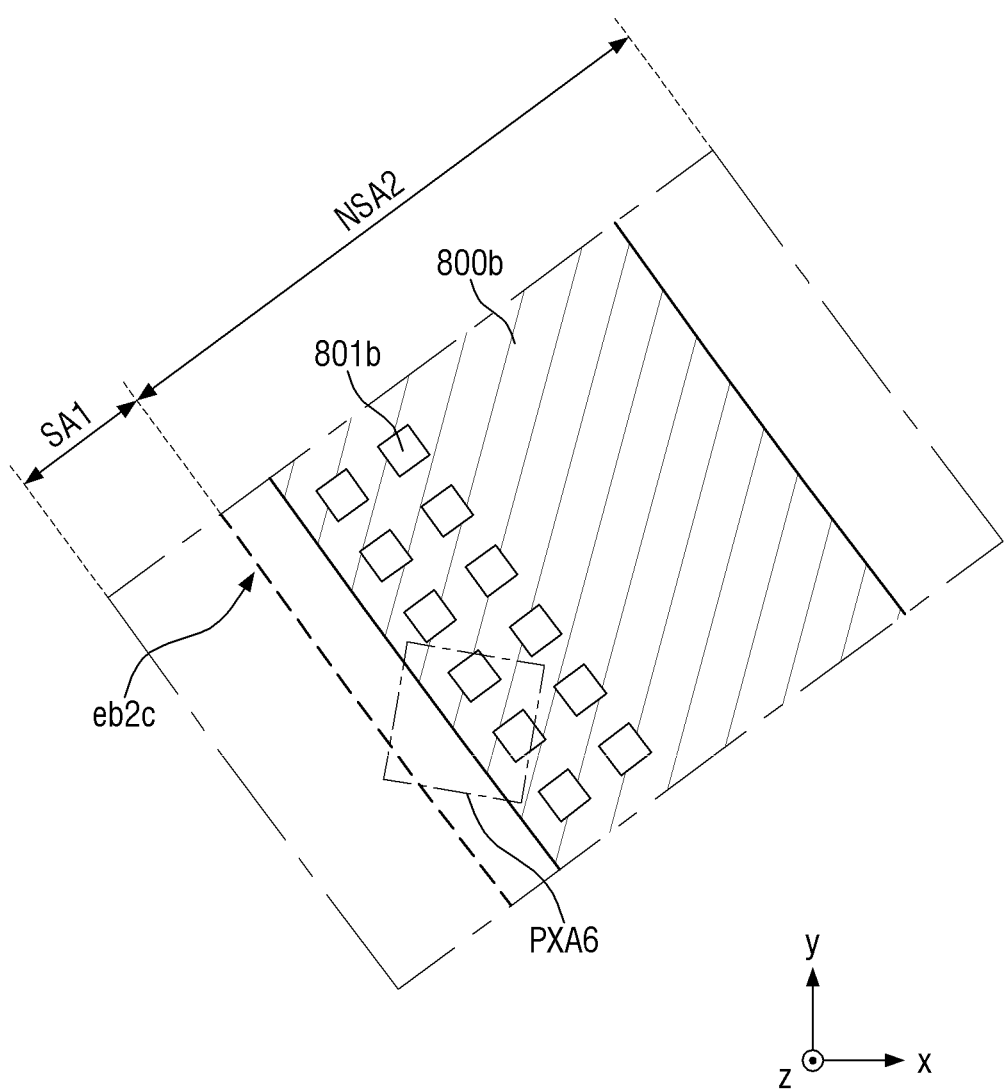

Referring to FIG. 49, the current exemplary embodiment is substantially the same as the exemplary embodiment of FIG. 46 except that openings 801b formed in a hole light transmission control pattern portion 800b are island-shaped polygonal patterns and are spaced apart from each other along a direction in which a boundary eb2c extends and in a direction intersecting the direction in which the boundary eb2c extends. Although the openings 801b are quadrilateral in FIG. 49, this is merely an example. The planar shape of each of the openings 801b can also be changed to other polygonal shapes such as a triangle, a pentagon, a hexagon, and an octagon.

Figure 50:
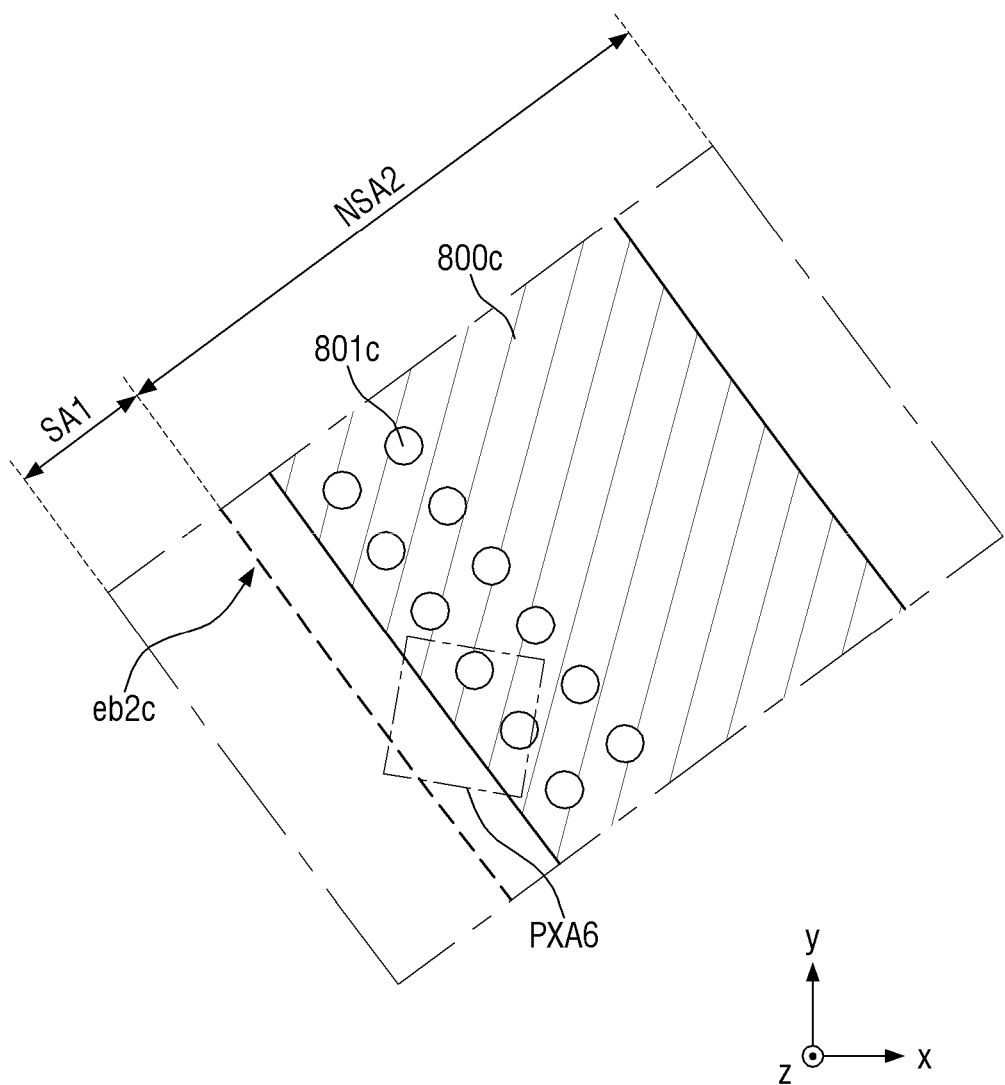

Referring to FIG. 50, the current exemplary embodiment is substantially the same as the exemplary embodiment of FIG. 49 except that openings 801c formed in a hole light transmission control pattern portion 800c have a circular planar shape. The planar shape of each of the openings 801c can also be changed to an elliptical shape, a semicircular shape, a semielliptical shape, etc. in addition to the structure shown in FIG. 49.

Figure 51:
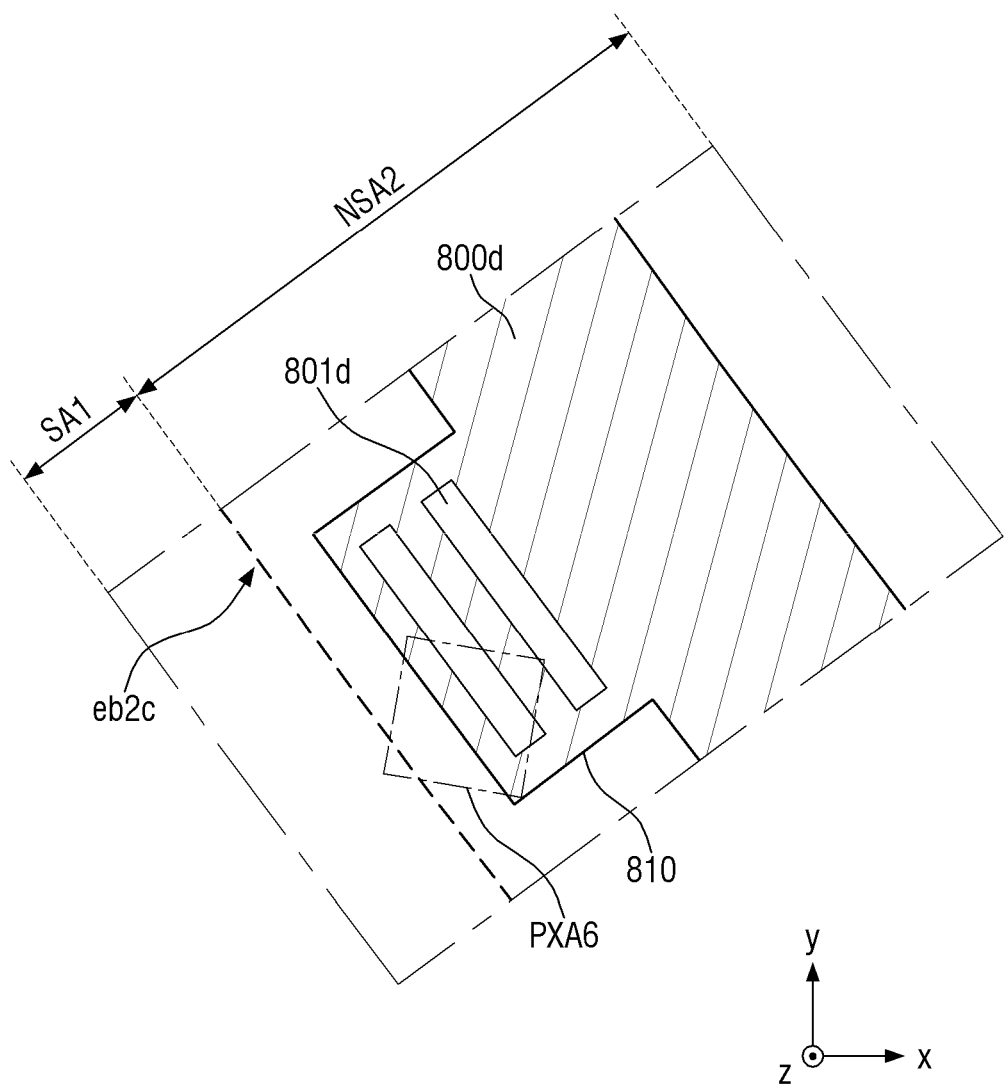
Figure 52:
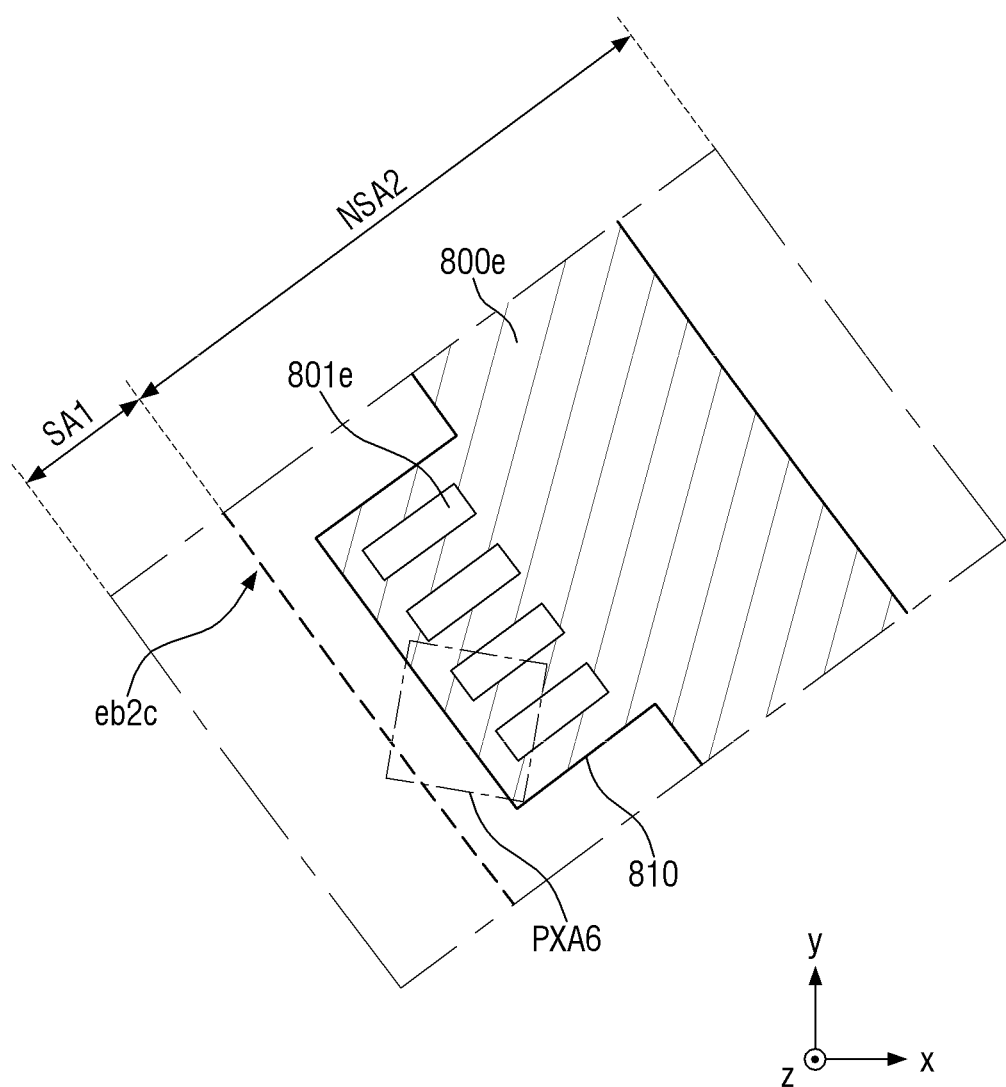

Referring to FIG. 51, the current exemplary embodiment is different from the exemplary embodiment of FIG. 46 in that a hole light transmission control pattern portion 800d includes protrusions 810 protruding from parts of the hole light transmission control pattern portion 800d and overlapping light emitting areas and that openings 801d are formed in each of the protrusions 810 and is similar to the exemplary embodiment of FIG. 46 in that the openings 801d extend along a rounded boundary eb2c. Referring to FIG. 52, the current exemplary embodiment is substantially the same or similar to the exemplary embodiment of FIG. 51 except that openings 801e formed in each protrusion 810 of a hole light transmission control pattern portion 800e extend in a direction intersecting a direction in which a boundary eb2c extends.

Figure 53:
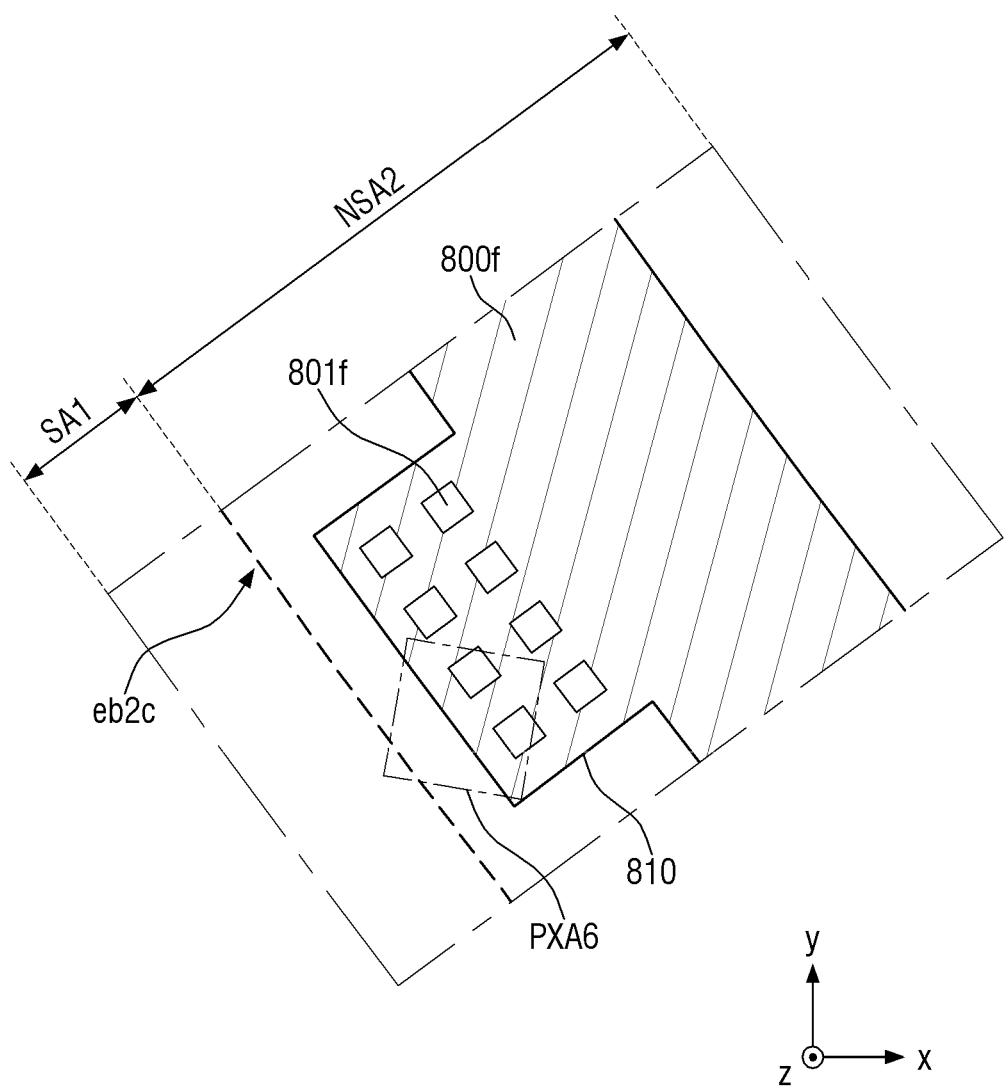

Referring to FIG. 53, the current exemplary embodiment is substantially the same or similar to the exemplary embodiment of FIG. 52 except that openings 801f formed in each protrusion 810 of a hole light transmission control pattern portion 800f are island-shaped polygonal patterns and are spaced apart from each other along a direction in which a boundary eb2c extends and a direction intersecting the direction in which the boundary eb2c extends. Other details of the openings 801f are substantially the same as the openings 801b (see FIG. 49) of the exemplary embodiment of FIG. 49, and thus a description thereof is omitted.

Figure 54:
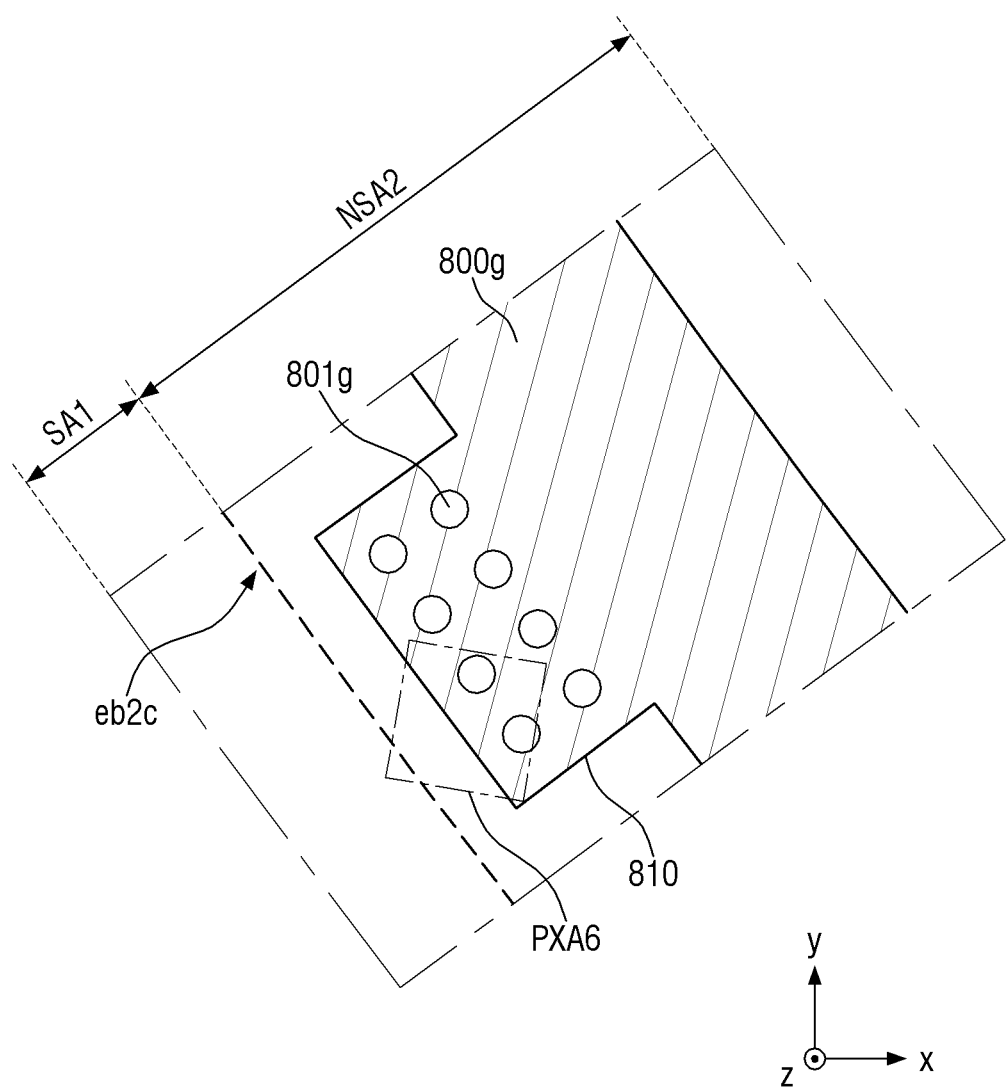

Referring to FIG. 54, the current exemplary embodiment is substantially the same or similar to the exemplary embodiment of FIG. 53 except that openings 801g formed in each protrusion 810 of a hole light transmission control pattern portion 800g are island-shaped circular patterns. Other details of the openings 801g are substantially the same as those of the openings 801c (see FIG. 50) of the exemplary embodiment of FIG. 50, and thus a description thereof is omitted.

The display devices according to the above-described exemplary embodiments can display an image even around a portion where an electronic element is disposed. Therefore, an area where an image can be displayed can be increased. In addition, the display devices according to the above-described exemplary embodiments can prevent edges of an image from being viewed in a stepped shape in rounded portions of edges of a display area. That is, it is possible to improve display quality while increasing the display area.

According to exemplary embodiments, it is possible to provide a display device having an increased proportion of a display area and improved display quality.

In addition, according to exemplary embodiments, it is possible to provide a touch sensor capable of increasing the proportion of a display area and improving the display quality of a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first substrate in which a display area and a peripheral area around the display area are defined;
an element layer which is located on the first substrate and comprises a first light emitting element located in the display area and a second light emitting element at least partially located in the peripheral area; and
a touch sensor which is located on the element layer, wherein the touch sensor comprises:
a touch electrode portion which is located in the display area and overlaps the first light emitting element;
a touch signal line which is located in the peripheral area and is connected to the touch electrode portion; and
a light transmission control pattern portion which is located in the peripheral area, overlaps the second light emitting element, and extends along a boundary between the display area and the peripheral area,
wherein the light transmission control pattern portion comprises an opaque conductive material, and
wherein a portion of the light transmission control pattern portion is disposed between the touch signal line and the touch electrode portion in a plan view.

2. The display device of claim 1, wherein the boundary between the display area and the peripheral area comprises a rounded portion, and the second light emitting element overlaps the rounded portion of the boundary between the display area and the peripheral area.

3. The display device of claim 1, wherein the light transmission control pattern portion and the touch signal line are located on the same layer and made of the same material.

4. The display device of claim 1, wherein at least one opening is formed in the light transmission control pattern portion, and wherein the opening overlaps the second light emitting element.

5. The display device of claim 1, wherein the opening is formed in a stripe shape extending in a direction.

6. The display device of claim 1, wherein the opening is formed in plural numbers in an island shape, and the openings are spaced apart from each other.

7. The display device of claim 1, wherein the touch electrode portion comprises first touch electrodes which are arranged along a first direction and electrically connected to each other along the first direction and second touch electrodes which are arranged along a second direction intersecting the first direction and electrically connected to each other along the second direction,
wherein the first touch electrodes and the second touch electrodes are located on the same layer, and the light transmission control pattern portion is located on a different layer from the first touch electrodes and the second touch electrodes.

8. The display device of claim 7, further comprising an insulating layer which is located on the light transmission control pattern portion,
wherein the first touch electrodes and the second touch electrodes are located on the insulating layer.

9. The display device of claim 7, further comprising a first connection portion which connects two first touch electrodes neighboring each other along the first direction and a second connection portion which connects two second touch electrodes neighboring each other along the second direction,
wherein any one of the first connection portion and the second connection portion is located on the same layer as the first touch electrodes and the second touch electrodes, and the other one of the first connection portion and the second connection portion is located on the same layer as the light transmission control pattern portion.

10. The display device of claim 1, further comprising:
a second substrate which is located on the element layer; and
a sealant which is located between the first substrate and the second substrate, is located in the peripheral area, and bonds the first substrate and the second substrate together,
wherein the touch sensor is located on the second substrate.

11. The display device of claim 1, further comprising a thin-film encapsulation layer which is located on the element layer, wherein the touch sensor is located on the thin-film encapsulation layer.

12. The display device of claim 1, wherein the first substrate further comprises a notched edge which defines a notch portion, and the element layer further comprises a third light emitting element which is located in the peripheral area and between the notch portion and the display area,
wherein the third light emitting element overlaps the light transmission control pattern portion.

13. The display device of claim 12, wherein the notched edge of the first substrate comprises a rounded portion.

14. The display device of claim 13, wherein the notched edge of the first substrate comprises a portion having a shape selected from the group consisting of an omega (Ω) shape, a U shape, a V shape, a semicircular shape, and a semielliptical shape.

15. A display device comprising:
a first substrate which comprises a through hole and in which a hole peripheral area around the through hole, a display area surrounding the hole peripheral area and a peripheral area around the display area are defined;
an element layer which is located on an upper surface of the first substrate and comprises a light emitting element located in the hole peripheral area; and
a touch sensor which is located on the element layer,
wherein the touch sensor comprises a touch electrode portion and a hole light transmission control pattern portion which is spaced apart from the touch electrode portion, is located in the hole peripheral area and overlaps the light emitting element, and
wherein the through hole penetrates the upper surface of the first substrate and a lower surface of the first substrate,
wherein the hole light transmission control pattern portion is disposed between the touch electrode portion and the through hole in a plan view.

16. The display device of claim 15, wherein the touch electrode portion comprises two first touch electrodes which are spaced apart from each other along a first direction with the through hole interposed between the two first touch electrodes, two second touch electrodes which are spaced apart from each other along a second direction intersecting the first direction with the through hole interposed between the two second touch electrodes, a first connection portion which connects the two first touch electrodes, and a second connection portion which connects the two second touch electrodes, wherein the first touch electrodes and the second touch electrodes are located on the same layer, and the hole light transmission control pattern portion is located on a different layer from the first touch electrodes and the second touch electrodes.

17. The display device of claim 16, wherein the first connection portion and the second connection portion are located in the hole peripheral area.

18. The display device of claim 16, wherein the first connection portion and the hole light transmission control pattern portion are located on the same layer, and the second connection portion is located on the same layer as the first touch electrodes and the second touch electrodes.

19. The display device of claim 15, wherein the hole light transmission control pattern portion comprises an opaque conductive material, and at least one opening is formed in the hole light transmission control pattern portion, wherein the opening overlaps the light emitting element.

20. The display device of claim 15, further comprising:
a second substrate which is located on the element layer;
a sealant which is located between the first substrate and the second substrate, is located in the peripheral area, and bonds the first substrate and the second substrate together; and
a hole sealant which is located between the first substrate and the second substrate, is located in the hole peripheral area, and bonds the first substrate and the second substrate together,
wherein the touch sensor is located on the second substrate.

21. A touch sensor in which a sensing area and a non-sensing area are defined, the touch sensor comprising:
a touch electrode portion which is located in the sensing area;
a touch signal line which is located in the non-sensing area and connected to the touch electrode portion; and
a light transmission control pattern portion which is located in the non-sensing area, extends along a rounded boundary between the sensing area and the non-sensing area, and is spaced apart from the touch signal line,
wherein an opening is formed in the light transmission control pattern portion,
wherein the light transmission control pattern portion comprises an opaque conductive material, and
wherein a portion of the light transmission control pattern portion is disposed between the touch signal line and the touch electrode portion in a plan view.

22. The touch sensor of claim 21, wherein the touch electrode portion comprises a plurality of touch electrodes, the light transmission control pattern portion is located on the same layer as the touch signal line, and the light transmission control pattern portion is located on a different layer from the touch electrodes.

23. The touch sensor of claim 21, wherein a hole non-sensing area surrounding a through hole penetrating the touch sensor is further defined in the touch sensor, the sensing area completely surrounds the hole non-sensing area, and further comprising a hole light transmission control pattern portion which is located in the hole non-sensing area and extends along a rounded boundary between the sensing area and the hole non-sensing area.

24. The touch sensor of claim 23, wherein the touch electrode portion comprises two first touch electrodes which are spaced apart from each other along a first direction with the through hole interposed between the two first touch electrodes, two second touch electrodes which are spaced apart from each other along a second direction intersecting the first direction with the through hole interposed between the two second touch electrodes, a first connection portion which connects the two first touch electrodes, and a second connection portion which connects the two second touch electrodes, wherein the first connection portion and the second connection portion are located in the hole non-sensing area and located relatively closer to the through hole than the hole light transmission control pattern portion.

25. The touch sensor of claim 24, wherein the light transmission control pattern portion and the hole light transmission control pattern portion are located on a different layer from the first touch electrodes and the second touch electrodes, any one of the first connection portion and the second connection portion is located on the same layer as the first touch electrodes and the second touch electrodes, and the other one of the first connection portion and the second connection portion is located on the same layer as the light transmission control pattern portion and the hole light transmission control pattern portion.

* * * * *